United States Patent
Wang et al.

(10) Patent No.: US 12,310,028 B2
(45) Date of Patent: May 20, 2025

(54) THREE-DIMENSIONAL MEMORY DEVICE AND MANUFACTURING METHOD THEREOF

(71) Applicant: Taiwan Semiconductor Manufacturing Company, Ltd., Hsinchu (TW)

(72) Inventors: Sheng-Chen Wang, Hsinchu (TW); Meng-Han Lin, Hsinchu (TW); Sai-Hooi Yeong, Hsinchu County (TW); Yu-Ming Lin, Hsinchu (TW); Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1152 days.

(21) Appl. No.: 17/159,036

(22) Filed: Jan. 26, 2021

(65) Prior Publication Data
US 2021/0408048 A1    Dec. 30, 2021

Related U.S. Application Data

(60) Provisional application No. 63/045,200, filed on Jun. 29, 2020.

(51) Int. Cl.
*H10B 51/20*    (2023.01)
*H10B 43/27*    (2023.01)
*H10B 51/30*    (2023.01)

(52) U.S. Cl.
CPC ............. *H10B 51/20* (2023.02); *H10B 43/27* (2023.02); *H10B 51/30* (2023.02)

(58) Field of Classification Search
None
See application file for complete search history.

(56) References Cited

U.S. PATENT DOCUMENTS

| | | | |
|---|---|---|---|
| 2016/0260732 A1* | 9/2016 | Lue | H10B 43/10 |
| 2019/0287993 A1* | 9/2019 | Kondo | H10B 43/27 |

(Continued)

*Primary Examiner* — Nilufa Rahim
(74) *Attorney, Agent, or Firm* — JCIPRNET

(57) ABSTRACT

A memory device includes a substrate, a first stacking structure, a second stacking structure, struts, an isolation structure, memory films, channel layers, and conductive pillars. The first stacking structure includes first gate layers and is located on the substrate. The second stacking structure includes second gate layers and is located on the substrate, where the second stacking structure is separated from the first stacking structure through a trench. The struts stand on the substrate and are located in the trench, where the struts each have two opposite surfaces respectively in contact with the first stacking structure and the second stacking structure. The isolation structure stands on the substrate and is located in the trench, where cell regions are located in the trenches, and at least two of the cell regions are separated from one another through a respective one strut and the isolation structure connected therewith. The memory films are respectively located in the cell regions, and the memory films each cover a sidewall of a respective one of the cell regions. The channel layers respectively cover an inner surface of a respective one of the memory films, where the memory films are sandwiched between the first gate layers and the channel layers. The conductive pillars stand on the substrate within the cell regions and are covered by the channel layers, where at least two of the conductive pillars are located in each of the cell regions, and the at least two conductive pillars are laterally separated from one another.

20 Claims, 60 Drawing Sheets

(56) References Cited

U.S. PATENT DOCUMENTS

| | | | |
|---|---|---|---|
| 2020/0098787 A1* | 3/2020 | Kaneko | H10B 41/27 |
| 2020/0185411 A1* | 6/2020 | Herner | H01L 21/32139 |
| 2020/0381450 A1* | 12/2020 | Lue | H10B 43/27 |
| 2021/0050362 A1* | 2/2021 | Bicksler | H10B 41/10 |
| 2021/0111185 A1* | 4/2021 | Wang | H10B 43/10 |

* cited by examiner

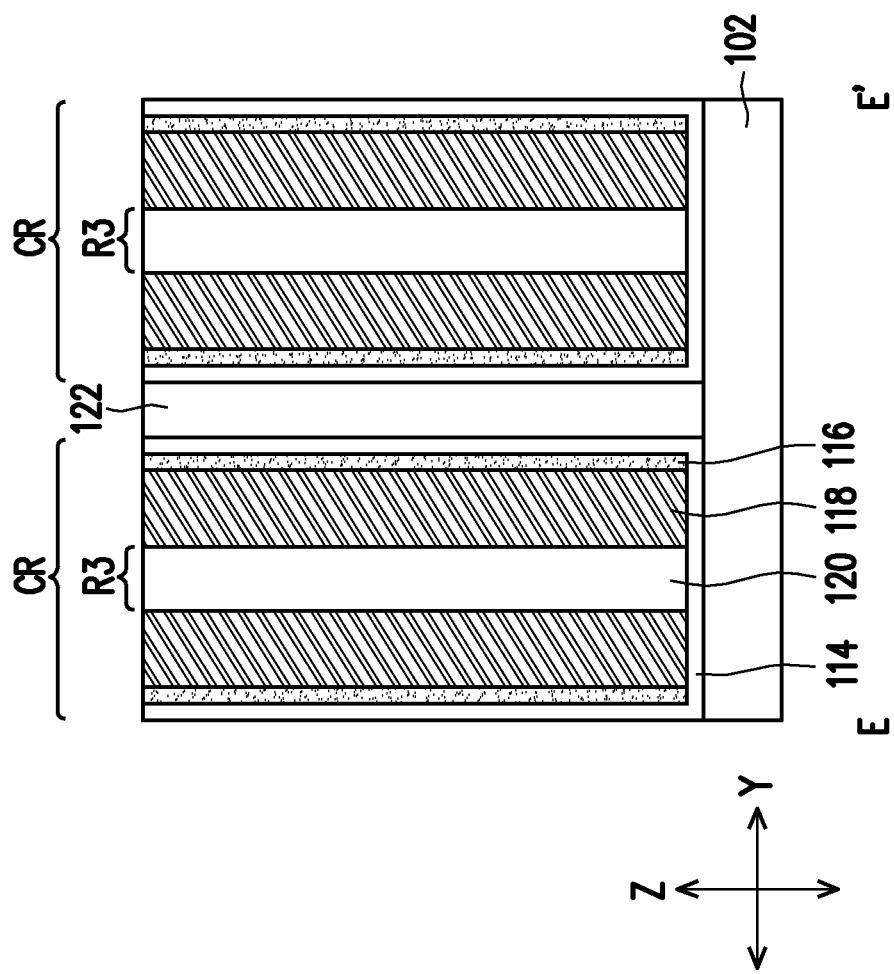

THREE-DIMENSIONAL MEMORY DEVICE AND MANUFACTURING METHOD THEREOF

CROSS-REFERENCE TO RELATED APPLICATION

This application claims the priority benefit of U.S. provisional application Ser. No. 63/045,200, filed on Jun. 29, 2020. The entirety of the above-mentioned patent application is hereby incorporated by reference herein and made a part of this specification.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random-access memory (SRAM) and dynamic random-access memory (DRAM). Both SRAM and DRAM are volatile because they will lose the information they store when they are not powered.

On the other hand, non-volatile memories can keep data stored on them. One type of non-volatile semiconductor memory is ferroelectric random-access memory (FeRAM, or FRAM). Advantages of FeRAM include its fast write/read speed and small size.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A through FIG. 11A are schematic three-dimensional views illustrating structures at various stages during the manufacturing method of the three-dimensional memory device as shown in FIG. 2.

FIG. 3B through FIG. 11B are schematic cross-sectional views along lines A-A' shown in FIG. 3A through FIG. 11A, respectively.

FIG. 3C through FIG. 11C are schematic enlarged plan views illustrating a portion of the three-dimensional memory device at process steps described with reference to FIG. 3A through FIG. 11A, respectively.

FIG. 12A through FIG. 12D are schematic enlarged cross-sectional views illustrating a portion of the three-dimensional memory device of FIG. 11A.

FIG. 15A through FIG. 16A are schematic three-dimensional views illustrating structures at various stages during the manufacturing method of the three-dimensional memory device as shown in FIG. 14.

FIG. 15B through FIG. 16B are schematic cross-sectional views along lines A-A' shown in FIG. 15A through FIG. 16A, respectively.

FIG. 15C through FIG. 16C are schematic enlarged plan views illustrating a portion of the three-dimensional memory device at process steps described with reference to FIG. 15A through FIG. 16A, respectively.

DETAILED DESCRIPTION

Figure 1:
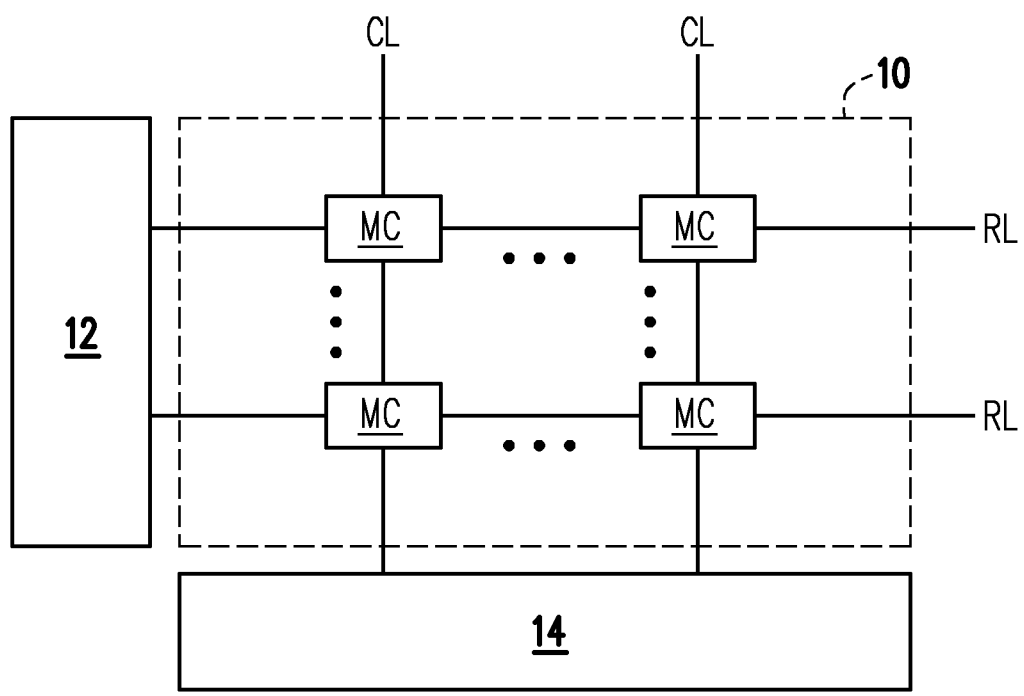
FIG. 1 is a block diagram of a three-dimensional memory in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second" and the like, may be used herein for ease of description to describe similar or different element(s) or feature(s) as illustrated in the figures, and may be used interchangeably depending on the order of the presence or the contexts of the description.

Three-dimensional memory is a new evolution that improves storage capacity of the non-volatile memory. By stacking memory cells vertically, it is possible to dramatically increase the storage capacity without significantly increasing footprint area of the non-volatile memory.

FIG. 1 is a block diagram of a three-dimensional memory in accordance with some embodiments of the disclosure. Referring to FIG. 1, in some embodiments, the three-dimensional memory includes a three-dimensional memory device 10, a row decoder 12, and a column decoder 14. The three-dimensional memory device 10, the row decoder 12 and the column decoder 14 may each be part of a same semiconductor die, or may be parts of different semiconductor dies. For example, the three-dimensional memory device 10 can be part of a first semiconductor die, while the row decoder 12 and the column decoder 14 can be parts of a second semiconductor die.

In some embodiments, the three-dimensional memory device 10 includes memory cells MC, row lines RL (such as word lines), and column lines CL (such as bit lines and/or source line). The memory cells MC are arranged in rows and columns (e.g., in a form of array, which may be referred to as a memory array). The row lines RL and the column lines CL are electrically connected to the memory cells MC. The row lines RL are conductive lines that extend along the rows of the memory cells MC. The column lines CL are conductive lines that extend along the columns of the memory cells MC.

The row decoder 12 may be, e.g., a static complementary metal-oxide-semiconductor (CMOS) decoder, a pseudo N-type metal-oxide-semiconductor (pseudo-NMOS) decoder, or the like. During operation, the row decoder 12 selects desired memory cells MC in a row of the three-dimensional memory device 10 by activating a corresponding row lines RL for the row. The column decoder 14 may be, e.g., a static CMOS decoder, a pseudo-NMOS decoder, or the like, and may include writer drivers, sense amplifiers, combinations thereof, or the like. During operation, the column decoder 14 selects corresponding column lines CL for the desired memory cells MC from columns of the three-dimensional memory device 10 in the selected row, and reads data from or writes data to the selected memory cells MC with the corresponding column lines CL.

Figure 2:
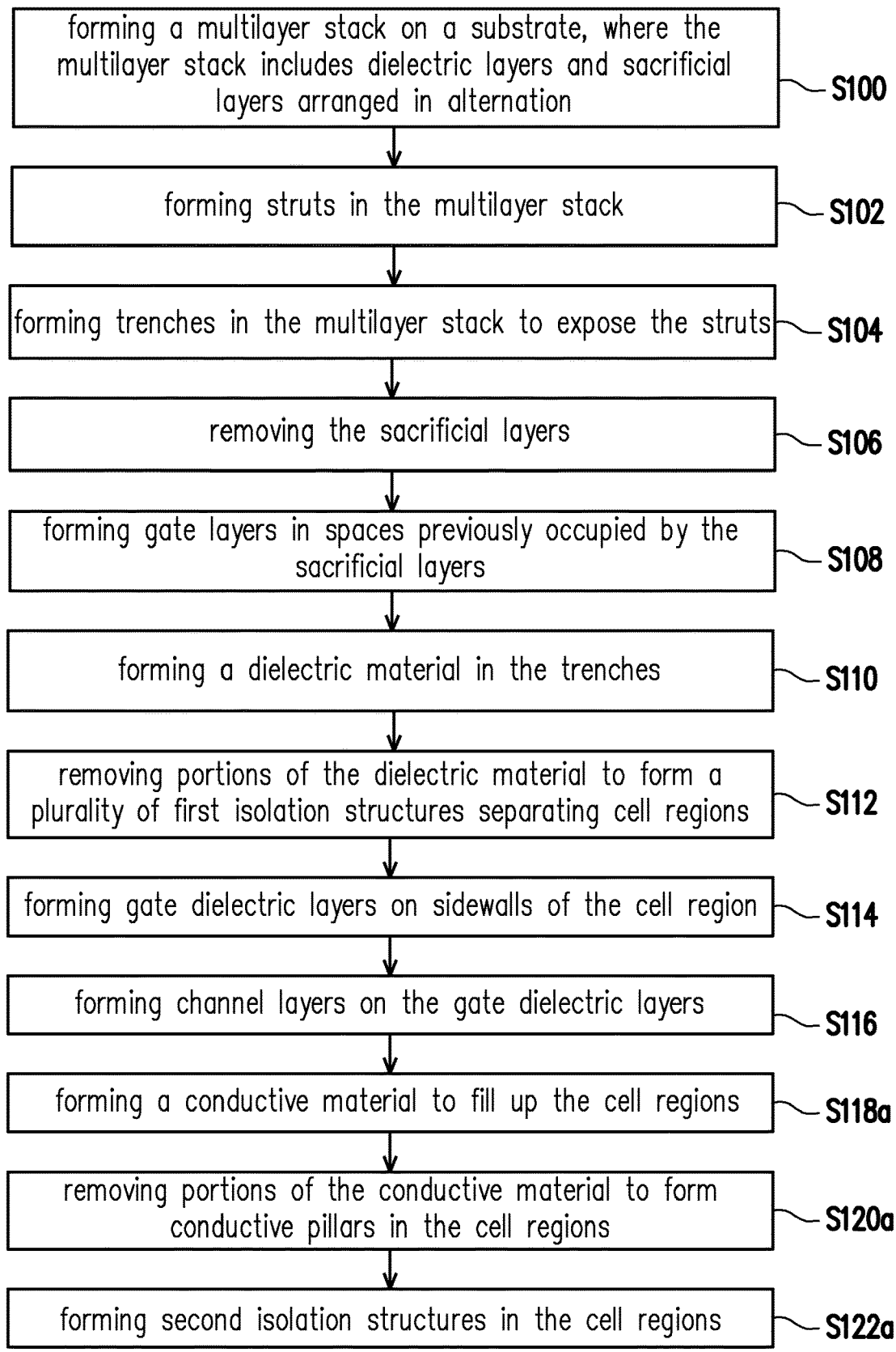
FIG. 2 is a flow diagram illustrating a method for manufacturing a three-dimensional memory device in accordance with some embodiments of the disclosure.

FIG. 2 is flow diagram illustrating a method for manufacturing a three-dimensional memory device 10 in accordance with some embodiments of the disclosure. It should be understood that additional processing may occur before, during, and after the illustrated actions of the method of FIG. 2 to complete formation of the three-dimensional memory device 10. FIG. 3A through FIG. 11A are schematic three-dimensional views illustrating structures at various stages during the manufacturing method of the three-dimensional memory device 10 as shown in FIG. 2. FIG. 3B through FIG. 11B are schematic cross-sectional views along lines A-A' shown in FIG. 3A through FIG. 11A, respectively. FIG. 3C through FIG. 11C are schematic enlarged plan views illustrating a portion of the three-dimensional memory device 10 indicated by dotted boxes B at process steps described with reference to FIG. 3A through FIG. 11A, respectively. FIG. 12A through FIG. 12D are schematic enlarged cross-sectional views illustrating a portion of the three-dimensional memory device 10 of FIG. 11A, which are respectively taken along lines C-C', D-D', E-E' and F-F' shown in FIG. 11A. A portion of the three-dimensional memory device 10 is illustrated, for example.

Figure 3A:
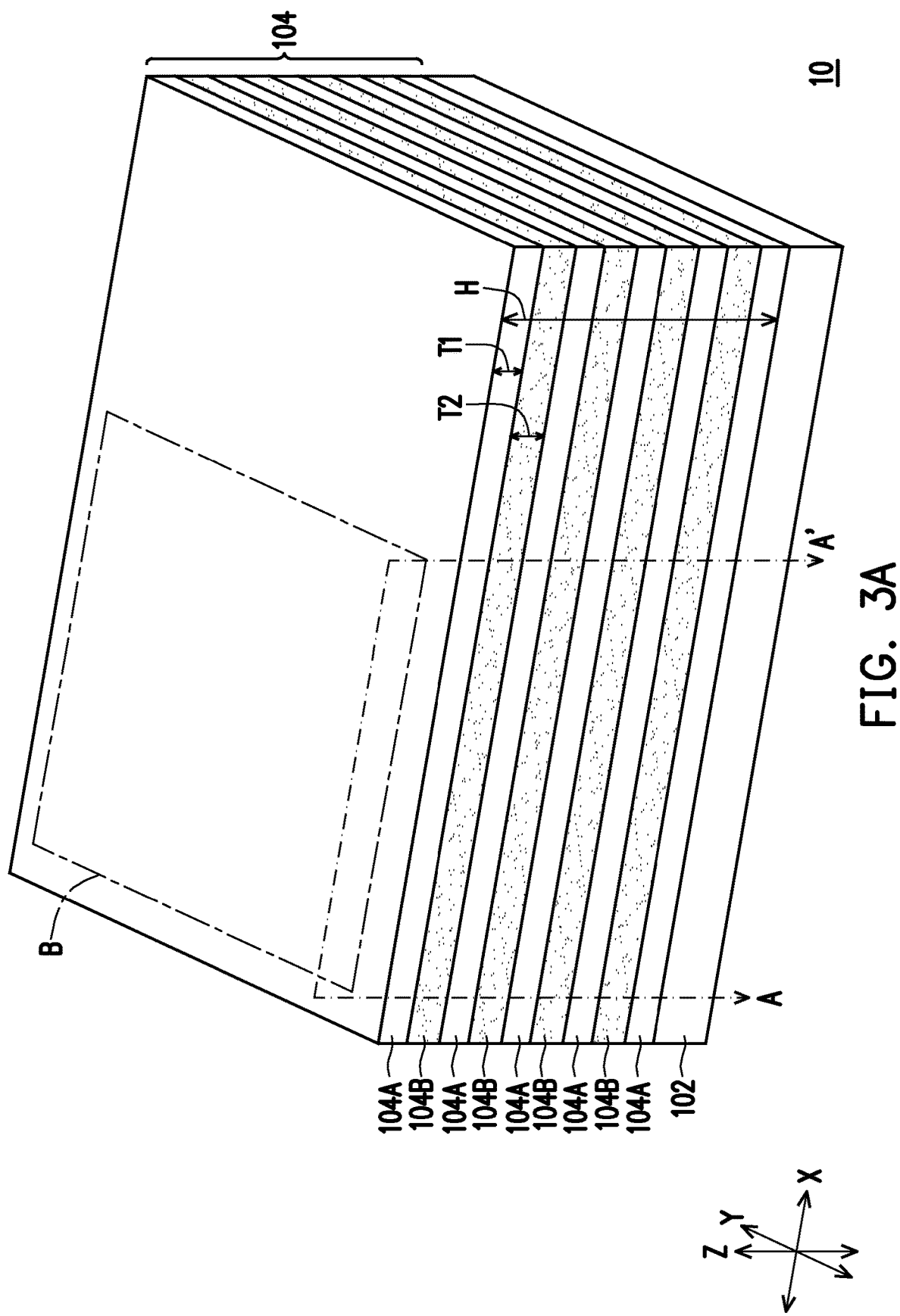
Figure 3B:
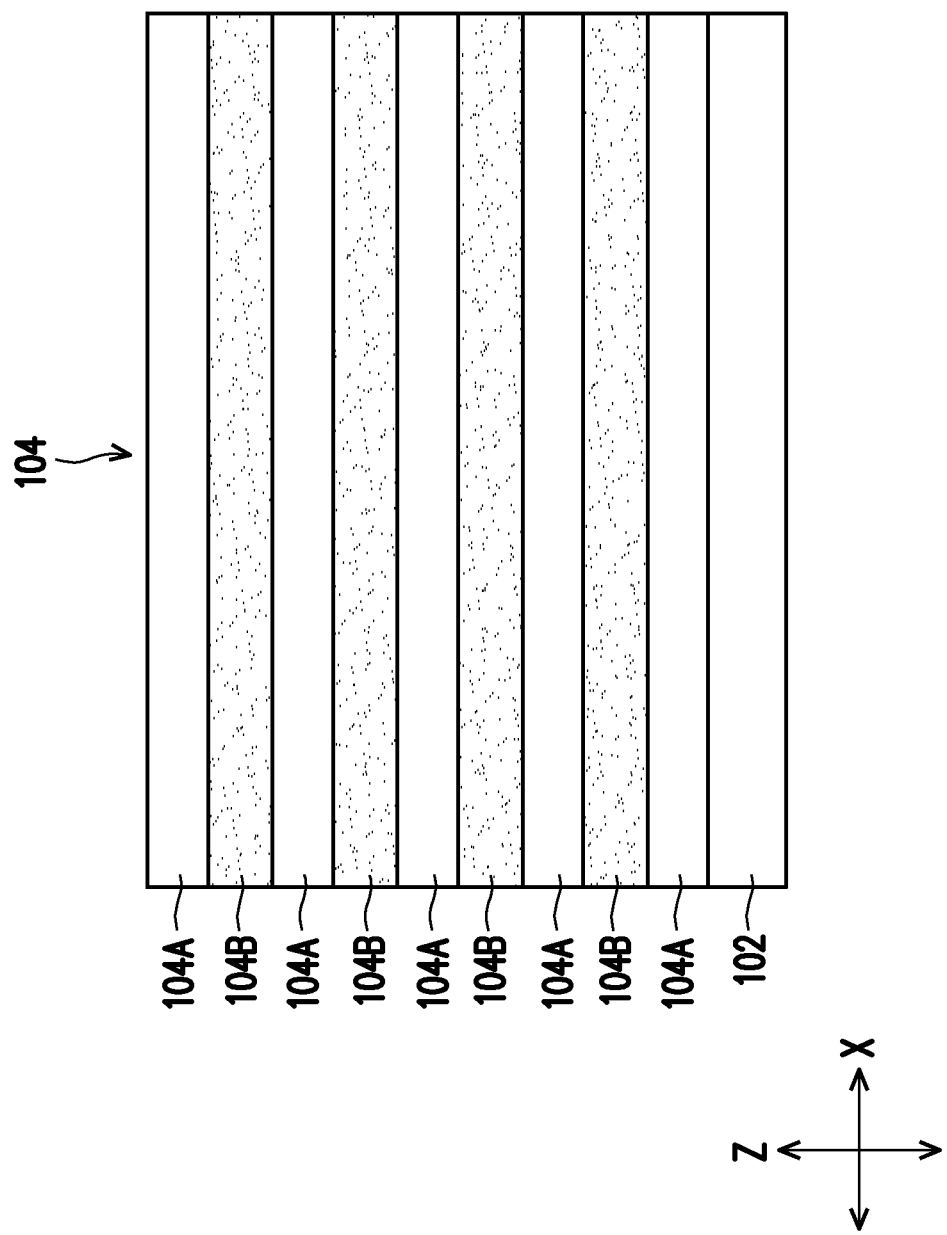
Figure 3C:
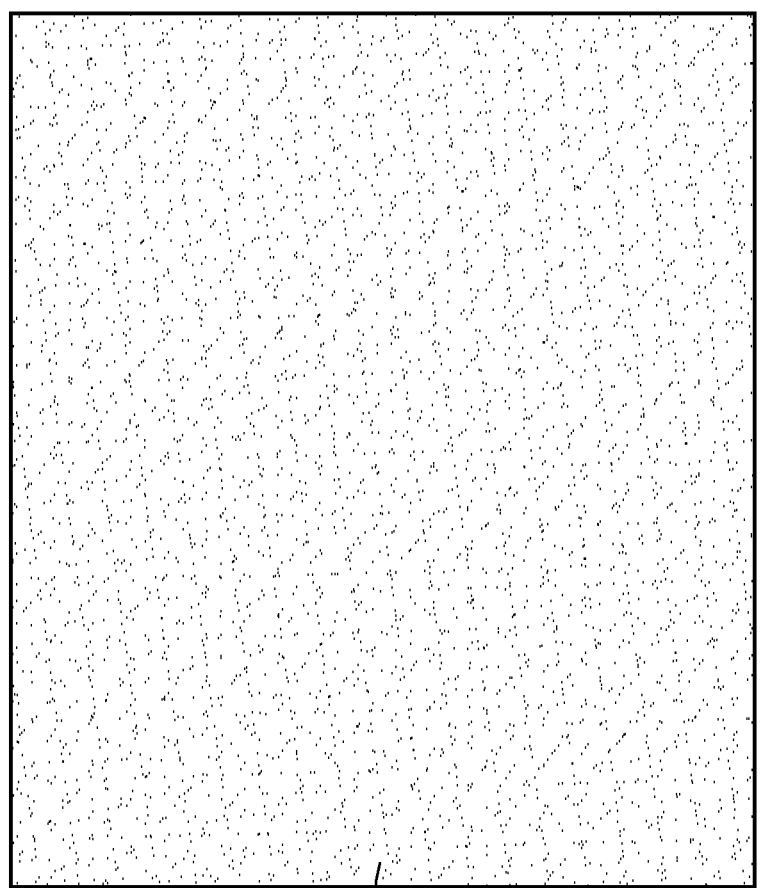

Referring to FIG. 3A through FIG. 3C, in some embodiments, an underlying structure 102 is provided, and a multilayer stack 104 is formed over the underlying structure 102, in accordance with step S100 of FIG. 2. The underlying structure 102, for example, is an etching stop layer over a semiconductor substrate (not shown). The underlying structure 102 may be referred to as a substrate of the three-dimensional memory device 10. The underlying structure 102 may be a semiconductor substrate, such as a bulk semiconductor, a semiconductor-on-insulator (SOI) substrate, or the like, which may be doped (e.g., with a p-type or an n-type dopant) or undoped. The underlying structure 102 may be a wafer, such as a silicon wafer. Generally, an SOI substrate is a layer of a semiconductor material formed on an insulator layer. The insulator layer may be a buried oxide (BOX) layer, a silicon oxide layer, or the like. For example, the insulator layer is provided on a substrate, typically a silicon or glass substrate. Other substrates, such as a multilayered or gradient substrate may also be used. In some embodiments, the semiconductor material of the underlying structure 102 includes silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. The underlying structure 102 may include a dielectric material. For example, the underlying structure 102 is a dielectric substrate, or include a dielectric layer on a semiconductor substrate. Acceptable dielectric materials for dielectric substrates may include oxides such as silicon oxide; nitrides such as silicon nitride; carbides such as silicon carbide; the like; or combinations thereof such as silicon oxynitride, silicon oxycarbide, silicon carbonitride, or the like. In some embodiments, as shown in FIG. 3A, the underlying structure 102 is formed of silicon carbide.

In some embodiments, the multilayer stack 104 includes alternating first dielectric layers 104A and second dielectric layers 104B. For example, the first dielectric layers 104A are formed of a first dielectric material, and the second dielectric layers 104B are formed of a second dielectric material. The first dielectric material and the second dielectric material may each be selected from the candidate dielectric materials of the underlying structure 102. The first dielectric material is different from the second dielectric material, in some embodiments. As illustrated in FIG. 3A through FIG. 11C, the multilayer stack 104 includes five layers of the first dielectric layers 104A and four layers of the second dielectric layers 104B for illustrative purposes; however, the disclosure is not limited thereto. It should be appreciated that the multilayer stack 104 may include any number of the first dielectric layers 104A and the second dielectric layers 104B.

The multilayer stack 104 will be patterned in subsequent processing depicted in FIGS. 4A-4C through FIGS. 11A-11C to form trenches and transistors formed in the trenches. As such, the dielectric materials of the first dielectric layers 104A and the second dielectric layers 104B both have a high etching selectivity from the etching of the underlying structure 102. In other words, for example, the underlying structure 102 is an etching stop layer formed over a CMOS integrated circuit to prevent any undesired damages or etches to layers underneath the underlying structure inside the CMOS integrated circuit. The patterned first dielectric layers 104A are insulating layers, which will be used to isolate the subsequently formed transistors. The patterned second dielectric layers 104B are sacrificial layers (or dummy layers), which will be removed in subsequent processing and replaced with word lines for the transistors. As such, the second dielectric material of the second dielectric layers 104B also has a high etching selectivity from the etching of the first dielectric material of the first dielectric layers 104A. In other words, the first dielectric layers 104A could remain substantially intact during removal of the second dielectric layers 104B. In embodiments where the underlying structure 102 is formed of silicon carbide, the first dielectric layers 104A can be formed of an oxide such as silicon oxide, and the second dielectric layers 104B can be formed of a nitride such as silicon nitride. Other combinations of dielectric materials having acceptable etching selectivity from one another may also be used.

Each layer of the multilayer stack 104 may be formed by an acceptable deposition process such as chemical vapor deposition (CVD) such as plasma-enhanced chemical vapor deposition (PECVD) or flowable chemical vapor deposition (FCVD), atomic layer deposition (ALD), or the like. A thickness of each of the layers may be in the range of about 15 nm to about 90 nm. In some embodiments, the first dielectric layers 104A are formed to a different thickness than the second dielectric layers 104B. For example, the first dielectric layers 104A can be formed to a first thickness T1 and the second dielectric layers 104B can be formed to a second thickness T2, with the second thickness T2 being from about 0% to about 100% greater than or less than the first thickness T1. The multilayer stack 104 can have an overall height H in the range of about 1000 nm to about 50000 nm. In the disclosure, FIG. 3C through FIG. 11C each schematically illustrate the enlarged plan view of a portion the three-dimensional memory device 10 depicted in the boxes B that is at a level where one second dielectric layer 104B located in, for example.

Figure 4A:
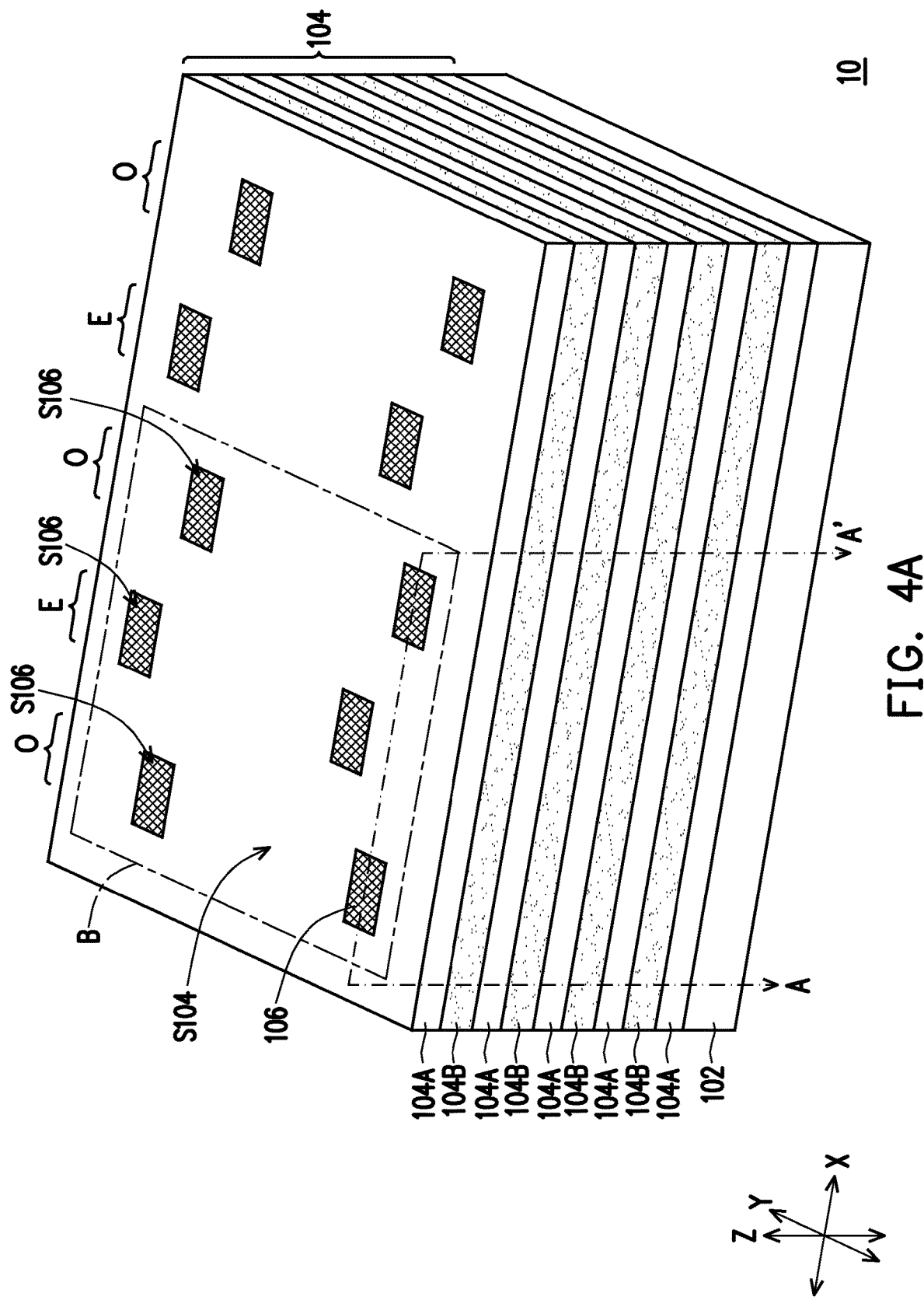
Figure 4B:
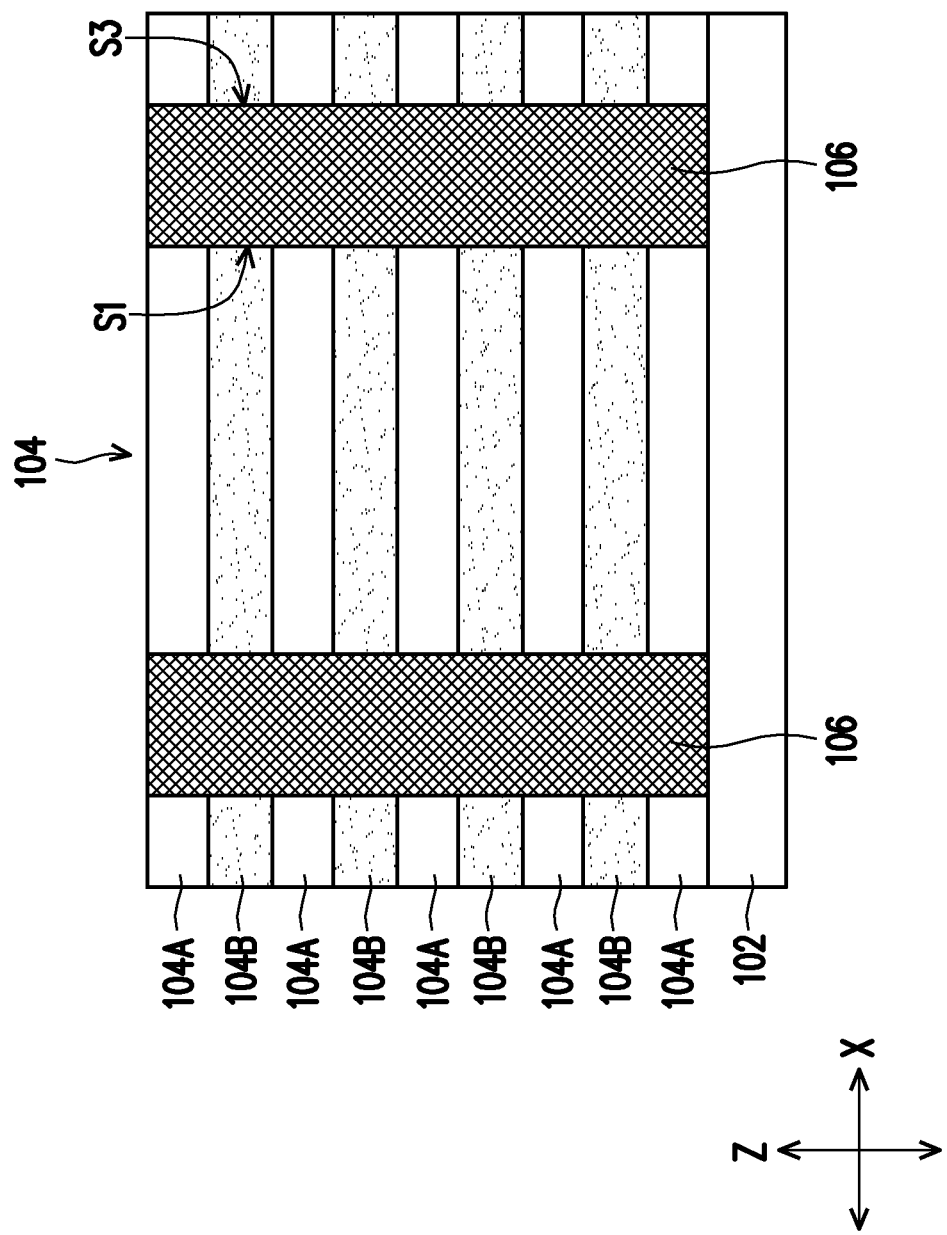
Figure 4C:
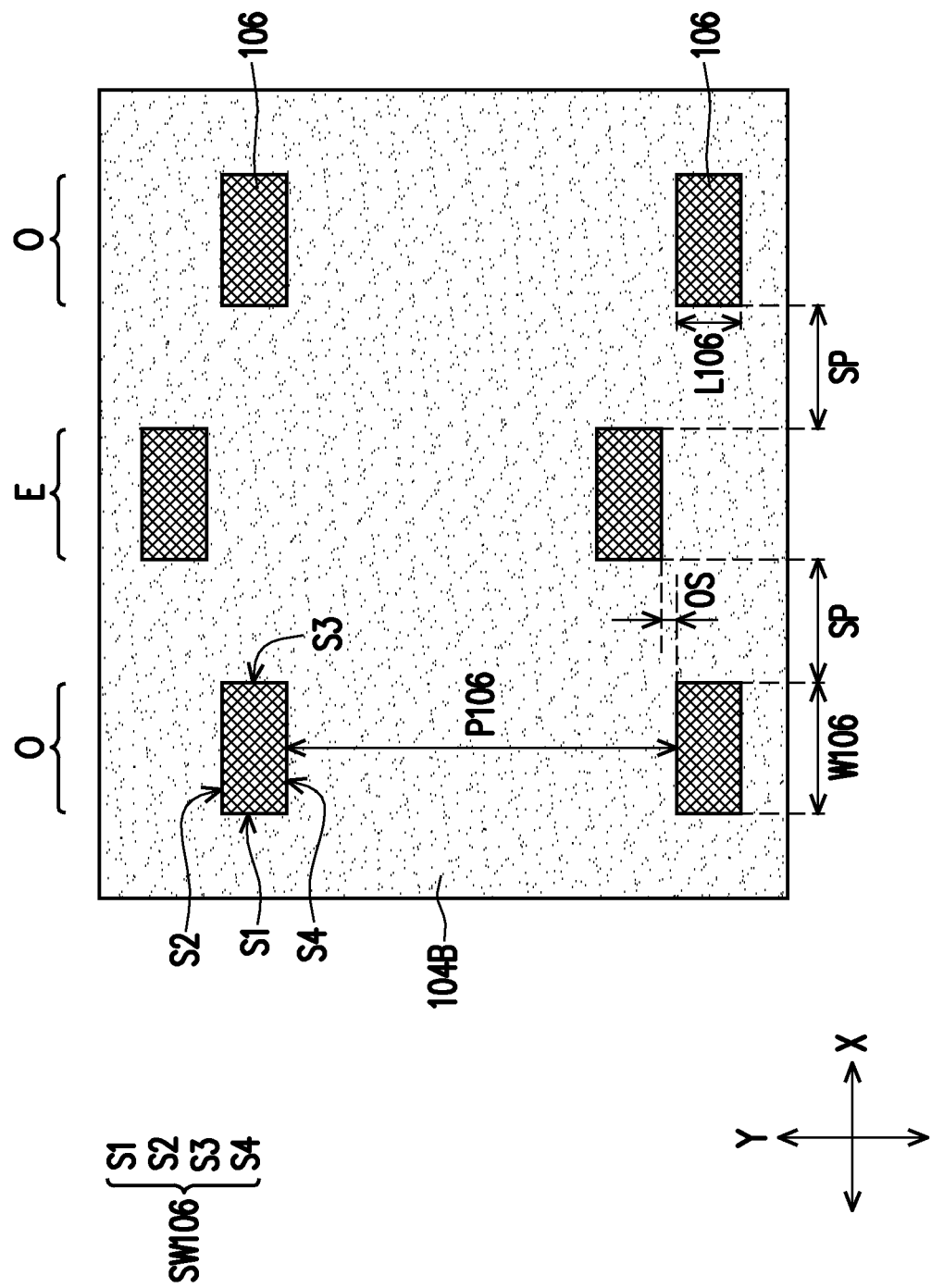

Referring to FIG. 4A through FIG. 4C, in some embodiments, at least one struts 106 is formed in the multilayer stack 104, in accordance with step S102 of FIG. 2. For example, a plurality of struts 106 are formed in the multilayer stack 104, as shown in FIG. 4A through FIG. 4C. The struts 106 independently penetrate through the multilayer stack 104 along a stacking direction (e.g. a direction Z) of the first dielectric layers 104A and the second dielectric layers 104B. The struts 106 may reach the underlying structure 102. In other words, the struts 106 may be embedded in the multilayer stack 104 with top surfaces S106 exposed from a top surface S104 of the multilayer stack 104 and bottom surfaces (not labeled) standing on (e.g., in contact with) a top surface (not labeled) of the underlying structure 102. In some embodiments, the struts 106 are separated from one another with the rest of the multilayer stack 104, where sidewalls SW106 (including surfaces S1 through S4) of the struts 106 are covered by (e.g., in contact with) the multilayer stack 104, as shown in FIG. 4C.

The struts 106 may be arranged as having multiple columns extending along a direction Y, where the columns of the struts 106 are arranged side-by-side and separating apart from each other along a direction X intersected with the direction Y. The direction X and the direction Y may be different from each other, and may be different from the direction Z. In some embodiments, the columns of the struts 106 are separated from one another by a spacing distance SP, where the spacing distance SP are substantially identical and are approximately ranging from 500 nm to 50000 nm. For example, the direction X and the direction Y are substantially perpendicular to each other, and are substantially perpendicular to the direction Z. In some embodiments, the columns of the struts 106 are alternatively offset from one another along the same direction (e.g., the direction Y) by an offset amount OS. In one embodiment, the offset amount OS are substantially identical. However, the disclosure is not limited thereto; alternatively, the offset amount OS may be different form one another, from every two column, from every three column, or so on. For example, as shown in FIG. 4C, odd columns (labeled as "O") of the struts 106 are offset from an even column (labeled as "E") of the struts 106 along the direction Y. In such embodiment, the struts 106 are arranged in a staggered configuration.

Each of the struts 106 may be a vertical sheet (extending along the direction Z as shown in FIG. 4B) that has a top view shape with a long axis perpendicular to an extending direction (e.g., the direction Y) of the column of the struts 106. The extending direction of the column of the struts 106 may be referred to as a column direction. For example, as shown in a plan view (e.g. a X-Y plane) of FIG. 4C, each strut 106 may be formed as having a substantially rectangular top view shape with a length L106 and a width W106. In some embodiments, the length L106 is approximately ranging from 30 nm to a length of one cell region (e.g. CR depicted in FIGS. 9A-9C) as measured in the direction Y. In some embodiments, the width W106 is substantially equal to a width of one trench 108 (where the strut 106 located in) as measured in the direction X. In some embodiments, a spacing distance P106 of the struts 106 in each column is a substantially identical to each other. The spacing distance P106 may be approximately ranging from 500 nm to 5.0 μm.

The struts 106 are made of an insulating material. In some embodiments, the material of the struts 106 has a sufficient etching selectivity with respect to the materials of the first dielectric layers 104A and the second dielectric layers 104B, such that the struts 106 may remain substantially intact during a subsequent step for forming trenches 108 in the multilayer stack 104 as to be described with reference to FIGS. 5A-5C. The material of the struts 106 may include silicon carbonitride (SiCN) or the like. In some embodiments, the material of the underlying structure 102 is different from the material of the struts 106, while the material of the struts 106 is also different from the materials of the first and second dielectric layers 104A and 104B, in some embodiments. In embodiments where the underlying structure 102 is formed of silicon carbide, the first dielectric layers 104A is formed of an oxide such as silicon oxide, and the second dielectric layers 104B is formed of a nitride such as silicon nitride, the struts 106 can be made of silicon carbonitride. Alternatively, the material of the underlying structure 102 is the same as the material of the struts 106, while the material of the struts 106 is different from the materials of the first and second dielectric layers 104A and 104B. In addition, in some embodiments, a method for forming the struts 106 includes forming through holes in the multilayer stack 104 by a lithography process and an etching process (e.g., an anisotropic etching process), and filling an insulating material into these through holes by a deposition process (e.g., a CVD process). Subsequently, a planarization process may be performed to remove portions of the insulating material above the multilayer stack 104, and the remained portions of the insulating material form the struts 106. For example, the planarization process may include a grinding process, a chemical mechanical polishing (CMP) process, an etching process or a combination thereof.

As illustrated in FIG. 4A through FIG. 4C, only ten struts 106 are formed in the multilayer stack 104 for illustrative purposes; however, the disclosure is not limited thereto. It should be appreciated that the number of the struts 106 may be any number depending on the design requirement.

Figure 5A:
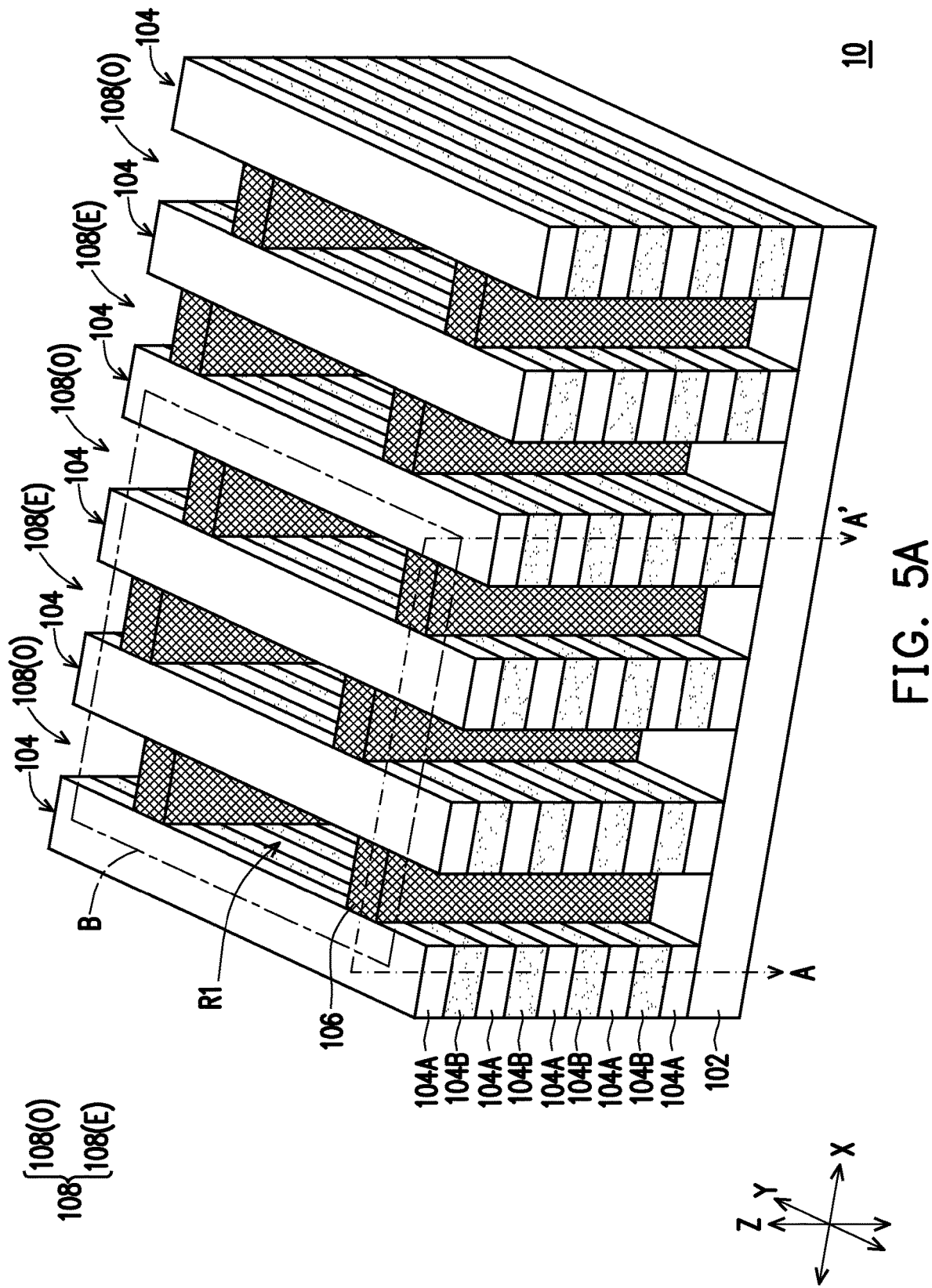
Figure 5B:
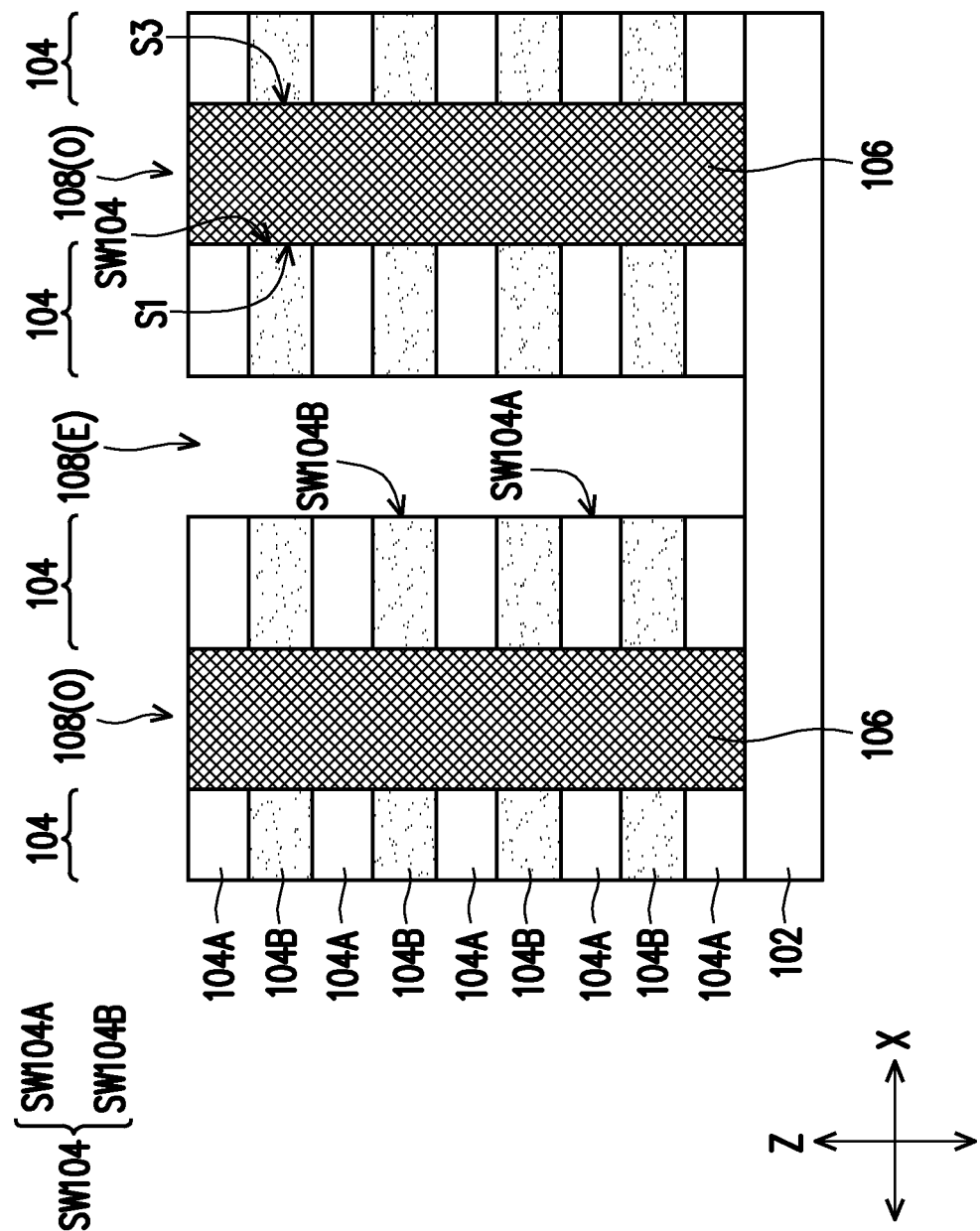
Figure 5C:
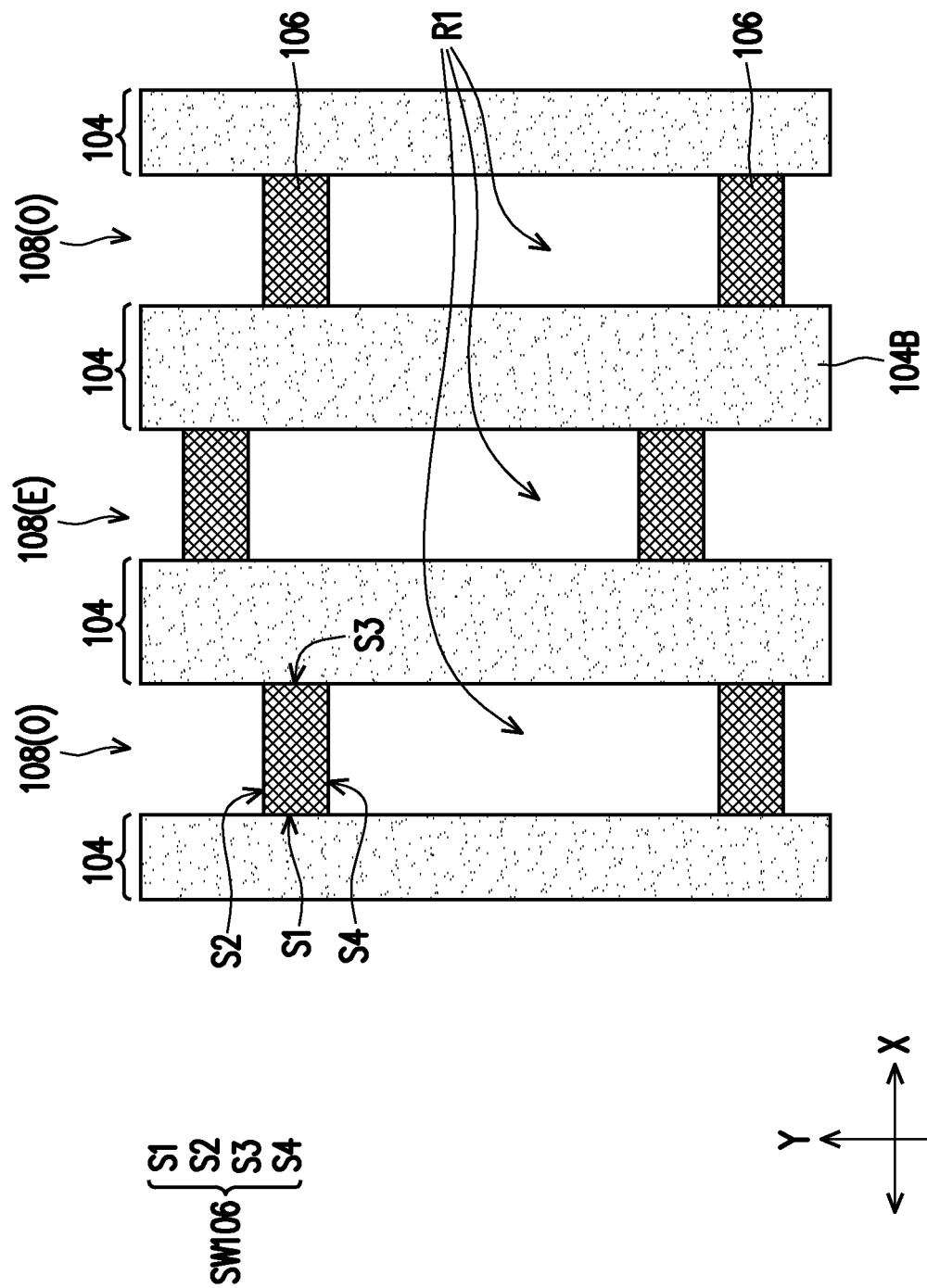

Referring to FIG. 5A through FIG. 5C, in some embodiments, trenches 108 are formed in the multilayer stack 104, in accordance with step S104 of FIG. 2. For example, the trenches 108 extend through the multilayer stack 104 to expose the underlying structure 102 (e.g., the top surface), and respectively extend along one of the columns of the struts 106 to expose the struts 106 (e.g., the surfaces S2 and S4). In other words, the struts 106 are partially exposed by the trenches 108, where the multilayer stack 104 is cut into multiple linear portions by the trenches 108, and the linear portions of the multilayer stack 104 are connected to one another by the struts 106 formed in the trenches 108. In alternative embodiments, the trenches 108 extend through some but not all layers of the multilayer stack 104.

Figure 11A:
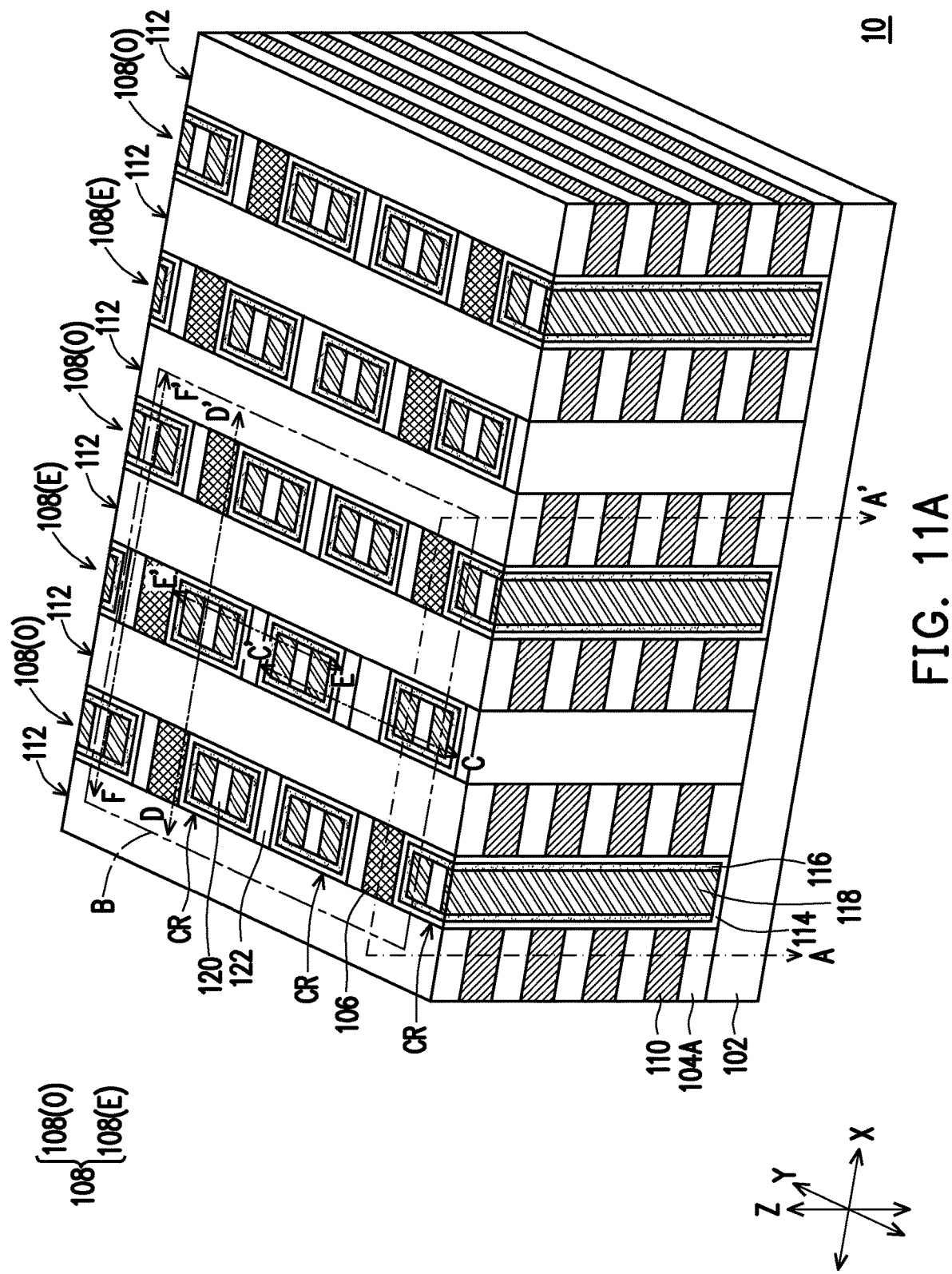
Figure 11B:
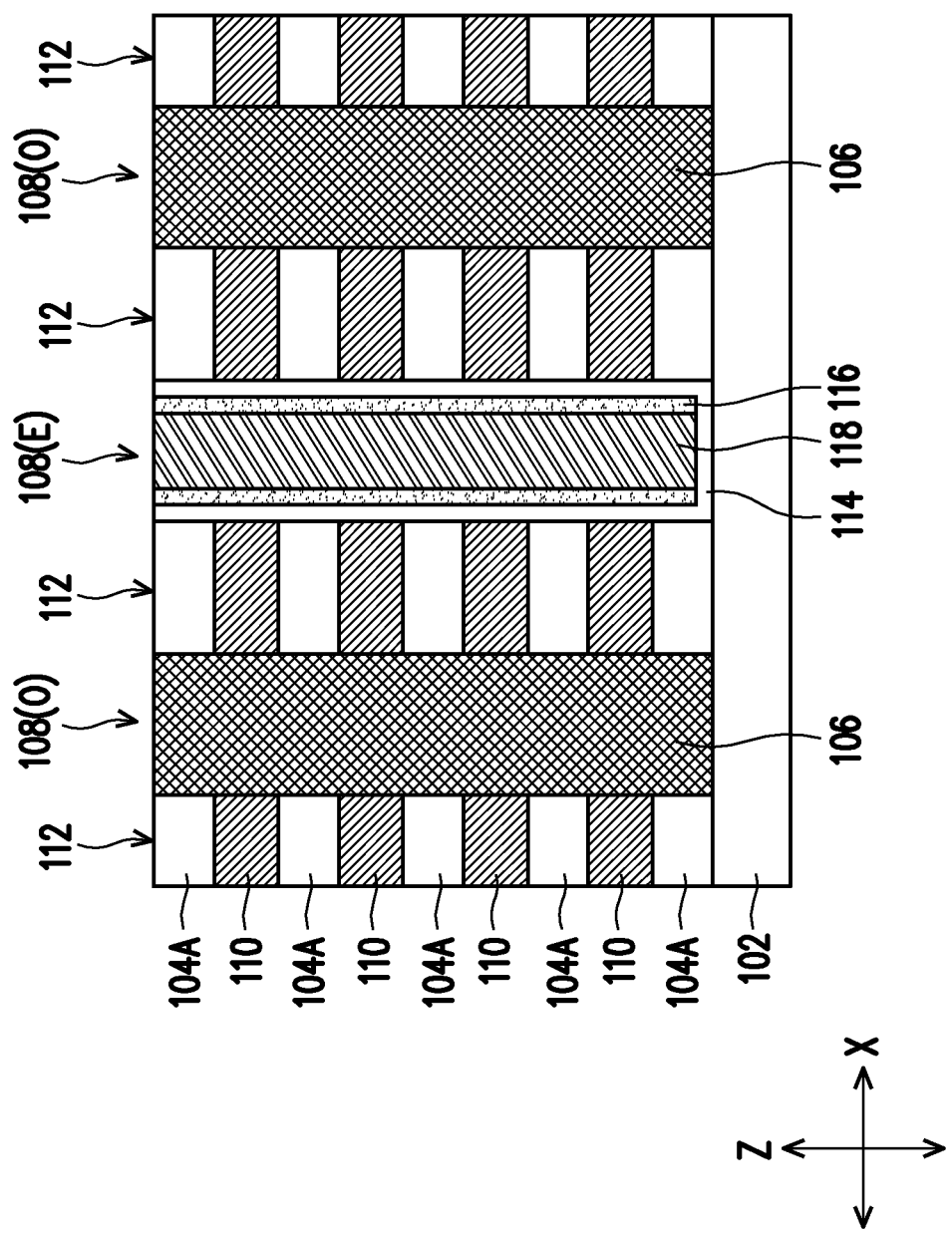
Figure 11C:
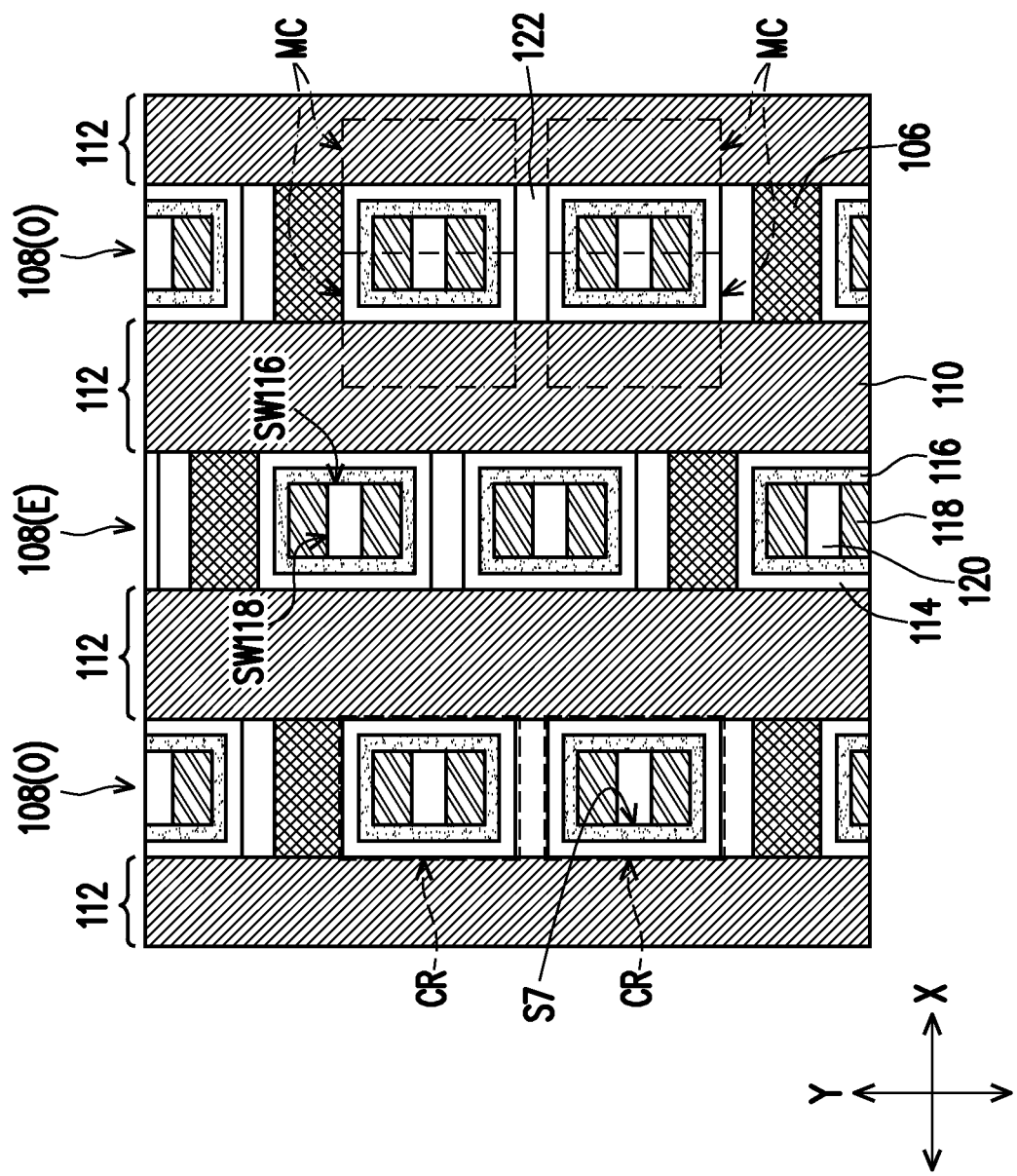

As shown in FIG. 5A through FIG. 5C, a linear portion of the multilayer stack 104 is disposed between each pair of the trenches 108 with the struts 106 formed therein, for example. In some embodiments, sidewalls SW104A of the first dielectric layers 104A and sidewalls SW104B of the second dielectric layers 104B are exposed by the trenches 108. The sidewalls SW104A of the first dielectric layers 104A may be substantially coplanar to and levelled with the sidewalls SW104B of the second dielectric layers 104B. The sidewalls S104A of the first dielectric layers 104A and sidewalls of the second dielectric layers 104B may together be referred to as sidewalls SW104 of the linear portions of the multilayer stack 104. As shown in FIG. 5B, for example, the surfaces S1 and S3 of the struts 106 are in contact with the sidewalls SW104 of the linear portions of the multilayer stack 104. That is, the surfaces S1 and S3 of the struts 106 directly prop against the sidewalls SW104 of the linear portions of the multilayer stack 104. It is understood that a high aspect ratio of a trench 108 will occur twisting or collapsing of the features (e.g., linear portions of the multilayer stack 104) during formation; however, due to the presence of the struts 106, the twisting or collapsing of the features (e.g., linear portions of the multilayer stack 104) is avoided, e.g., these features are supported by the struts 106. Owing to the struts 106, a yield of a manufacture of memory cells (e.g., MC as depicted in FIGS. 11A-11C) is increased, thereby improving the device performance of the three-dimensional memory device 10.

The trenches 108 exposing the odd column of the struts 106 are referred to as trenches 108(O), the trenches 108 exposing the even column of the struts 106 are referred to as trenches 108(E), where the trenches 108(O) and the trenches 108(E) included in the trenches 108 are alternatively arranged along the direction X, in some embodiments, as shown in FIG. 5B and FIG. 5C. The trenches 108(O) may be referred to as odd trenches while the trenches 108(E) may be referred to as even trenches. In addition, a column of the struts 106 are intersected with one of the trenches 108, and each trench 108 can be regarded as being divided into multiple sections by a column of the struts 106. Each section of the trench 108 between two adjacent linear portions of the multilayer stack 104, two adjacent struts 106 and the underlying structure 102 can be referred as a recess R1, in which an active region of a pair of memory cells MC (FIGS. 11A-11C) will be formed. In some embodiments, the recesses R1 each have a sufficient given area with respect to a given area of a cell region CR, such that one or more than one cell regions CR may be formed in each of the recesses R1 during a subsequent step as described with reference to FIGS. 9A-9C.

The trenches 108 may be formed using acceptable photolithography and etching techniques, such as with an etching process that is selective to the multilayer stack 104 (e.g., etches the dielectric materials of the first dielectric layers 104A and the second dielectric layers 104B at a faster rate than the material of the underlying structure 102 and the struts 106). The etching may be any acceptable etch process, such as a reactive ion etch (RIE), a neutral beam etch (NBE), the like, or a combination thereof. The etching may be anisotropic. That is, the underlying structure 102 and the struts 106 may have sufficient etching selectivity with respect to the materials in the multilayer stack 104, the underlying structure 102 and the struts 106 may remain substantially intact during the etching process. In embodiments where the underlying structure 102 is formed of silicon carbide, the first dielectric layers 104A are formed of silicon oxide, the second dielectric layers 104B are formed of silicon nitride, and the struts 106 are formed of silicon carbonitride, where the trenches 108 can be formed by a dry etch using a fluorine-based gas (e.g., $C_4F_6$) mixed with hydrogen ($H_2$) or oxygen ($O_2$) gas. In some embodiments, the width W106 of each of the struts 106 is substantially equal to a width of a respective one of the trenches 108.

Figure 6A:
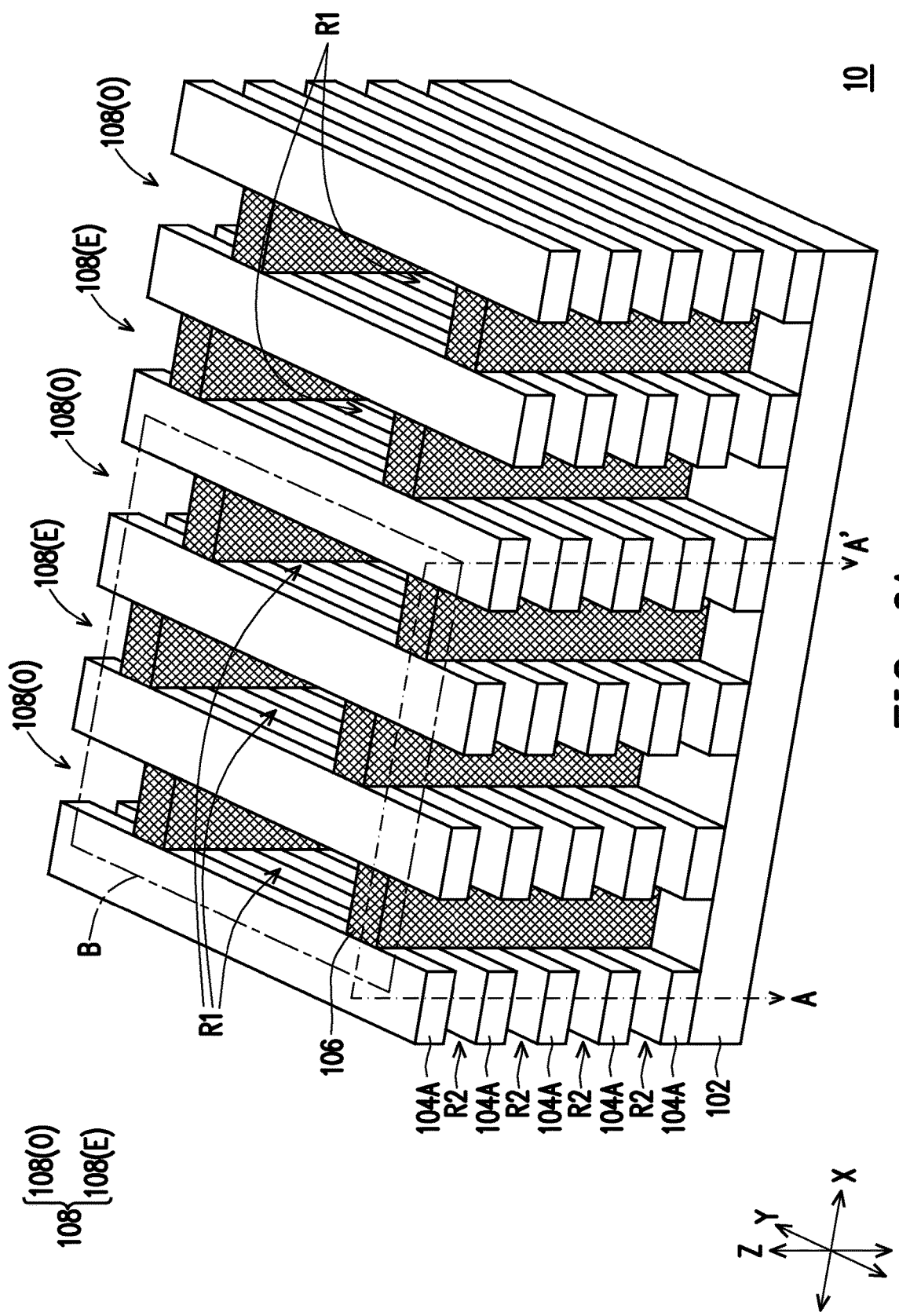
Figure 6B:
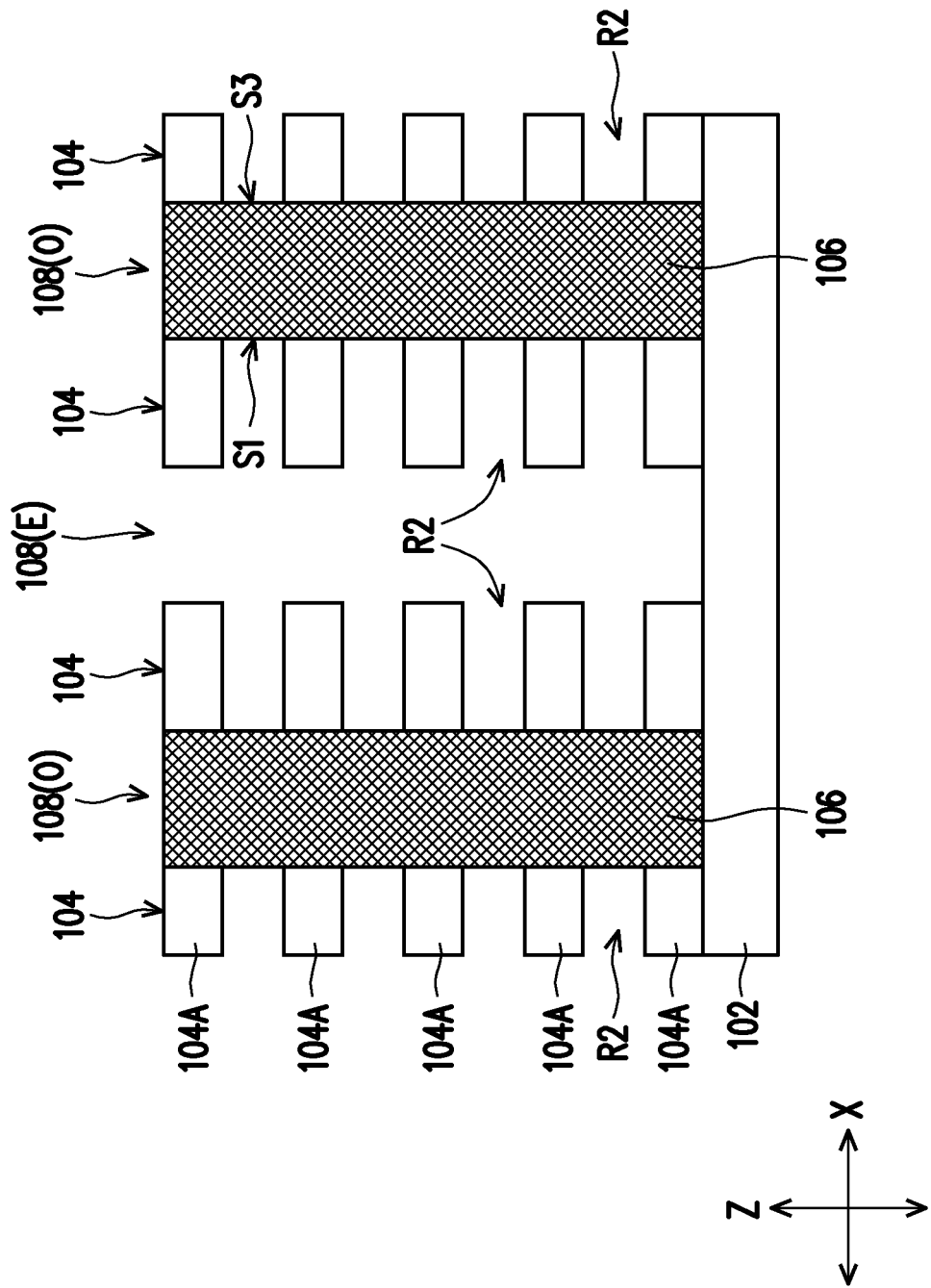
Figure 6C:
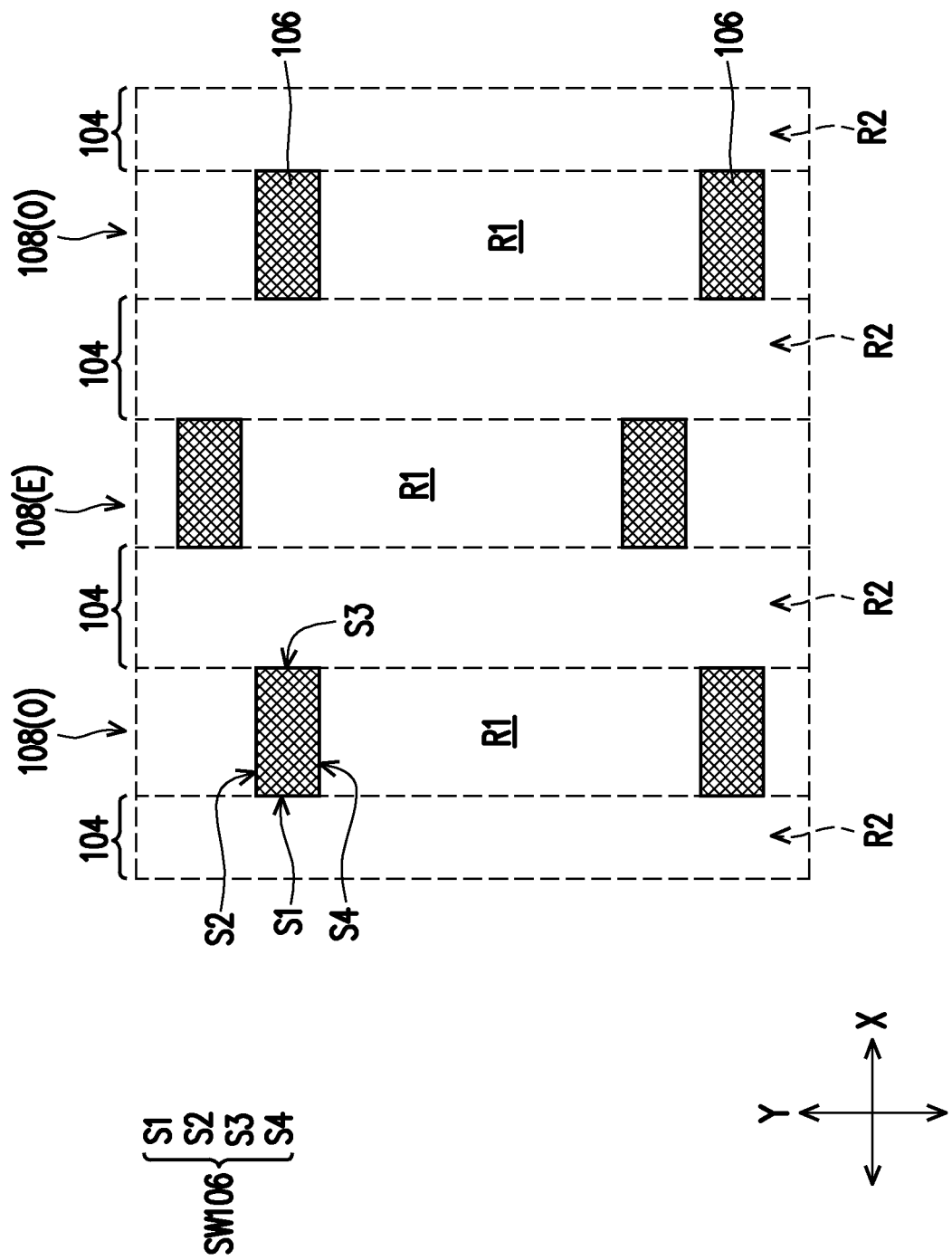

Referring to FIG. 6A through FIG. 6C, in some embodiments, the second dielectric layers 104B are selectively removed, in accordance with step S106 of FIG. 2. By removing the second dielectric layers 104B, a plurality of recesses R2 are formed to expose surfaces of the first dielectric layers 104A previously in contact with the second dielectric layers 104B, for example. In some embodiments, the recesses R1 formed in the trenches 108 and the recesses R2 formed in the linear portions of the multilayer stack 104 are spatially communicated to each other. With the removal of the second dielectric layers 104B, portions of the surfaces S2 and S4 of the struts 106 are exposed by the recesses R2, as shown in FIGS. 6B-6C, for example.

The recesses R2 may be formed by an acceptable etching process, such as one that is selective to the material of the second dielectric layers 104B (e.g., selectively etches the material of the second dielectric layers 104B at a faster rate than the materials of the struts 106, the first dielectric layers 104A and the underlying structure 102). The etching may be isotropic. In embodiments where the underlying structure 102 is formed of silicon carbide, the first dielectric layers 104A are formed of silicon oxide, the second dielectric layers 104B are formed of silicon nitride, the recesses R1 formed in the trenches 108 can be expanded by a wet etch using phosphoric acid ($H_3PO_4$). In alternative embodiments, a dry etch selective to the material of the second dielectric layers 104B may be used. Due to the underlying structure 102, the first dielectric layers 104A and the struts 106 could remain substantially intact during removal of the second dielectric layers 104B, the recesses R2 each can have a thickness substantially equal to the thickness T2 of the second dielectric layers 104B. Further, a periphery region surrounding an array region with a memory array (included in the three-dimensional memory device 10) has some portions of the second dielectric layers 104B that are not removed (e.g., during the replacement process described in FIG. 6A through FIG. 6C and FIG. 7A through FIG. 7C). Therefore, some portions of the second dielectric layers 104B in the periphery region also provides further support to prevent the first dielectric layers 104A in the array region from collapse.

Figure 7A:
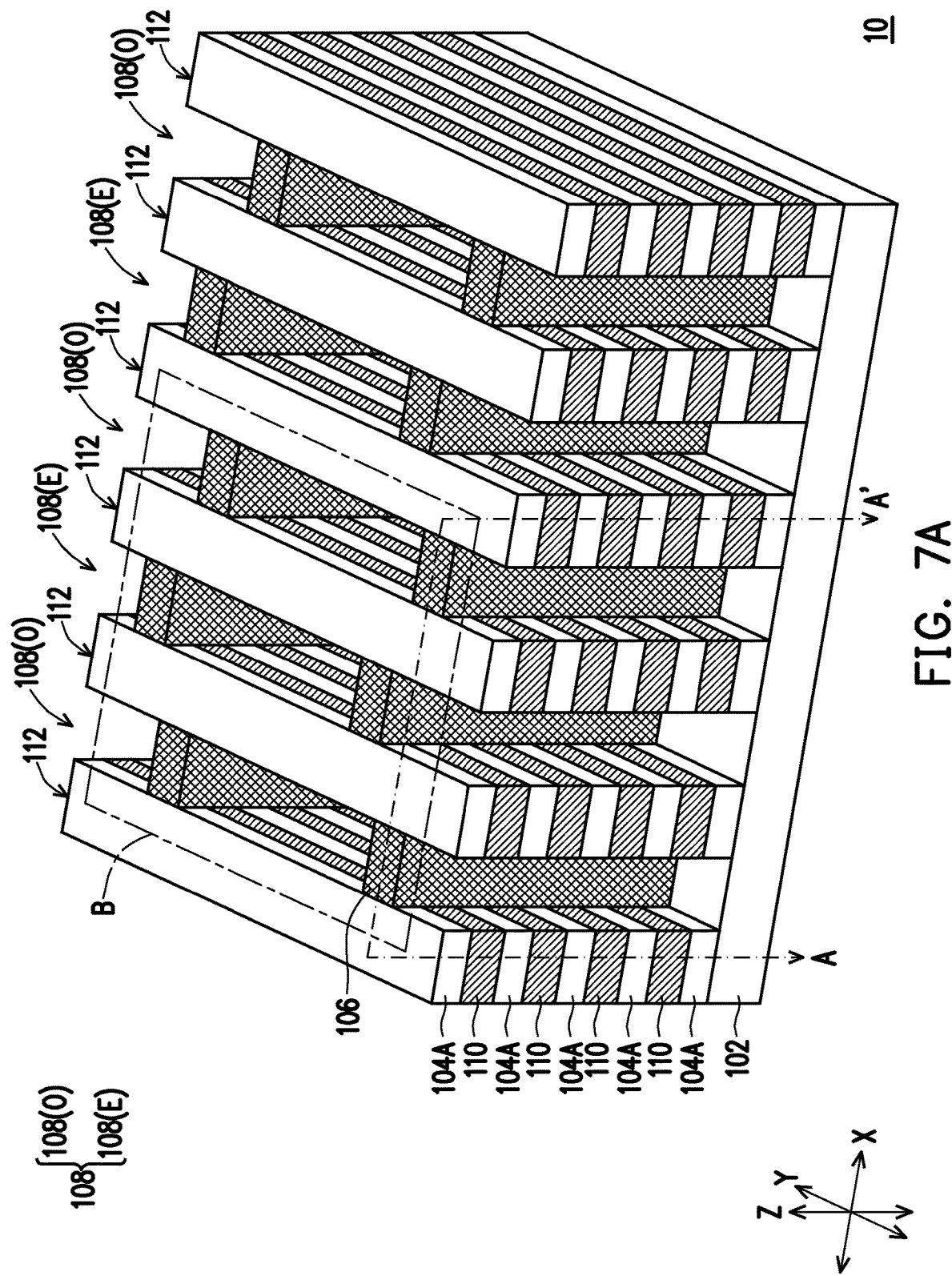
Figure 7B:
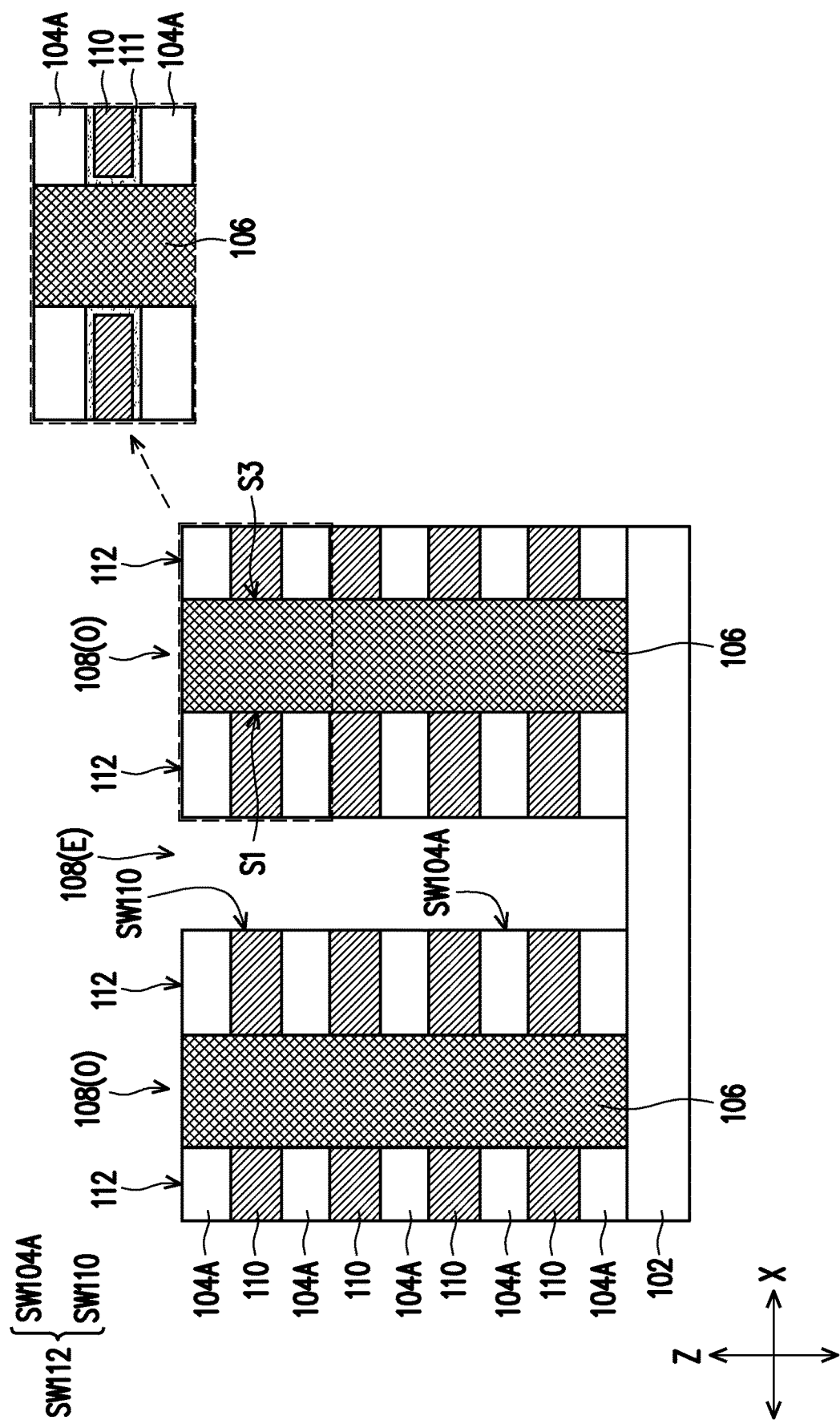
Figure 7C:
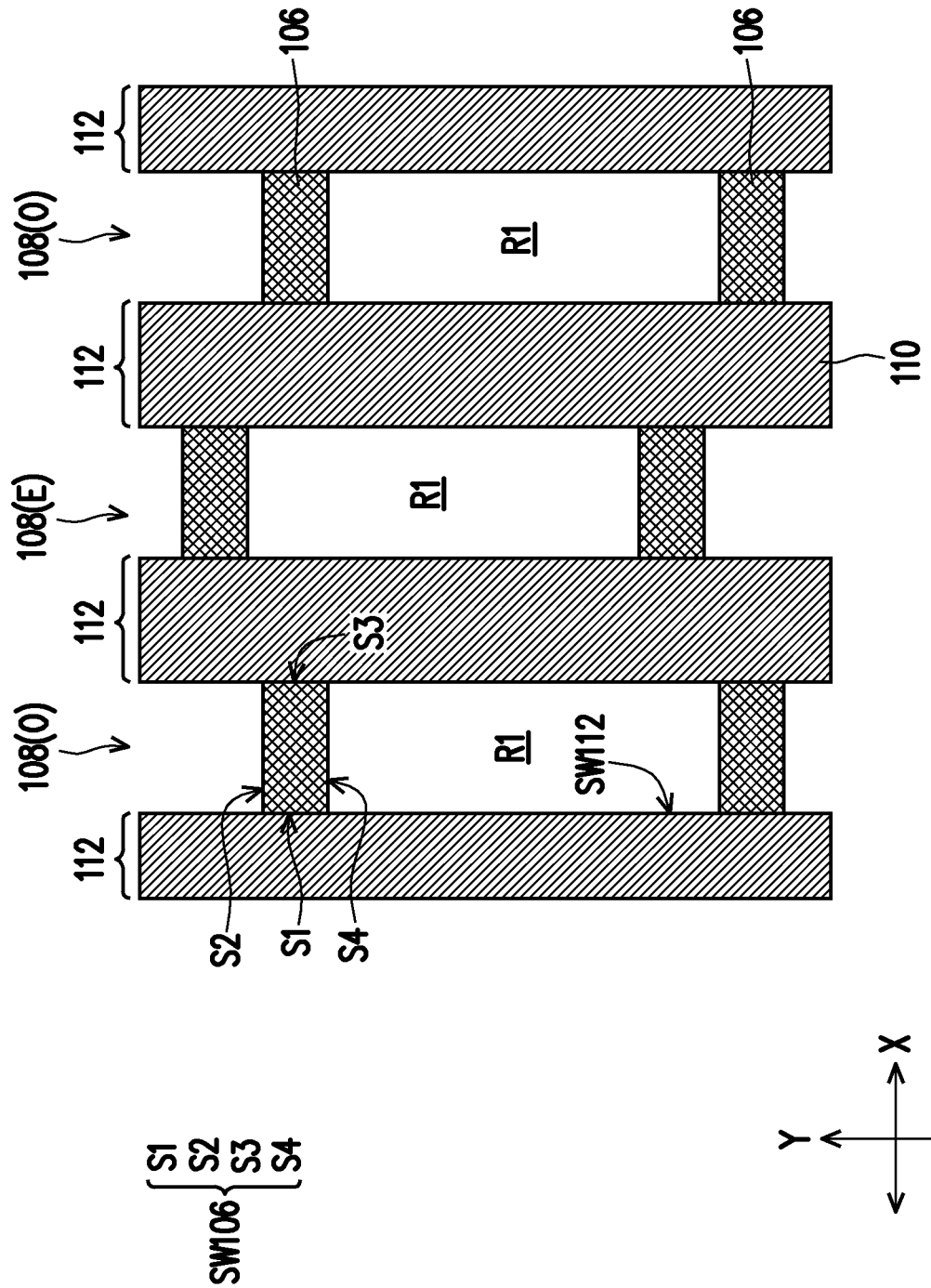

Referring to FIG. 7A through FIG. 7C, in some embodiments, conductive layers 110 are formed in the recesses R2, in accordance with step S108 of FIG. 2. In some embodiments, the previously existed second dielectric layers 104B are replaced by the conductive layers 110. For example, the first dielectric layers 104A and the conductive layers 110 are stacked on the underlying structure 102 in alternation, and together form a plurality of stacking structures 112. The stacking structures 112 are laterally spaced apart from one another by the trenches 108 and in contact with the struts 106 formed in the trenches 108, and directly stand on the underlying structure 102. As shown in FIG. 7B and FIG. 7C, the stacking structures 112 are connected through the structs 106, where the recesses R1 are confined by two adjacent stacking structures 112, two adjacent struts 106 connected to the two adjacent stacking structures 112 and the underlying structure 102. In some embodiments, sidewalls SW110 of the conductive layers 110 are substantially coplanar to and levelled with the sidewalls SW104A of the first dielectric layers 104A, as shown in FIG. 7B. The sidewalls SW110 of the conductive layers 110 and the sidewalls SW104A of the first dielectric layers 104A may together referred to as sidewalls SW112 of the stacking structures 112. For example, the sidewalls SW112 of the stacking structures 112 are substantially vertical sidewalls being substantially planar and flat, as shown in FIG. 7A and FIG. 7B. In other words, the sidewalls SW112 of the stacking structures 112 are continuously vertical sidewalls. For example, in a cross-section of FIG. 7B, the sidewalls SW112 include a substantially straight line. In some embodiments, the surfaces S1 and S3 of the struts 106 are in contact with the sidewalls SW112 of the stacking structures 112. That is, the struts 106 direct prop against the sidewalls SW112 of the stacking structures 112. The conductive layers 110 may be formed of a conductive material, such as a metal, such as tungsten, ruthenium, molybdenum, cobalt, aluminum, nickel, copper, silver, gold, alloys thereof, or the like. The conductive layers 110 may each be formed by an acceptable deposition process such as CVD, ALD, or the like.

A method for forming the conductive layers 110 may include, but not limited to, filling up the trenches 108 and the recesses R2 between the first dielectric layers 104A (shown in FIG. 5A) with the conductive material by a deposition process, such as a CVD process or an ALD process. Thereafter, portions of the conductive material not covered by the first dielectric layers 104A are removed by an etching process (e.g. a "etch-back" process). The remained portions of the conductive material form the conductive layers 110. In other words, the first dielectric layers 104A may be functioned as shadow masks during such etching process, and such patterning of the conductive material can be considered as a self-aligning process. An acceptable etch process, such as a dry etch (e.g., RIE, NBE, the like), a wet etch, the like, or a combination thereof, may be performed to remove excess conductive material from the sidewalls SW 104A of the first dielectric layers 104A, the surfaces S2 and S4 of the struts 106 and the top surface of the underlying structure 102. The etching may be anisotropic and isotropic. In other words, the sidewalls SW 104A of the first dielectric layers 104A, the surfaces S2 and S4 of the struts 106 and the top surface of the underlying structure 102 are free of the conductive layers 110 (e.g. the conductive material). Each of the conductive layers 110 can have a similar overall thickness T2 as the second dielectric layers 104B (discussed above with respect to FIG. 3A). Up to here, the replacement of second dielectric layers 104B with the conductive material is completed. In the disclosure, the conductive layers 110 may be referred to as gate layers. That is, the conductive layers 110 may act as the gates of the transistors.

Furthermore, although not shown, end portions of some of the stacking structures 112 may be shaped into staircase structures, of which an end portion of each film (one first dielectric layer 104A or one second dielectric layer 104B) of the multilayer stack 104 may be protruded with respect to an overlying film. One or more sides of the multilayer stack 104 is/are shaped into staircase structure(s) before forming the trenches 106. In these embodiments, the staircase structure(s) is/are formed by a staircase-first process. The first dielectric layers 104A and/or the second dielectric layers 104B may respectively be exposed at steps of the staircase structure(s). A method for shaping the multilayer stack 104 to form the staircase structure(s) may include a trim-and-etch process. Furthermore, a dielectric layer (not shown) may be subsequently formed on the multilayer stack 104 having the staircase structure. A top surface of this dielectric layer may be leveled with a top surface of the multilayer stack 104. With such, as the second dielectric layers 104B are removed and replaced with the conductive layers 110, the conductive layers 110 and the respective first dielectric layer 104A included in each of the stacking structures 112 is in a form of the staircase structure.

Additionally, one or more glue layers 111 (or referred to as barrier layers) may be formed between the first electric layers 104A and the conductive layers 110. In some embodiments, as shown in FIG. 7B, the glue layers 111 each extend along the sides (e.g., top surface and the bottom surface in contact with the first dielectric layers 104A and sidewalls in contact with the struts 106) of a conductive layer 110. The glue layers 111 are formed of a conductive material different from the material of the conductive layers 110, such as a metal nitride. For example, the material of the glue layers 111 includes titanium nitride, tantalum nitride, molybdenum nitride, zirconium nitride, hafnium nitride, or the like. The material of the glue layers 111 is one has good adhesion to the material of the first dielectric layers 104A, and the material of the conductive layers 110 is one that has good adhesion to the material of the glue layers 111. For one example, the first dielectric layers 104A are formed of an oxide such as silicon oxide, the glue layers 111 can be formed of titanium nitride and the conductive layers 110 can be formed of tungsten. The material of the glue layers 111 also has good adhesion to the material of the struts 106. Besides, each glue layer 111 can have a thickness less than the thickness T1 of the first dielectric layers 104A and the thickness of the conductive layers 110, where a sum of the overall thickness of the glue layers 111 and the thickness of a corresponding conductive layers 110 located in one recess R2 is equal to the thickness (e.g. T2) of such recess R2. Due to the glue layers 111, the adhesion between the first dielectric layers 104A and the conductive layers 110 in each of the stacking structures 112 is enhanced.

Figure 8A:
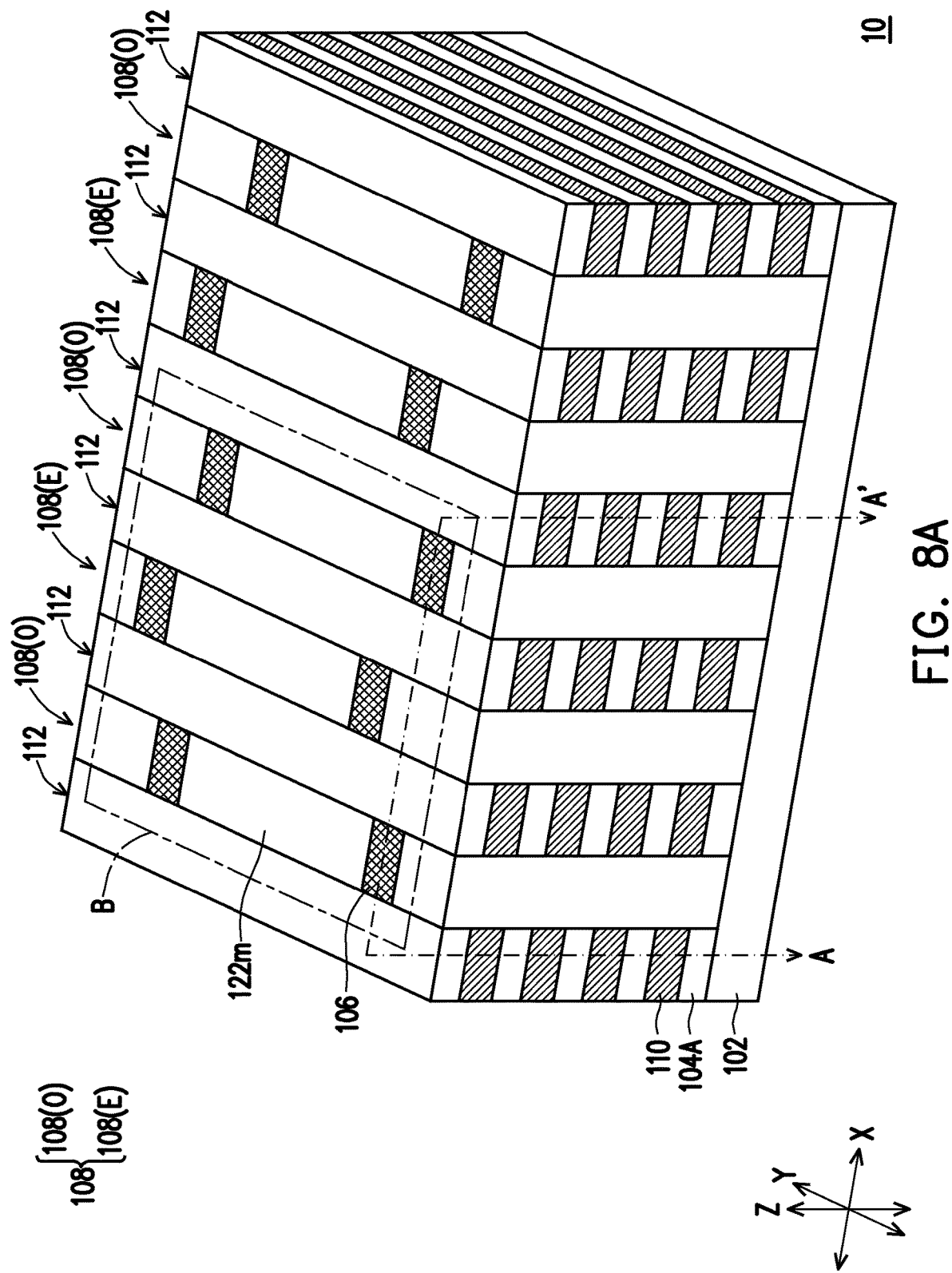
Figure 8B:
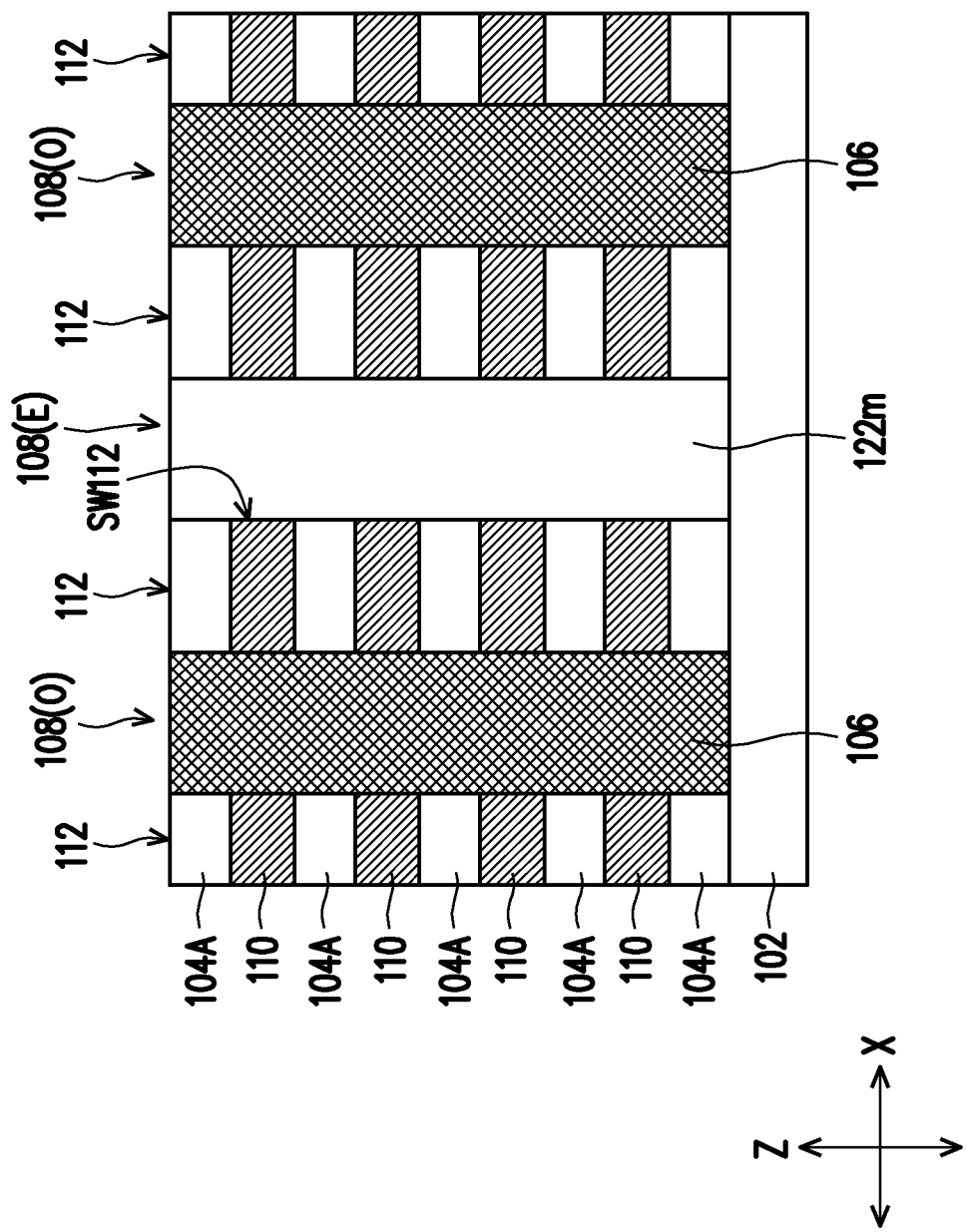
Figure 8C:
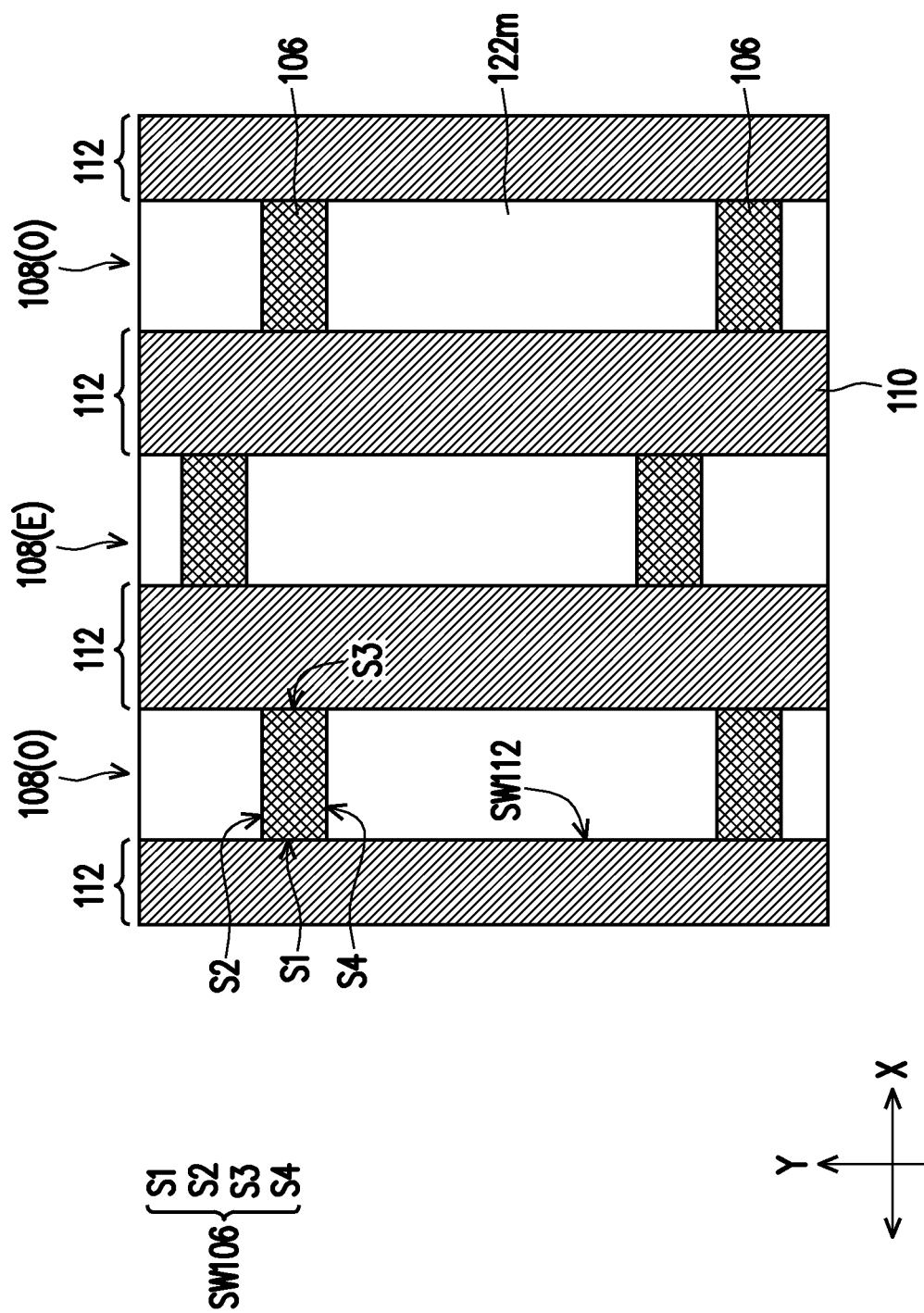

Referring to FIG. 8A through FIG. 8C, in some embodiments, a dielectric material 122*m* is formed in the trenches 108, in accordance with step S110 of FIG. 2. For example, the dielectric material 122m is formed to fill up the trenches 108 (including the recesses R1), where the surfaces S2 and S4 of the struts 106 and the sidewalls SW112 of the stacking structures 112 are in contact with the dielectric material 122m. The dielectric material 122m may be formed of an acceptable dielectric material which may include an oxide such as silicon oxide or aluminum oxide; a nitride such as silicon nitride; a carbide such as silicon carbide; the like; or a combination thereof such as silicon oxynitride, silicon oxycarbide, silicon carbonitride, or the like. The material of the dielectric material 122m may be the same as the material of the first dielectric layers 104A or the material of the second dielectric layers 104B. Alternatively, the material of the dielectric material 122m may be different from the material of the first dielectric layers 104A and/or the material of the second dielectric layers 104B. The disclosure is not limited thereto. In some embodiments, as long as the material of the dielectric material 122m is different from the material of the struts 106, the material of the dielectric material can be the same or different from the underlying structure 102 and/or the first and second dielectric layers 104A, 104B.

A method for forming the dielectric material 122m may include, but not limited to, filling up the trenches 108 (including the recesses R1) with the dielectric material by a deposition process, such as CVD or the like. Subsequently, a planarization process may be performed to remove portions of the dielectric material above illustrated top surfaces of the stacking structures 112. The planarization process may include a grinding process, a chemical mechanical polish (CMP) process, an etching process (e.g. etch-back) or a combination thereof. The remained portions of the dielectric material located within the trenches 108 form the dielectric material 122m. As shown in FIG. 8B, an illustrated top surface of the dielectric material 122m is substantially coplanar to and levelled with the illustrated top surfaces of the stacking structures 112, for example.

Referring to FIG. 8A through FIG. 8C and FIG. 9A through FIG. 9C together, in some embodiments, portions of the dielectric material 122m are removed to form a plurality of isolation structures 122 respectively separating a plurality of cell regions CR, in accordance with step S112 of FIG. 2. For illustrative purposes, only two cell regions CR are shown to be located in one recess R1, however the disclosure is not limited thereto. It should be appreciated that the number of the cell regions CR being formed in a recess R1 sandwiched between two immediately adjacent struts 106 inside a trench 108 may be any number depending on the design requirement. Two adjacent cell regions CR may be separated from one another by one isolation structure 122 (see FIG. 12C) or by one isolation structure 122 and one struct 106 connected thereto (see FIG. 12A). For example, two adjacent cell regions CR located in a single one cell region CR are separated from one another through an isolation structure 122. On the other hand, two immediately adjacent cell regions CR respectively located in a two adjacent cell region CR are separated through an isolation structure 122 and a strut 106 located next to the isolation structure 122. In some embodiments, the isolation structures 122 are referred to as dielectric plugs disposed between the cell regions CR.

Figure 9A:
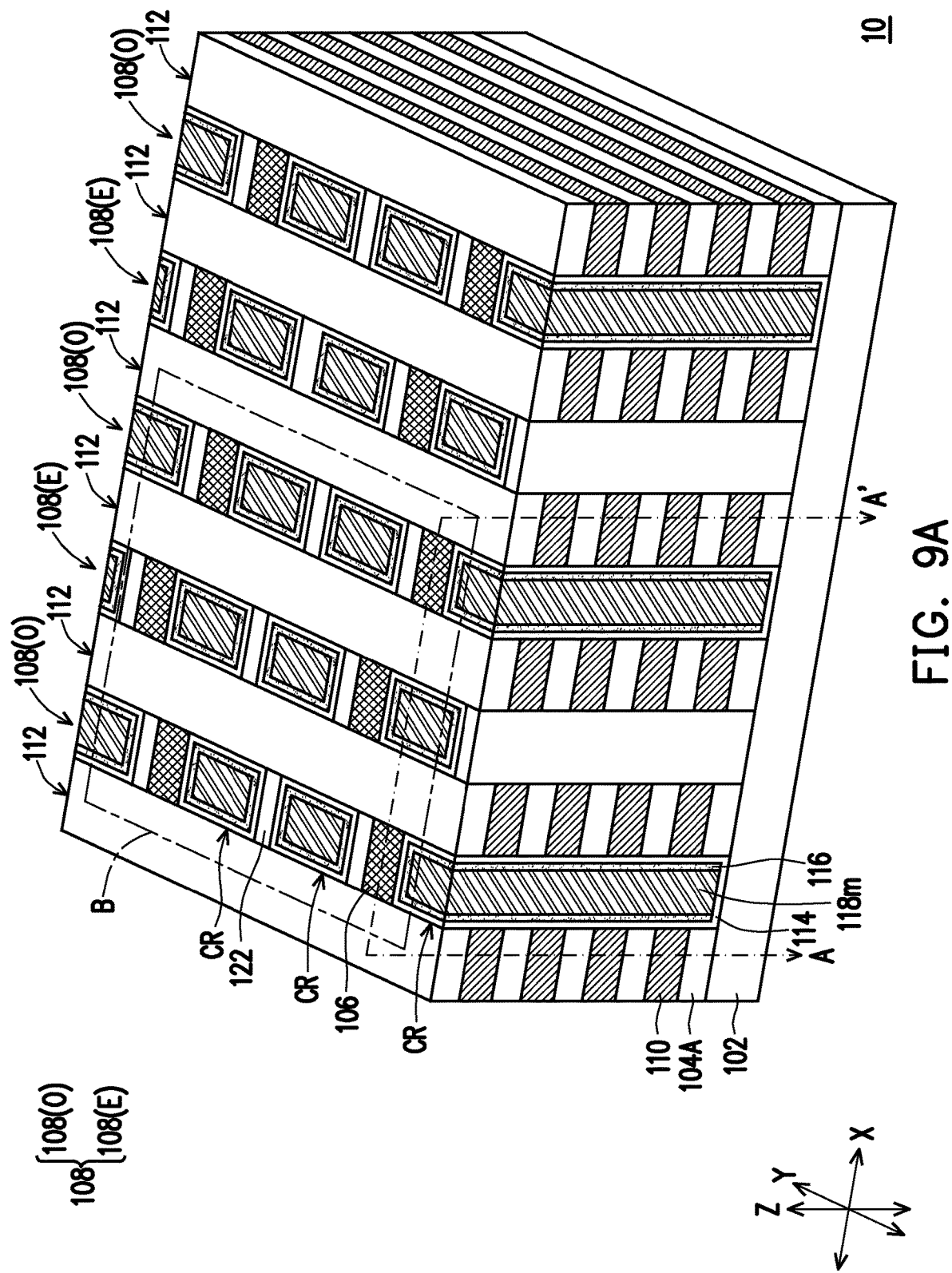
Figure 9B:
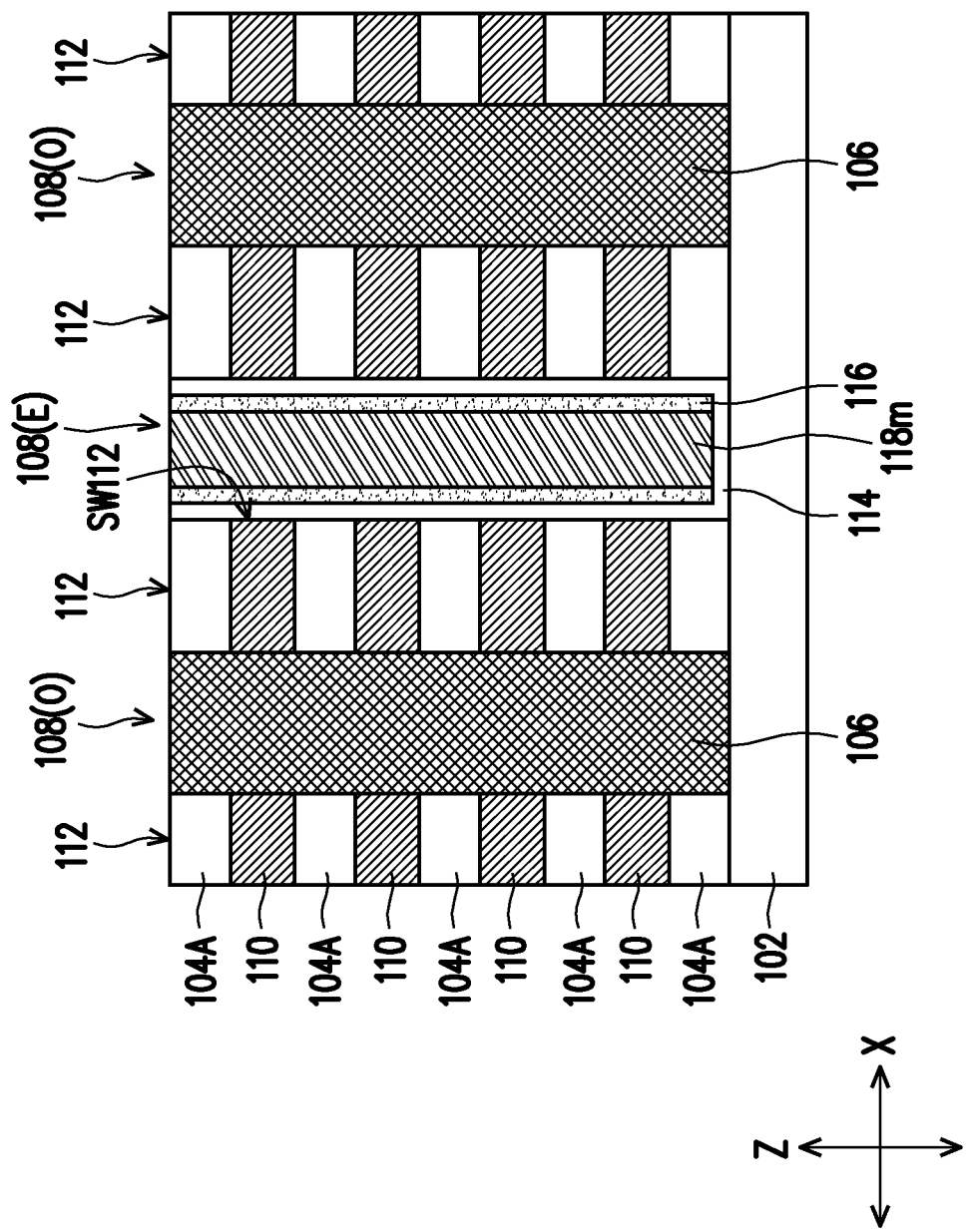
Figure 9C:
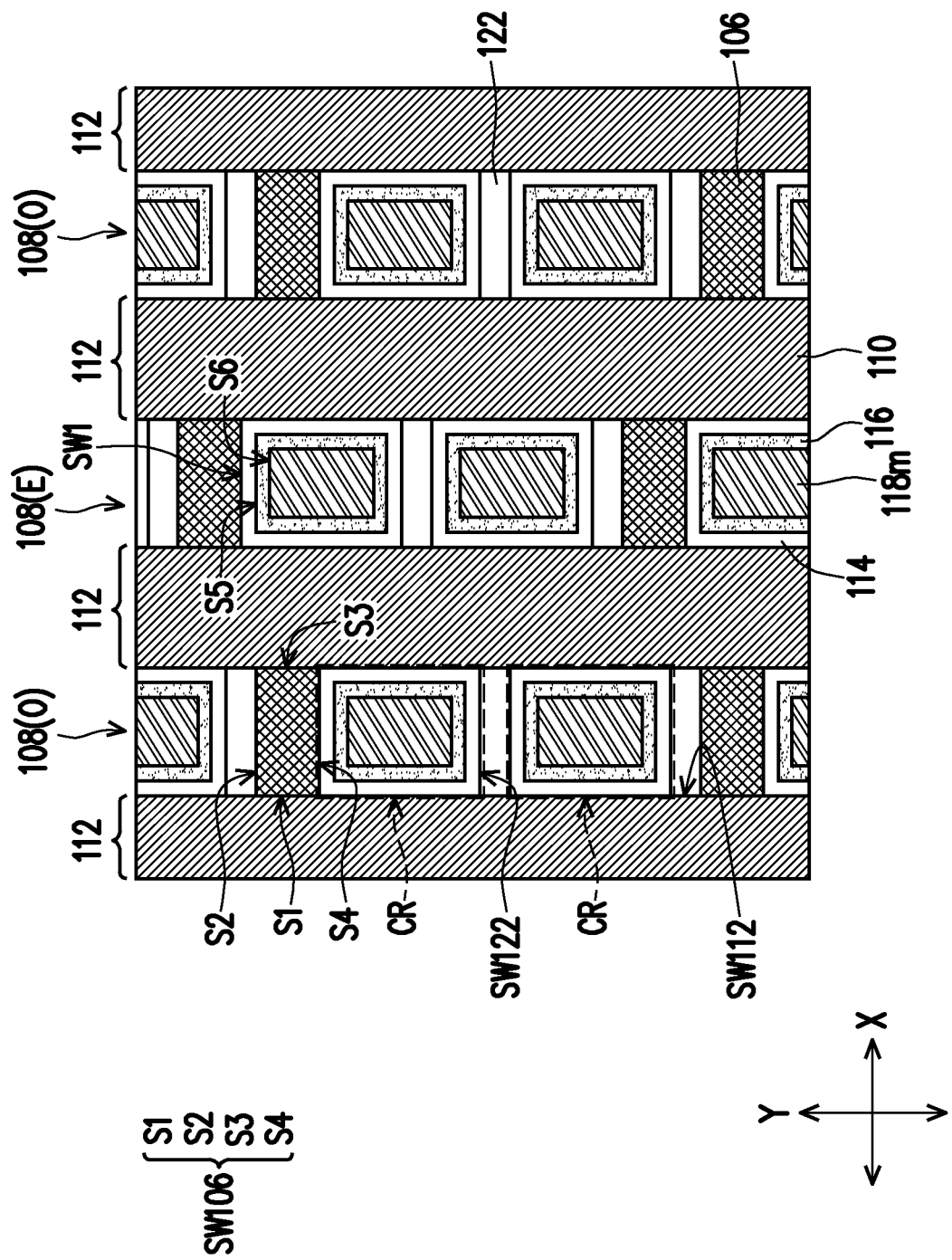

In some embodiments, the dielectric material 122m located in the recesses R1 formed in the trenches 108 is partially removed to form the cell regions CR, where the non-removed dielectric material 122m form multiple isolation structures 122 separating the cell regions CR from one another. The cell regions CR may penetrate through the trenches 108 to partially expose the top surface of the underlying structure 102, the sidewalls SW112 of the stacking structures 112, and sidewalls SW122 of the isolation structures 122. In some embodiments, while the surfaces S2 of the struts 106 are covered by the isolation structures 122, the surfaces S4 of the struts 106 are exposed by the cell regions CR, as shown in FIG. 9C. Alternatively, the surfaces S2 of the struts 106 may be exposed by the cell regions CR, while the surfaces S4 of the struts 106 may be covered by the isolation structures 122. However, the disclosure is not limited thereto. In further embodiments, the surfaces S2 and S4 of the struts 106 may both be covered by the isolation structures 122. In yet further embodiments, the surfaces S2 and S4 of the struts 106 may both be exposed by the cell regions CR.

A method for forming the cell regions CR may include, but not limited to, patterning the dielectric material 122m by using a photolithography process and an etching process to partially remove the dielectric material 122m. The etching may be any acceptable etch process, such as RIE, NBE, the like, or a combination thereof. The etching may be anisotropic.

After the formation of the cell regions CR, film stacks may be formed in the cell regions CR. The film stacks each may include one dielectric layer 114, one semiconductor layer 116 and one conductive material 118m, and may be formed in one of the cell regions CR.

Dielectric layers 114 are respectively formed on sidewalls SW1 of the cell regions CR, in accordance with step S114 of FIG. 2. For example, the dielectric layers 114 are formed on the exposed top surface of the underlying structure 102 as well as the exposed sidewalls SW112 of the stacking structures 112, as shown in FIGS. 9A and 9B. In other words, the dielectric layers 114 may be respectively formed in one of the cell regions CR. As described above, the cell regions CR can be prevented from communicating with one another due to the isolation structures 122. Therefore, the dielectric layers 114 respectively formed in one of the cell regions CR can be separated from one another. Further, as shown in FIG. 9A and FIG. 9C, the dielectric layers 114 may respectively be formed as having an annular top view shape. For example, a top view (on a X-Y plane depicted in FIG. 9C) of each dielectric layer 114 may appear as a substantially rectangular annulus. The dielectric layers 114 located in some cell regions CR immediately adjoined to the struts 106 may cover the sidewall S4 of a strut 106, the sidewalls SW112 of two adjacent stacking structure 112 connected through the strut 106 and the sidewall SW122 of an isolation structure 122, as shown in FIG. 9C. On the other hand, the dielectric layers 114 located in other cell regions CR being free from the struts 106 may cover the sidewalls SW112 of two adjacent stacking structure 112 and the sidewalls SW122 of two isolation structure 122 connected to the two adjacent stacking structure 112. In some embodiments, in a cross section as indicated in FIG. 9B along a direction Z, the dielectric layers 114 conformally cover the sidewalls SW112 of the stacking structures 112 and the top surface of the underlying structure 102 being exposed by the cell regions CR.

In some embodiments, the dielectric layers 114 are data storage layers (or films) formed of an acceptable ferroelectric material for storing digital values, such as hafnium zirconium oxide (HZO); zirconium oxide (ZrO); hafnium oxide (HfO) doped with lanthanum (La), silicon (Si), aluminum (Al), or the like; undoped hafnium oxide (HfO); or the like. Alternatively, the dielectric layers 114 may be charge trap layers (or films). The charge trap layers may include oxide-nitride-oxide (ONO) layers. In some embodiments, a method for forming the dielectric layers 114 includes globally forming a dielectric layer to conformally cover the structure as shown in FIG. 8A by a deposition process (e.g., CVD, ALD, physical vapor deposition (PVD), or the like) or an epitaxial process. Subsequently, portions of the dielectric layer above the illustrated top surfaces of the stacking structures 112 may be removed by, for example, a polishing process (e.g., a grinding process and/or a CMP process), an etching process or a combination thereof. The remained portions of the dielectric layer form the dielectric layers 114. In some embodiments, the dielectric layers 114 are individually referred to as memory layers (or films). On the other hands, the dielectric layers 114 may act as the gate dielectric layers of the transistors. The material of the dielectric layers 114 is different from the material of the struts 106, in the disclosure.

Semiconductor layers 116 are formed on the dielectric layers 114, in accordance with step S116 of FIG. 2. The semiconductor layers 116 may be formed on inner surfaces S5 of the dielectric layers 114, respectively. As similar to the dielectric layers 114, the semiconductor layers 116 are respectively formed in one of the cell regions CR, and are ensured to be separated from one another. Also, the semiconductor layers 116 may respectively have an annular top view shape. For example, the top view of each semiconductor layer 116 may appear as a substantially rectangular annulus. In some embodiments, the semiconductor layers 116 conformally cover the sidewalls SW112 of the stacking structures 112, as shown in FIG. 9B. Furthermore, in some embodiments, the semiconductor layers 116 span on the sidewalls SW112 of the stacking structures 112, but may not laterally span on the top surfaces of the underlying structure 102 (as shown in FIG. 9A and FIG. 9B). In these embodiments, some portions of the dielectric layers 114 lying on the top surfaces of the underlying structure 102 may not be covered by the semiconductor layers 116. In addition, each semiconductor layer 116 can be regarded as being discontinuous at its bottommost region, and the subsequently formed conductive pillars (e.g., later-formed conductive pillars 118 to be described with reference to FIGS. 10A-10C) in each cell region CR can be prevented from being electrically connected with each other through an underlying path, which may be barely controlled by a gate voltage applied to the conductive layers 110. In the disclosure, the semiconductor layers 116 may be referred to as channel layers/regions of the transistors.

In some embodiments, the semiconductor layers 116 are formed of an acceptable semiconductor material for functioning as the channel regions of the transistors. In some embodiments, the acceptable semiconductor material is a metal oxide material, such as an indium-based oxide material (e.g., indium gallium zinc oxide (IGZO), indium tin oxide (ITO), indium gallium zinc tin oxide (IGZTO), zinc oxide (ZnO)), polysilicon, amorphous silicon, or the like. In addition, in some embodiments, a method for forming the semiconductor layers 116 includes globally forming a semiconductor layer to conformally cover the dielectric layers 114, the underlying structure 102, the struts 106, the stacking structures 112 and the isolation structures 122 by a deposition process (e.g., CVD, ALD or PVD). Subsequently, portions of the semiconductor layer above the top surfaces of the stacking structures 112 as well as portions of the semiconductor layer lying on the underlying structure 102 may be removed by, for example, etching. The remained portions of the semiconductor layer form the semiconductor layers 116. The etching may be any acceptable etch process, such as RIE, NBE, the like, or a combination thereof. The etching may be anisotropic.

Thereafter, conductive structures 118m are formed to fill up the cell regions CR, in accordance with step S118a of FIG. 2. As shown in FIG. 9A through FIG. 9C, for example, the conductive structures 118m respectively stand in one of the cell regions CR, and are laterally surrounded by the semiconductor layers 116 and the dielectric layers 114. The conductive structures 118m may be continuously formed on inner surfaces S6 of the semiconductor layers 116, respectively. For example, the semiconductor layer 116 are respectively sandwiched between the dielectric layers 114 and the conductive structures 118m. In those embodiments where the semiconductor layers 116 do not laterally span on the top surfaces of the underlying structure 102, the conductive structures 118m may stand on the bottommost portions of the dielectric layers 114. The conductive structures 118m are formed of a conductive material. Acceptable conductive materials include metals such as tungsten, cobalt, aluminum, nickel, copper, silver, gold, alloys thereof, or the like.

A method for forming the conductive structures 118m includes filling up the cell regions CR with the conductive material by a deposition process such as ALD or CVD, an acceptable plating technique such as electroplating or electroless plating, or the like. Subsequently, a planarization process may be performed to remove portions of the conductive material above the top surfaces of the stacking structures 112, and the planarization process may include a grinding process, a CMP process, an etching process (e.g. etch-back) or a combination thereof. The remained portions of the conductive material form the conductive structures 118m. In some embodiments, the conductive structures 118m are made of tungsten. Additional glue layers may be formed between the conductive structures 118m and the semiconductor layers 116; similar to the conductive layers 110, the use of glue layers depends on the conductive material of the conductive structures 118m.

Figure 10A:
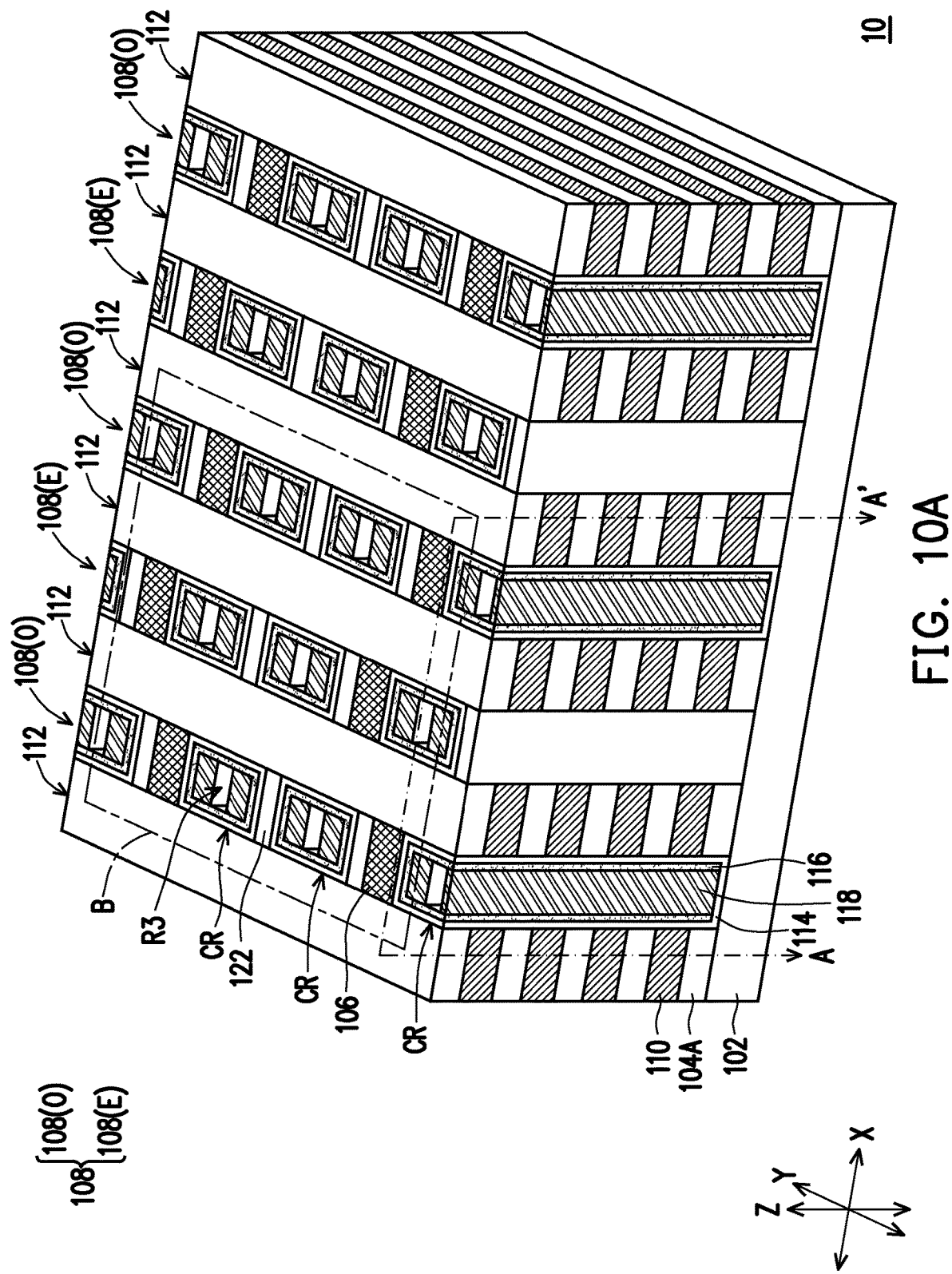
Figure 10B:
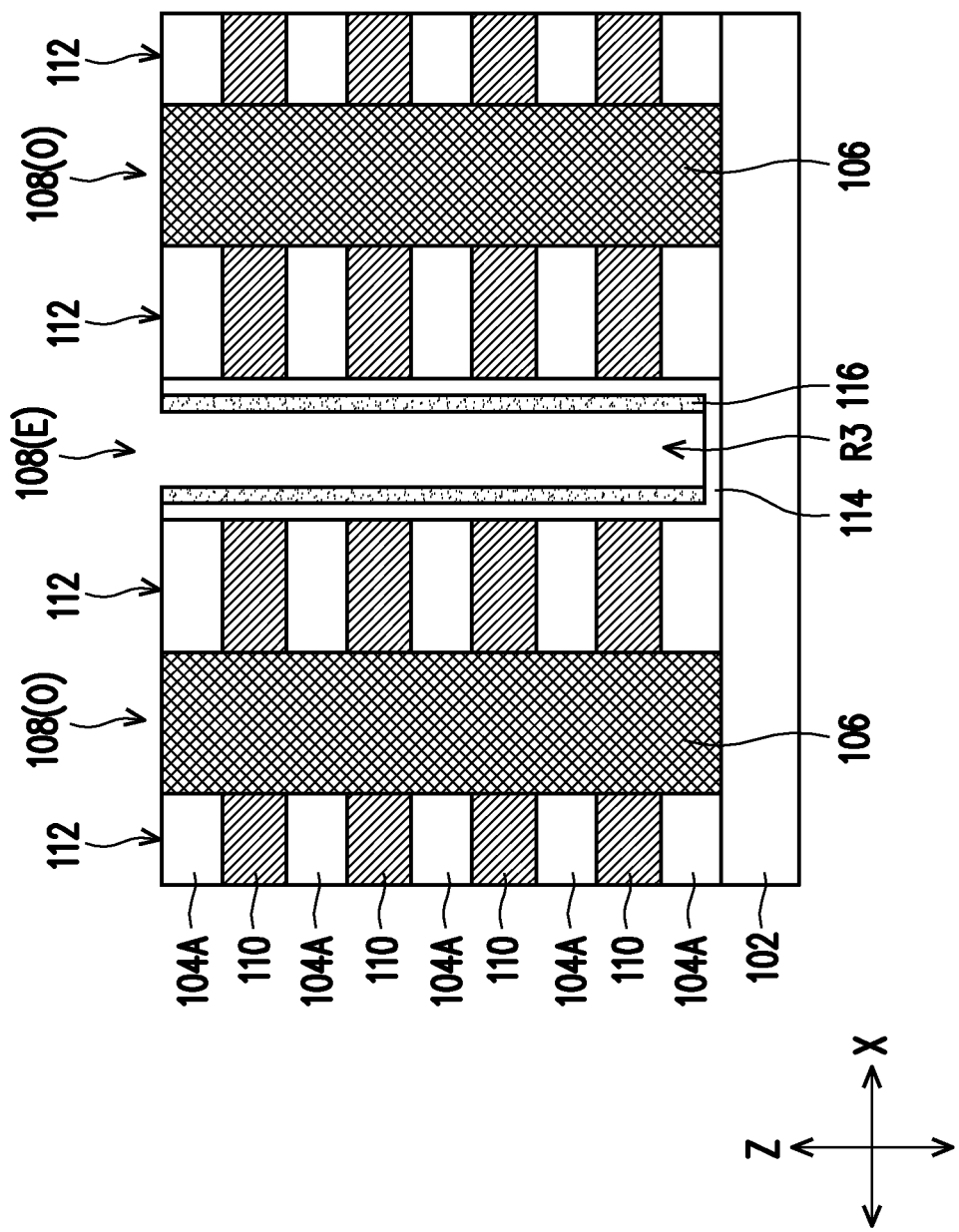
Figure 10C:
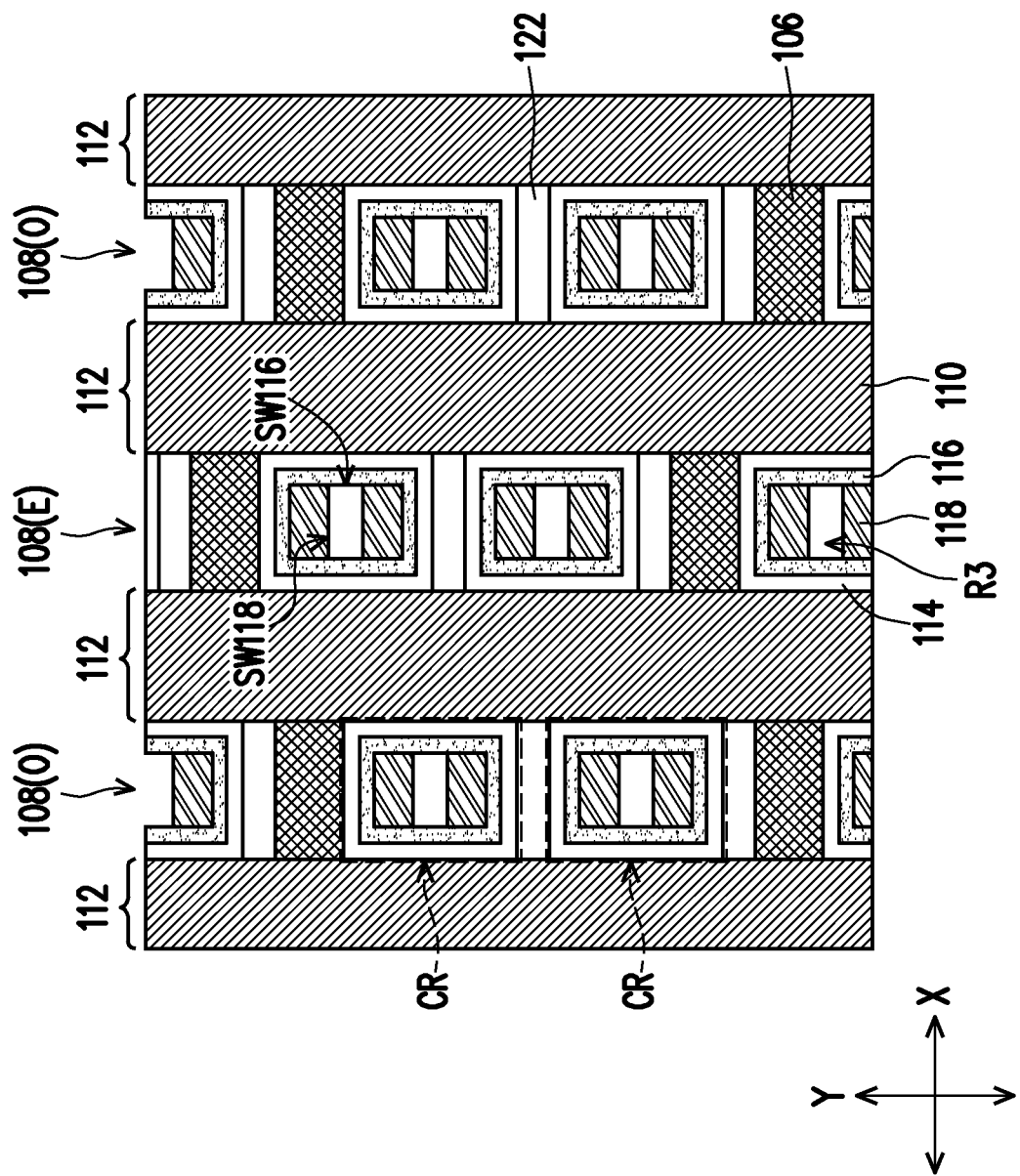

Referring to FIG. 10A through FIG. 10C, in some embodiments, portions of the conductive structures 118m are removed to form conductive pillars 118 within the cell regions CR, in accordance with step S120a of FIG. 2. For example, the conductive structures 118m within the cell regions CR are partially removed to form a plurality of recesses R3, where non-removed conductive structures 118m in each of the cell regions CR form a pair of the conductive pillars 118 separating from one another by one recess R3. The recesses R3 may penetrate through the conductive pillars 118 to partially expose top surfaces of the bottommost portions of the dielectric layers 114, sidewalls SW116 of the semiconductor layers 116 and sidewalls SW118 of the conductive pillars 118, as shown in FIG. 10B and FIG. 10C.

A method for forming the recesses R3 may include, but not limited to, patterning the conductive structures 118m by using a photolithography process and an etching process to partially remove the conductive structure 118m to form multiple pairs of the conductive pillars 118. The etching may be any acceptable etch process, such as RIE, NBE, the like, or a combination thereof. The etching may be anisotropic. In the disclosure, the conductive pillars 118 may be referred to as source/drain regions of the transistors. The conductive pillars 118 may be conductive columns formed in pairs, with each semiconductor layer 116 contacting a corresponding pair of the conductive pillars 118 in each cell region CR. Up to here, the transistors formed in the trenches 108 of the three-dimensional memory device 10 are manufactured.

Each transistor at least includes a pair of conductive pillars 118 (acting as the source/drain regions), a conductive layer 110 (acting as the gate), and the regions of the semiconductor layer 116 (acting as the channel region) and the dielectric layer 114 (acting as the gate dielectrics) intersecting the conductive layer 110 and between the pair of the conductive pillars 118. In some embodiments, the transistors laterally located to each other are physically separated from one another by the isolation structures 122 and/or the struts 106, thereby preventing communicating (e.g., cross-talking) among the transistors laterally located aside thereto. That is, the isolation structures 122 each electrically isolate and physically isolate the laterally adjacent cell regions CR from each other. Owing to the isolation structures 122, the cross-talking among the neighboring transistors located horizontally are greatly suppressed, thereby the reliability of electrical performance of the transistors is further ensured. In addition, owing to the dielectric layers 104A, the cross-talking among the neighboring transistors located vertically are suppressed, thereby the reliability of electrical performance of the transistors is also ensured.

Referring to FIG. 11A through FIG. 11C, in some embodiments, isolation structures 120 are respectively formed in the cell regions CR, in accordance with step S122a of FIG. 2. For example, the isolation structures 120 each stand in one of the recesses R3, and each are surrounded by paired conductive pillars 118 and a respective one of the semiconductor layers 116 exposed by the paired conductive pillars 118. The isolation structures 120 are continuously formed on sidewalls S7 of the recesses R3 to cover (e.g., in contact with) the sidewalls SW118 of the conductive pillars 118 and the sidewalls SW116 of the semiconductor layers 116, and further extended over the top surfaces of the bottommost portions of the dielectric layers 114 exposed by the recesses R3. That is, the isolation structures 120 stand on (e.g., in contact with) the top surfaces of the bottommost portions of the dielectric layers 114. The sidewalls S7 of the recesses R3 may also referred to as sidewalls of the isolation structures 120.

Figure 12A:
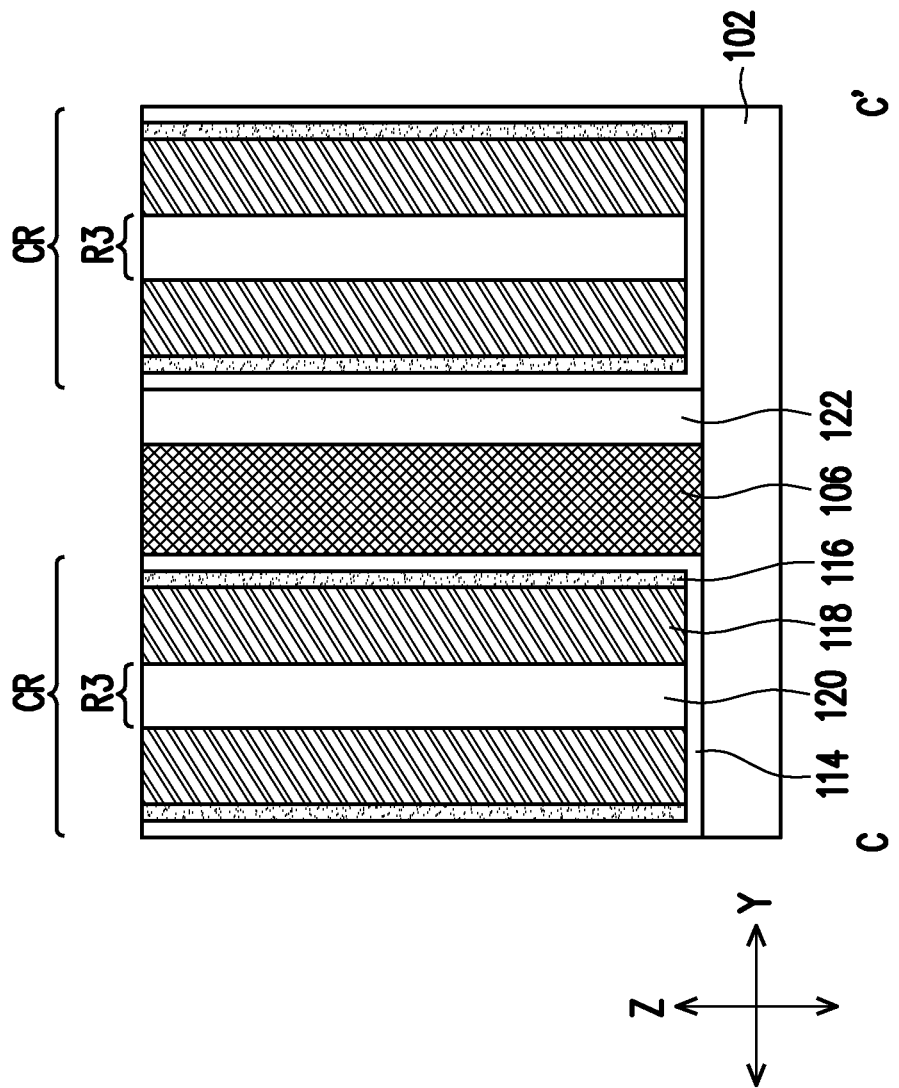
Figure 12B:
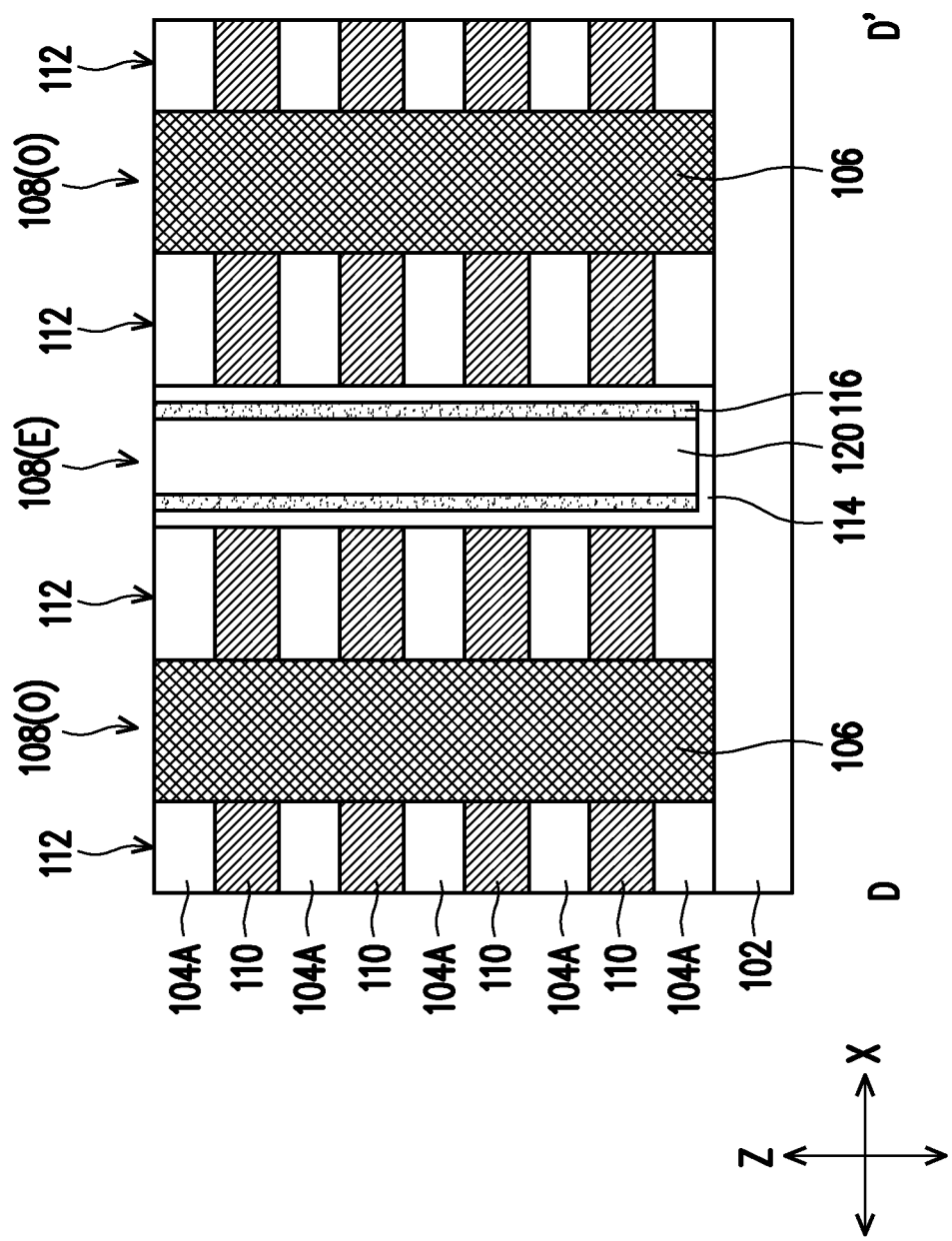
Figure 12D:
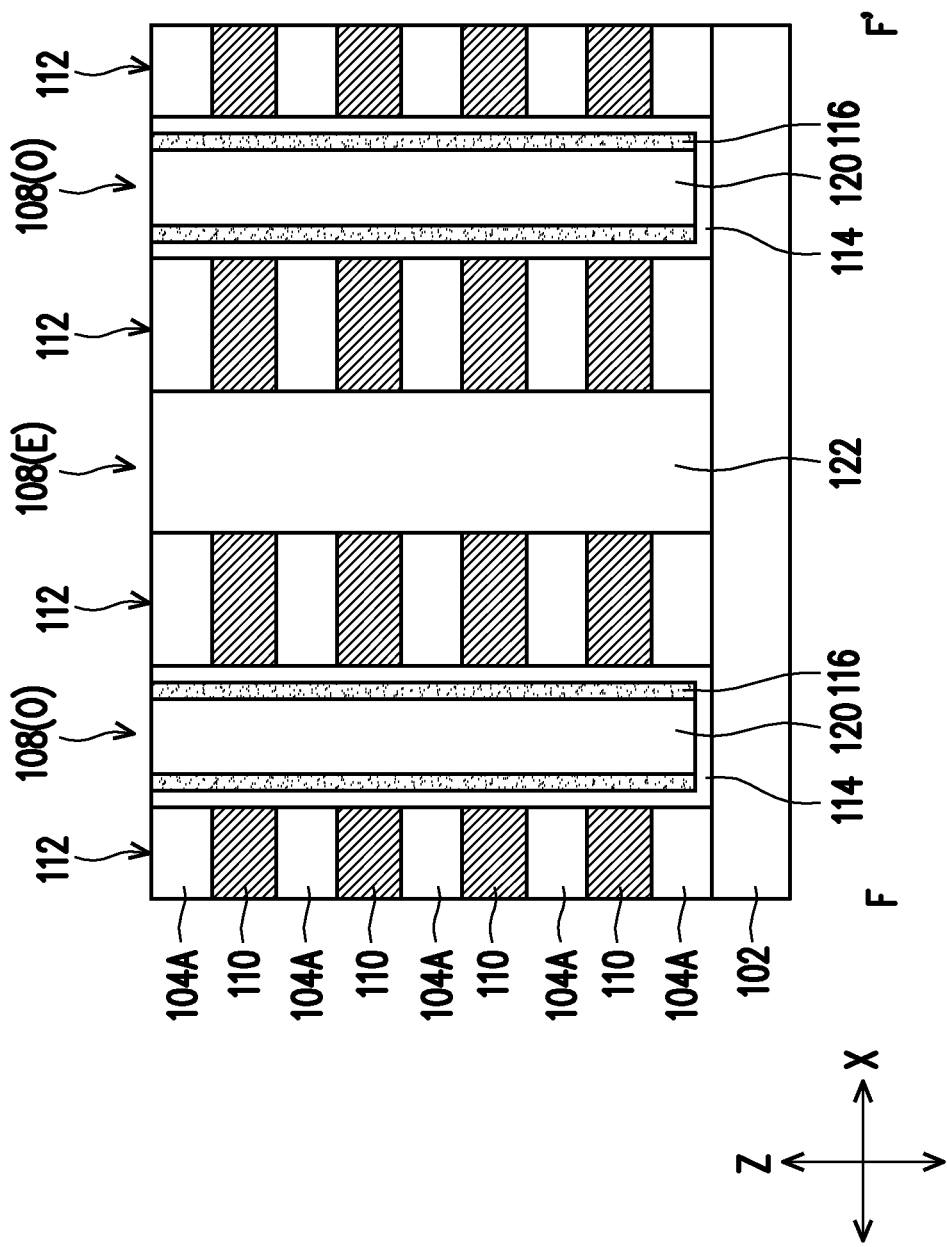

The isolation structures 120 may be sandwiched between the conductive pillars 118 and between two opposite portions of the semiconductor layers 116, as shown in FIG. 11C. For example, along the direction X, the isolation structures 120 are sandwiched between two opposite portions of the semiconductor layers 116, as shown in FIG. 12B and FIG. 12D. For example, along the direction Y, the isolation structures 120 are sandwiched between the paired conductive pillars 118, as shown in FIG. 12A and FIG. 12C. In other words, each isolation structure 120 is disposed between the source/drain regions (e.g., a corresponding pair of conductive pillars 118) of one transistor. That is, for one cell region/transistor, the conductive pillars 118 being paired are disposed at opposing sides of a corresponding isolation structure 120. Thus, each isolation structure 120 physically and electrically separates adjacent conductive pillars 118 in one transistor. In each cell region CR, one isolation structure 120 electrically isolates and physically separates the pair of the conductive pillars 118 from each other. Owing to the isolation structures 120, the pair of the conductive pillars 118 of each cell regions CR are separated apart from each other (which prevents an electrical short therebetween), thereby the reliability of electrical performance of the transistors is ensured.

In some embodiments, the isolation structures 120 are formed of an acceptable dielectric material. The acceptable dielectric material may include oxides such as silicon oxide; nitrides such as silicon nitride; carbides such as silicon carbide; the like; or combinations thereof such as silicon oxynitride, silicon oxycarbide, silicon carbonitride, or the like. Alternatively, the acceptable dielectric material may include a low-K (LK) dielectric material with a dielectric constant lower than 3.9 or an extreme low-k (ELK) dielectric material with a dielectric constant lower than 2.6. Examples of low-k dielectric materials include Xerogel, Aerogel, amorphous fluorinated carbon, Parylene, a polymer based material such as BCB (bis-benzocyclobutenes), a silicon dioxide based material such as hydrogen silsesquioxane (HSQ) or fluorinated silicon oxide (SiOF), and/or a combination thereof. A method for forming the isolation structures 120 may include, but not limited to, forming the dielectric material to fill up the recesses R3 by CVD (such as PECVD or FCVD), PVD, spin coating or the like. Subsequently, portions of the dielectric material above the illustrated top surfaces of the stacking structures 112 may be removed by, for example, a polishing process (e.g., a grinding process and/or a CMP process), an etching process or a combination thereof. The remained portions of the dielectric material form the isolation structures 120.

In such embodiments, the materials of the isolation structure 122 and the isolation structure 120 are the same. However, the disclosure is not limited thereto; alternatively, the material of the isolation structure 122 may be different from the material of the isolation structure 120. Up to here, the three-dimensional memory device 10 is manufactured. As shown in the three-dimensional memory device 10 of FIG. 11C, for example, a portion of the conductive layer 110 in each stacking structure 112 and closest portions of the dielectric layer 114, the semiconductor layer 116 and the conductive pillars 118 in a cell region CR laterally adjacent to this portion of the conductive layer 110 constitute the transistor, e.g. a field effect transistor (FET), which is functioned as a memory cell MC included in the three-dimensional memory device 10. In those embodiments where the dielectric layers 114 are formed of a ferroelectric material, dipole moments in opposite directions can be stored in the dielectric layer 114. Accordingly, the FET has different threshold voltages in corresponding to the dipole moments, thus the FET can be identified as having different logic states. In these embodiments, the memory cell MC is a ferroelectric FET. On the other hand, in those embodiments where the dielectric layer 114 is a charge trap layer, charges may be stored in the dielectric layer 114, thus the FET may have different threshold voltages depending on the amount of charge stored in the dielectric layer 114. Hence, the FET can be identified as having different logic states as well. In these embodiments, the memory cell MC may be referred as a charge trap flash (CTF) transistor.

The three-dimensional memory device 10 may include multiple memory cells MC arranged in a form of array laterally and vertically. For example, the conductive layers 110 stacked along a vertical direction (e.g., the direction Z) in each stacking structure 112 as well as portions of the dielectric layer 114, the semiconductor layer 116 and the pair of conductive pillars 118 in a cell region CR aside these conductive layers 110 form a stack of memory cells MC. In addition, multiple stacks of the memory cells MC may be arranged along an extending direction (e.g., the direction Y, may be referred to as a trench direction) of the trenches 108, where the trenches 108 are arranged side-by-side (e.g., in parallel) along a lateral direction (e.g., the direction X). In some embodiments, the dielectric layer 114, the semiconductor layer 116 and a pair of conductive pillars 118 in the same cell region CR are shared by adjacent stacks of memory cells MC including the conductive layers 110 at opposite sides of this cell region CR, and conductive channels of these memory cells MC are formed in different sections of the semiconductor layer 116. In the disclosure, the struts 106 are formed before the formation of the trenches 108, the twisting or collapsing of the features (e.g., linear portions of the multilayer stack 104) is avoided. Due to the struts 106 function as the supporting pillars of the three-dimensional memory device during the manufacturing, a yield of the memory cells MC is increased, thereby improving the device performance of the three-dimensional memory device 10.

Figure 13:
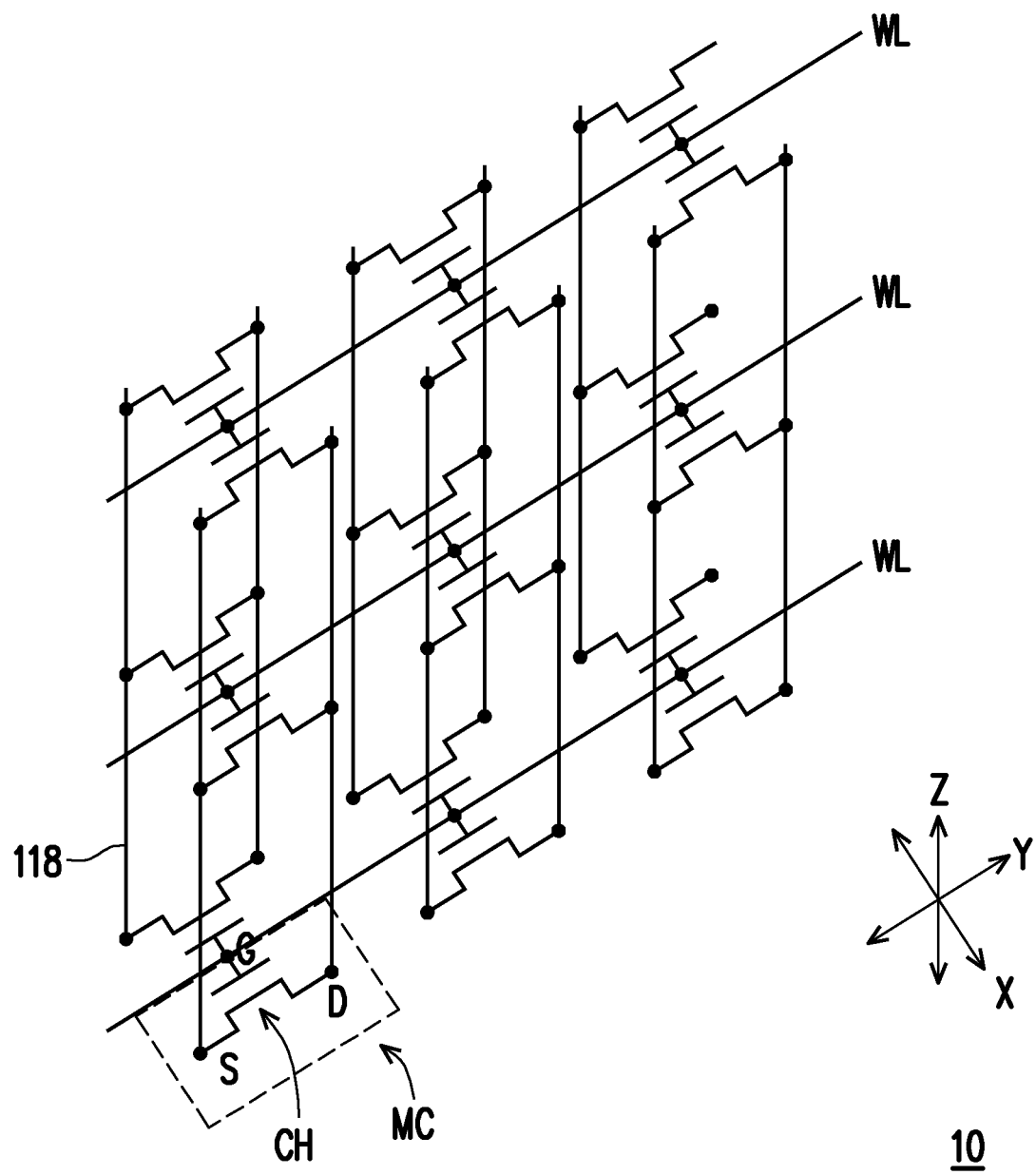
FIG. 13 is an equivalent circuit diagram of a portion of a three-dimensional memory device in accordance with some embodiments of the disclosure.

FIG. 13 is an equivalent circuit diagram of a portion of a three-dimensional memory device 10 shown in FIG. 11A.

Referring to FIG. 11A and FIG. 13, the conductive layers 110 in each stacking structure 112 shown in FIG. 11A may be functioned as word lines WL as shown in FIG. 13. The word lines WL are arranged along the vertical direction (e.g., the direction Z). Each word line WL connects gate terminals G of two laterally adjacent columns of the memory cells MC (e.g., on the X-Y plane). In addition, each pair of conductive pillars 118 in one of the cell regions CR shown in FIG. 11A separately connect to source and drain terminals S, D of the memory cells MC stacked along the vertical direction (e.g., the direction Z) as shown in FIG. 13. As shown in FIG. 13, the gate terminals G of each stack of the memory cells MC are respectively connected to one of the word lines WL. In addition, the source terminals S of each stack of the memory cells MC are connected together by one of the conductive pillars 118, and the drain terminals D of each stack of the memory cells MC are connected together by another one of the conductive pillars 118. In other words, channels CH between the source and drain terminals S, D of each stack of the memory cells MC are connected in parallel. Accordingly, each stack of the memory cells MC may be regarded as being connected by a NOR-flash configuration, and the three-dimensional memory device 10 may be referred as a three-dimensional NOR memory device.

Figure 14:
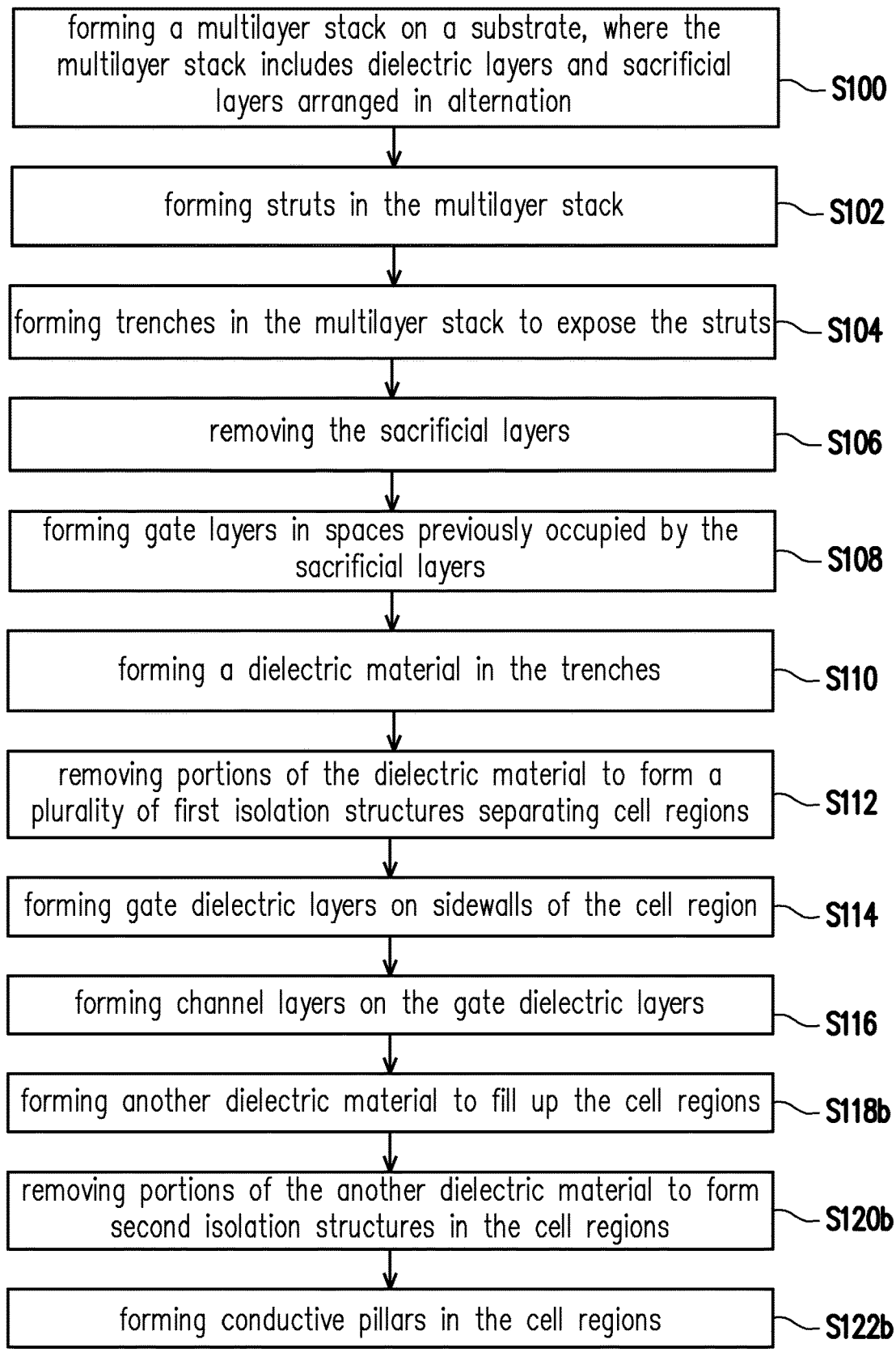
FIG. 14 is a flow diagram illustrating a method for manufacturing a three-dimensional memory device in accordance with other embodiments of the disclosure.

The disclosure is not limited; alternatively, a method for manufacturing a three-dimensional memory device of FIG. 14 may be used to replace the method of FIG. 2. FIG. 14 is a flow diagram illustrating a method for manufacturing the three-dimensional memory device 10 in accordance with other embodiments of the disclosure. FIG. 15A through FIG. 16A are schematic three-dimensional views illustrating structures at various stages during the manufacturing method of the three-dimensional memory device 10 as shown in FIG. 14. FIG. 15B through FIG. 16B are schematic cross-sectional views along lines A-A' shown in FIG. 15A through FIG. 16A, respectively. FIG. 15C through FIG. 16C are schematic enlarged plan views illustrating a portion of the three-dimensional memory device 10 indicated by dotted boxes B at process steps described with reference to FIG. 15A through FIG. 16A, respectively. In some embodiments, the method of FIG. 14 is substantially similar to the method of FIG. 2, the difference is that, in the method of FIG. 14, steps S118*b*, S120*b* and S122*b* are adopted to substitute the steps S118*a*, S120*a* and S122*a* of FIG. 2.

Figure 15A:
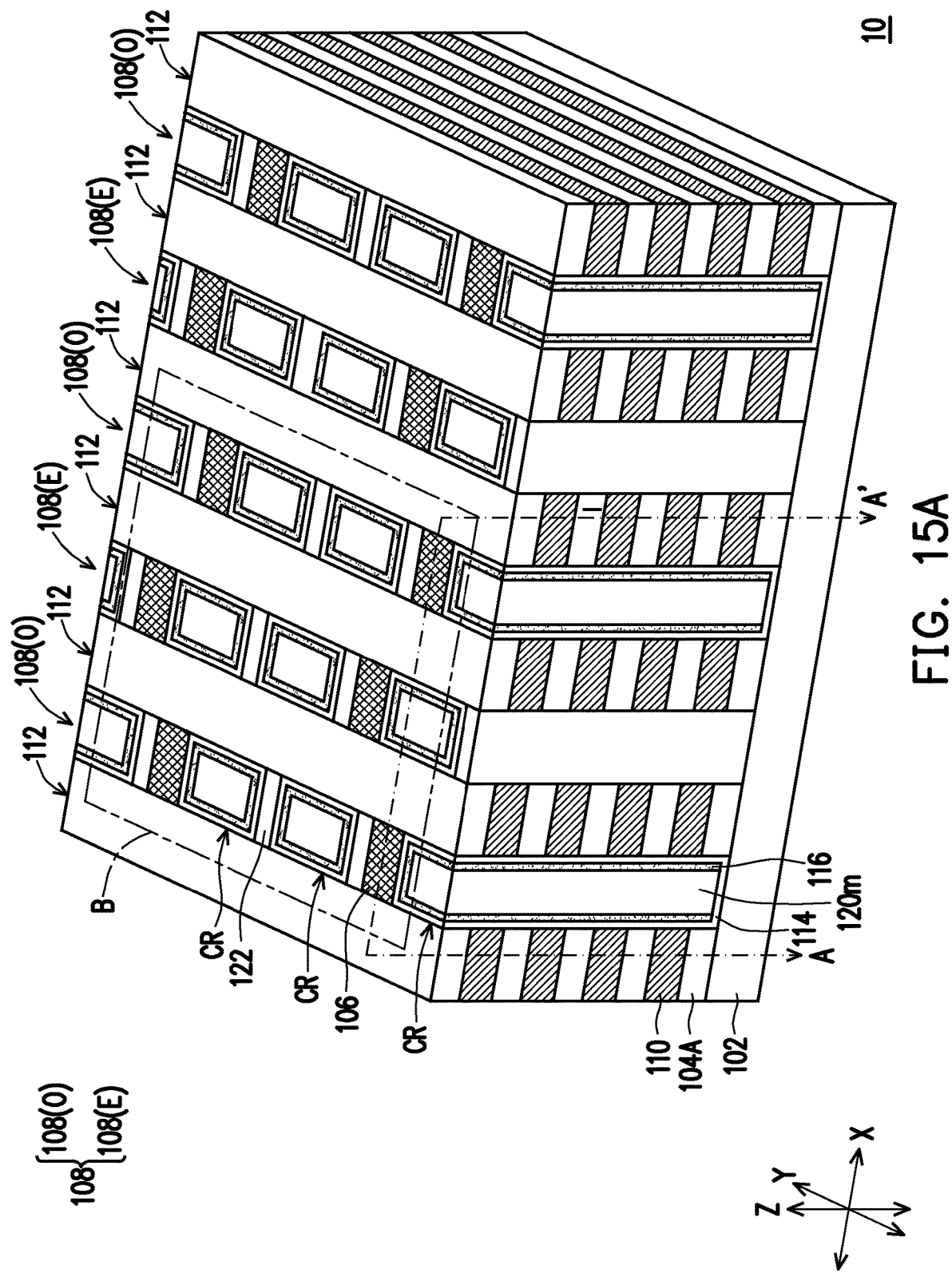
Figure 15B:
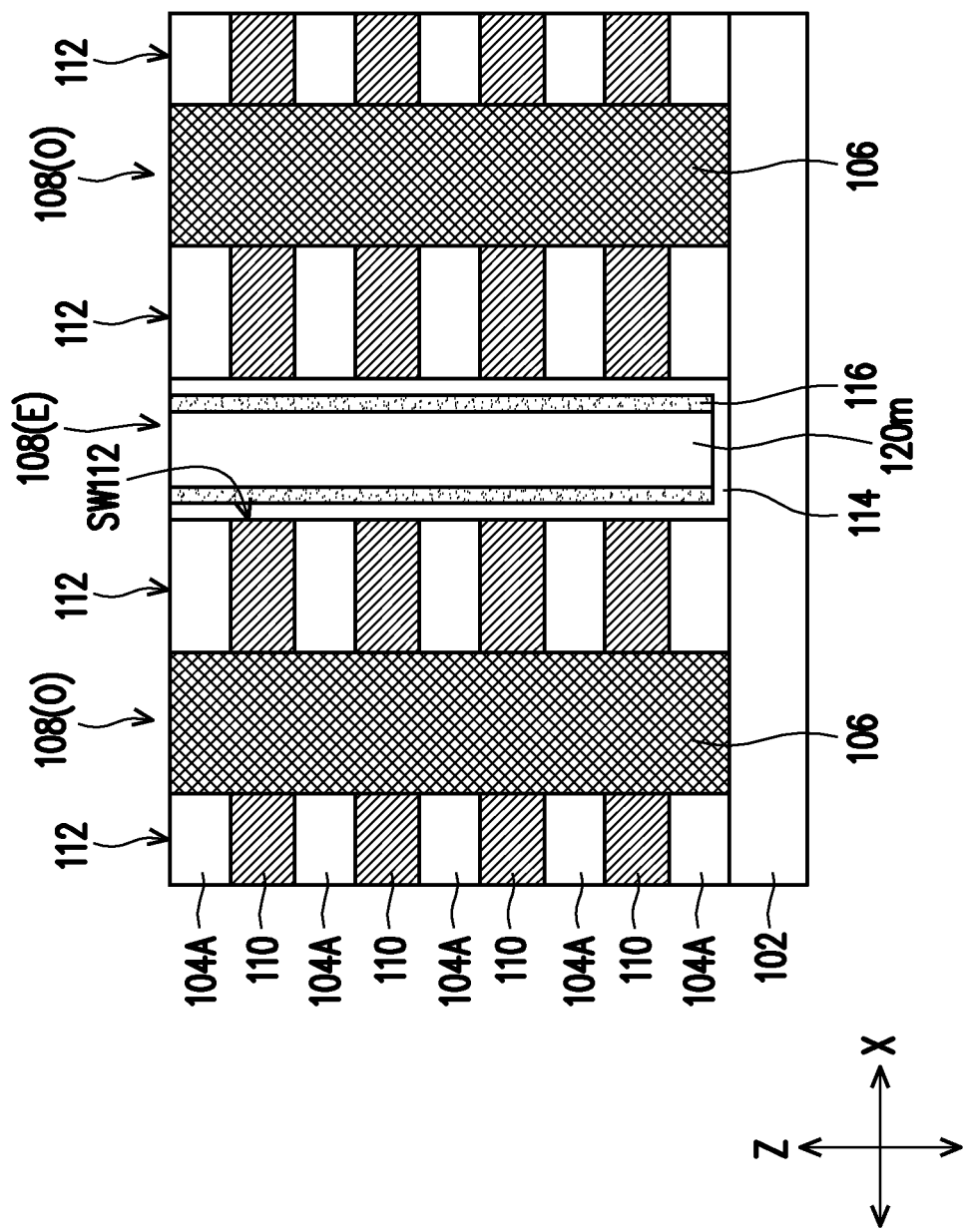
Figure 15C:
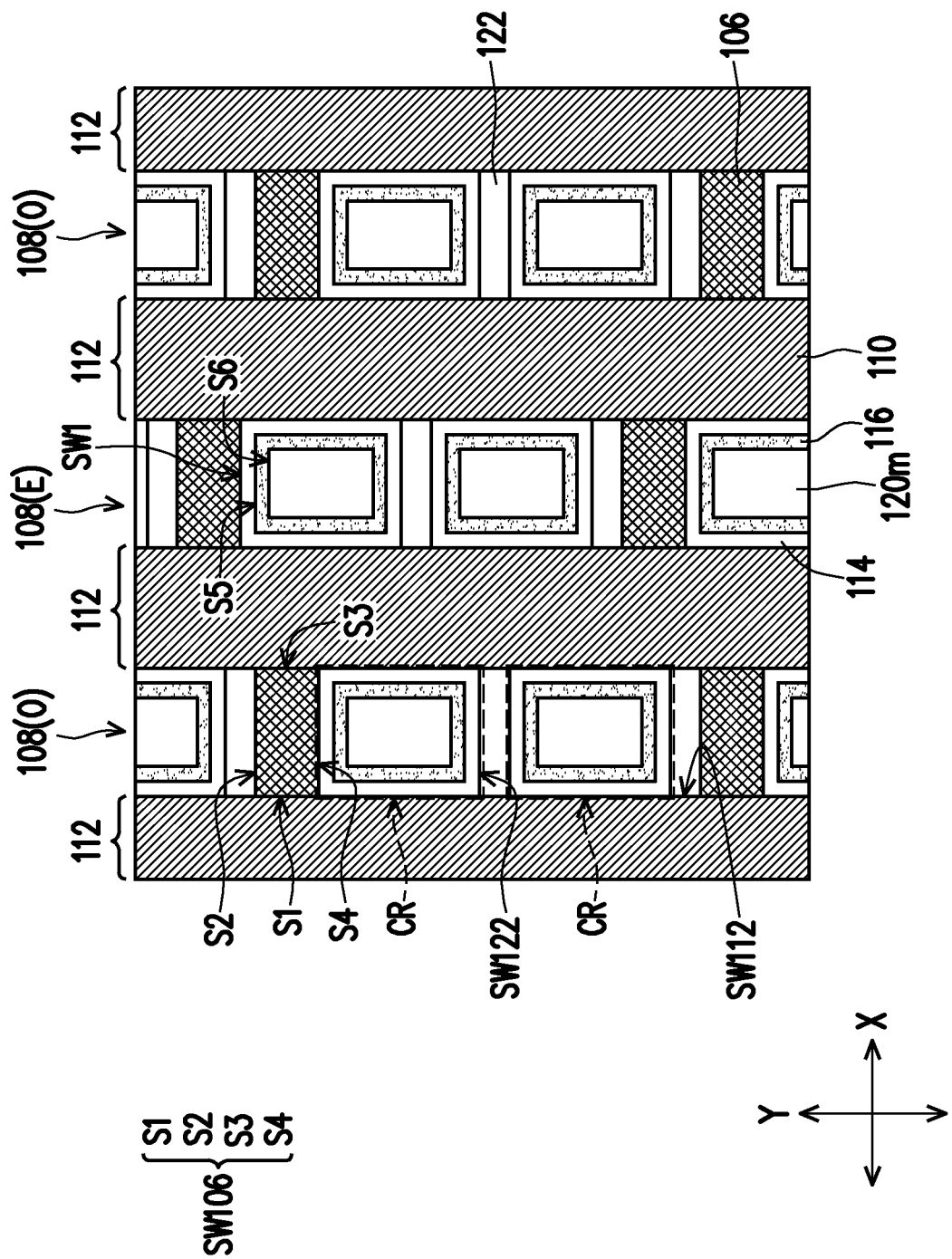

In some embodiments, step S118*b* of FIG. 14 is performed, where a dielectric material 120*m* is formed to fill up the cell regions CR, following the processing step S116 of FIG. 2 (as described with reference to FIG. 9A through FIG. 9C). As shown in FIG. 15A through FIG. 15C, for example, the dielectric material 120*m* respectively stand in one of the cell regions CR, and are laterally surrounded by the semiconductor layers 116 and the dielectric layers 114. The dielectric material 120*m* may be continuously formed on inner surfaces S6 of the semiconductor layers 116, respectively. For example, the semiconductor layer 116 are respectively sandwiched between the dielectric layers 114 and the dielectric material 120*m*. In those embodiments where the semiconductor layers 116 do not laterally span on the top surfaces of the underlying structure 102, the dielectric material 120*m* may stand on the bottommost portions of the dielectric layers 114. The forming method and material of the dielectric material 120*m* are substantially identical or similar to the forming method and material of the isolation structures 120 as described in FIG. 11A through FIG. 11C, and thus are not repeated herein for simplicity.

Figure 16A:
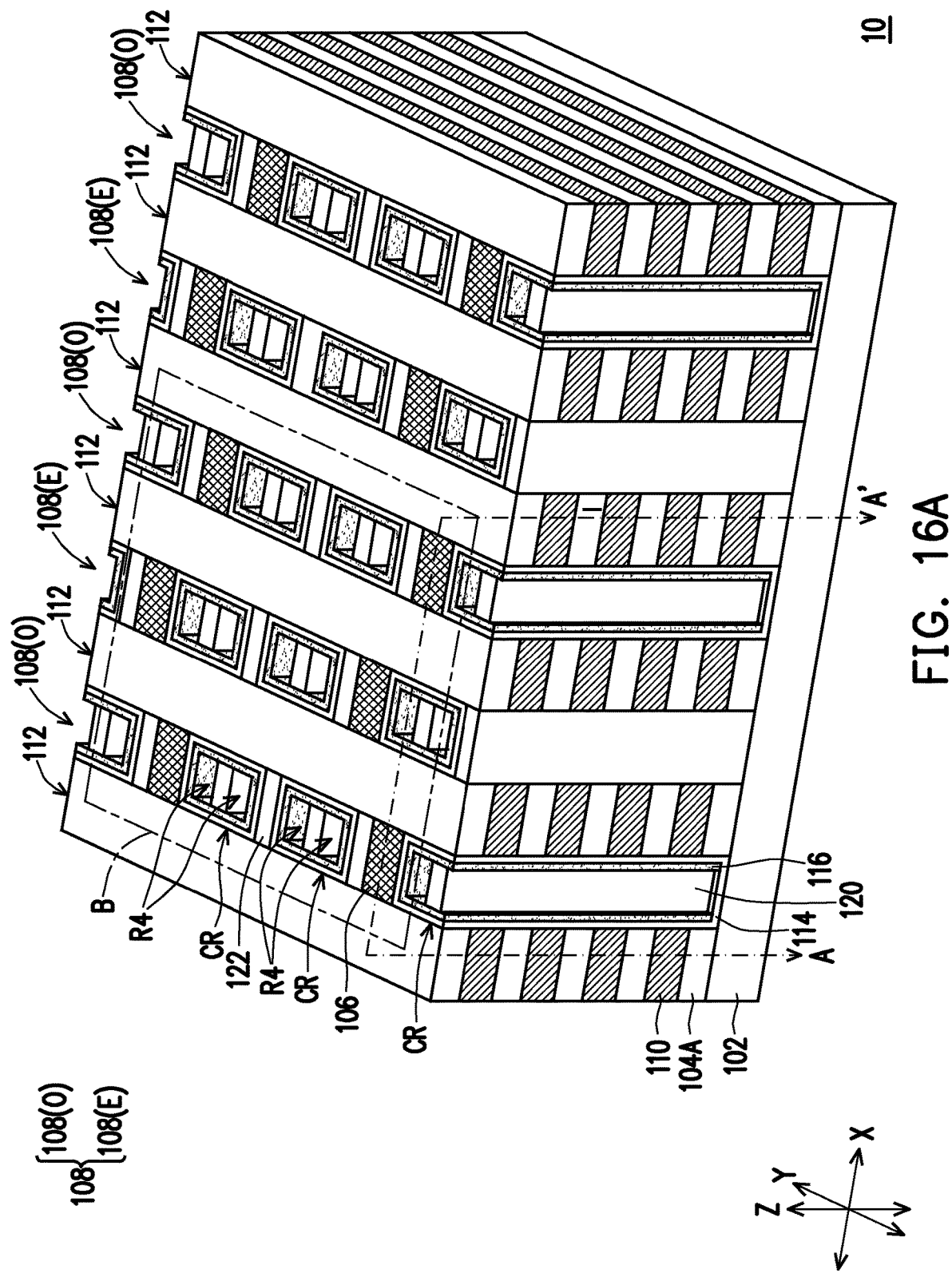
Figure 16B:
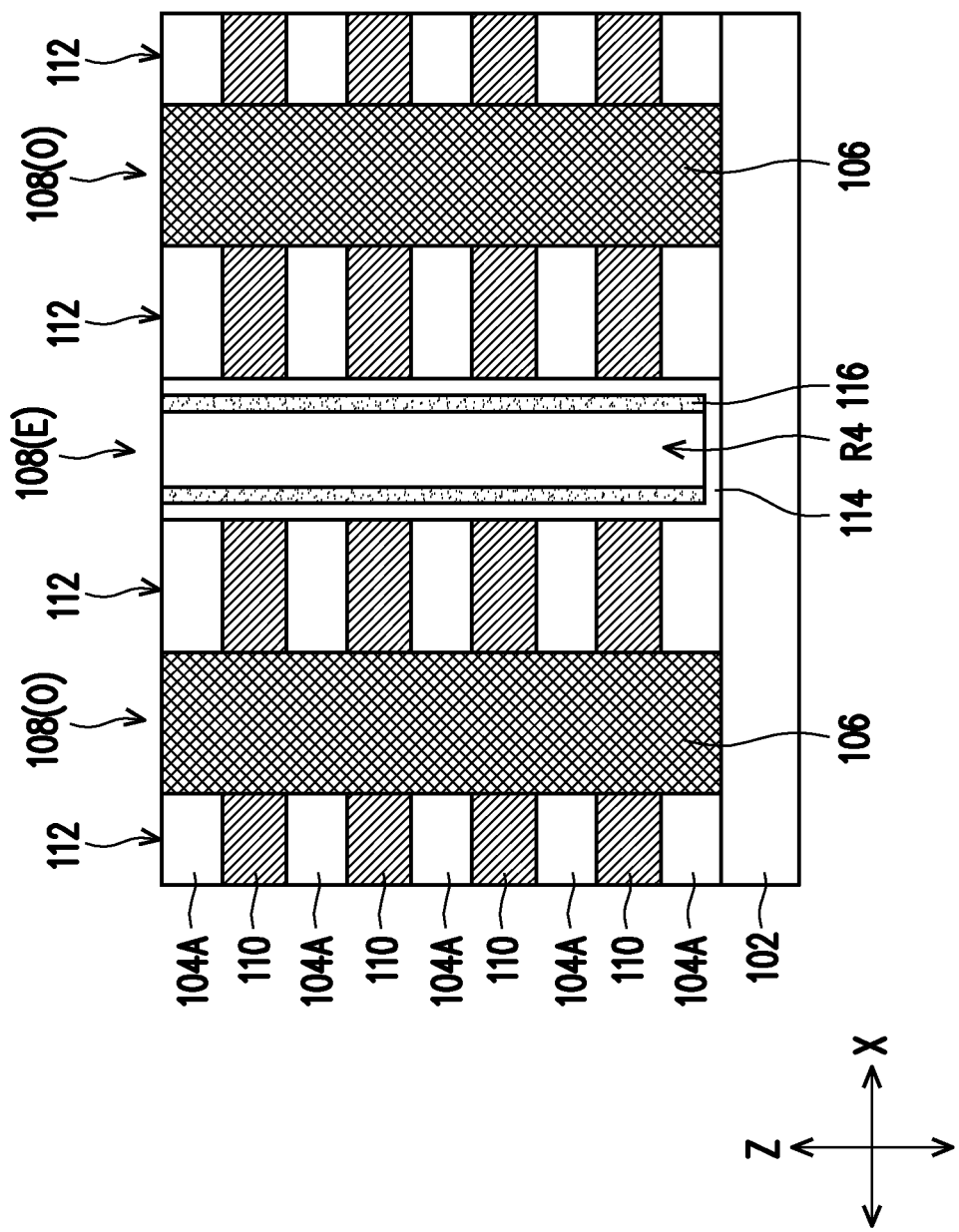
Figure 16C:
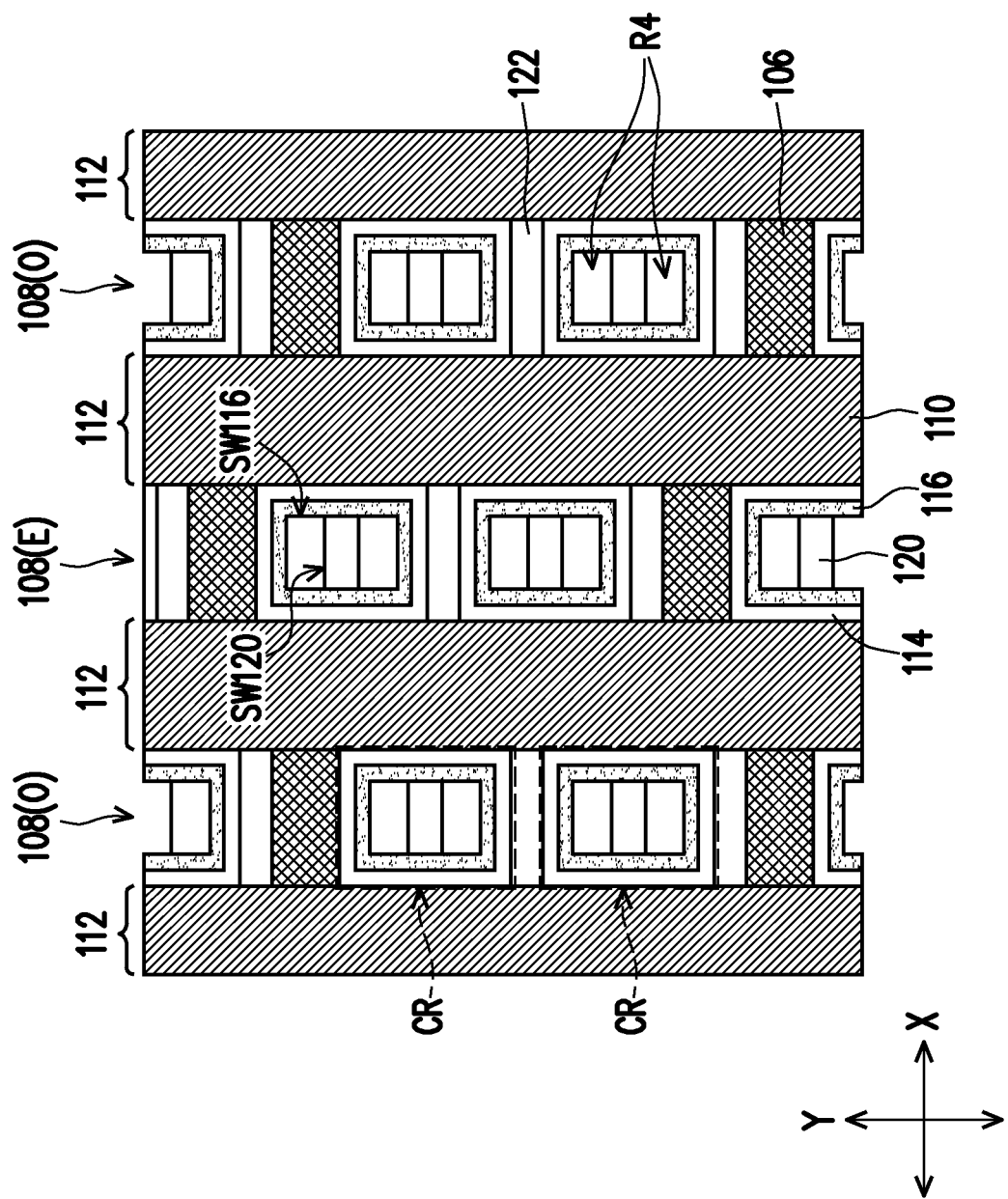

In some embodiments, step S120*b* of FIG. 14 is performed, where portions of the dielectric material 120*m* are removed to form the isolation structures 120 within the cell regions CR. As shown in FIG. 16A through FIG. 16C, for example, the dielectric material 120*m* within the cell regions CR are partially removed to form a plurality of recesses R4, where non-removed dielectric material 120*m* in each of the cell regions CR form the isolation structures 120, where the isolation structures 120 each are sandwiched by two of the recesses R4 in a respective one cell region CR along the direction Y. The recesses R4 may penetrate through the isolation structures 120 to partially expose top surfaces of the bottommost portions of the dielectric layers 114, sidewalls SW116 of the semiconductor layers 116 and sidewalls SW120 of the isolation structures 120, as shown in FIG. 16B and FIG. 16C. A method for forming the recesses R4 may include, but not limited to, patterning the dielectric material 120*m* by using a photolithography process and an etching process to partially remove the dielectric material 122*m*. The etching may be any acceptable etch process, such as RIE, NBE, the like, or a combination thereof. The etching may be anisotropic.

In some embodiments, step S122*b* of FIG. 14 is performed, where conductive pillars 118 are formed in the cell regions CR. After the formation of the conductive pillars 118, the three-dimensional memory device 10 depicted in FIG. 11A through FIG. 11C is manufactured. For example, the conductive pillars 118 each stand in one of the recesses R4, and each are surrounded by a respective one isolation structure 120 and a respective one of the semiconductor layers 116 enclosing the respective isolation structure 120, as referring to FIGS. 11A-11C in conjunction with FIGS. 16A-16C. The conductive pillars 118 are continuously formed on sidewalls of the recesses R4 to cover (e.g., in contact with) the sidewalls SW120 of the isolation structures 120 and the sidewalls SW116 of the semiconductor layers 116, and further extended over the top surfaces of the bottommost portions of the dielectric layers 114 exposed by the recesses R4. That is, the conductive pillars 118 stand on (e.g., in contact with) the top surfaces of the bottommost portions of the dielectric layers 114. The sidewalls of the recesses R4 may also referred to as sidewalls of the conductive pillars 118. The forming method and material of the conductive pillars 118 are substantially identical or similar to the forming method and material of the conductive material 118*m* as described in FIG. 9A through FIG. 9C, and thus are not repeated herein for simplicity. In the embodiments of which the three-dimensional memory device 10 manufactured by the method of FIG. 2 and/or the method of FIG. 14, at least three sides of each of the conductive pillars 118 are covered by a respective one of the semiconductor layers 116 and a respective one of the dielectric layers 114, and at least three sides of each of the semiconductor layers 116 are covered by a respective one of the dielectric layers 114.

Figure 17:
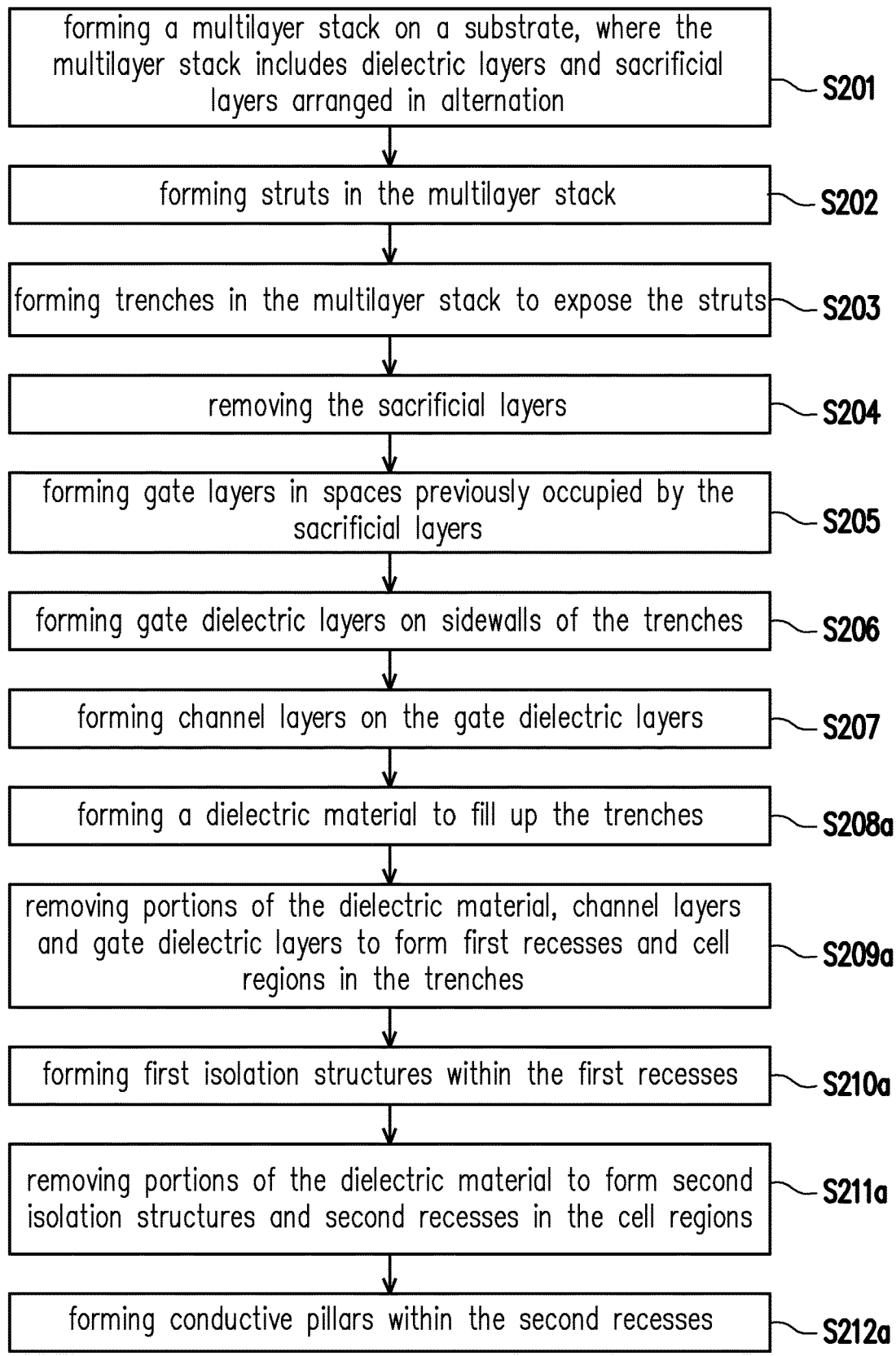
FIG. 17 is a flow diagram illustrating a method for manufacturing a three-dimensional memory device in accordance with other embodiments of the disclosure.

FIG. 17 is a flow diagram illustrating a method for manufacturing a three-dimensional memory device in accordance with other embodiments of the disclosure.

In one embodiment, the three-dimensional memory device 10 may be manufactured by a method of FIG. 17. It should be understood that additional processing may occur before, during, and after the illustrated actions of the method of FIG. 17 to complete formation of the three-dimensional memory device 10. The method of FIG. 17 includes at least steps S201-S207 and S208a-S212a. For example, the method shown in FIG. 17 begins with step S201, which forms a multilayer stack on a substrate, where the multilayer stack includes dielectric layers and sacrificial layers arranged in alternation; step S202, which forms struts in the multilayer stack; step S203, which forms trenches in the multilayer stack to expose the struts; step S204, which removes the sacrificial layers; step S205, which forms gate layers in spaces previously occupied by the sacrificial layers; step S206, which forms gate dielectric layers on sidewalls of the trenches; step S207, which forms channel layers on the gate dielectric layers; step S208a, which forms a dielectric material to fill up the trenches; step S209a, which removes portions of the dielectric material, channel layers and gate dielectric layers to form first recesses and cell regions in the trenches; step S210a, which forms first isolation structures within the first recesses; step S211a, which removes portions of the first dielectric material to form second isolation structures and second recesses in the cell regions; and step S212a, which forms conductive pillars within the second recesses. However, the disclosure is not limited thereto.

Figure 18:
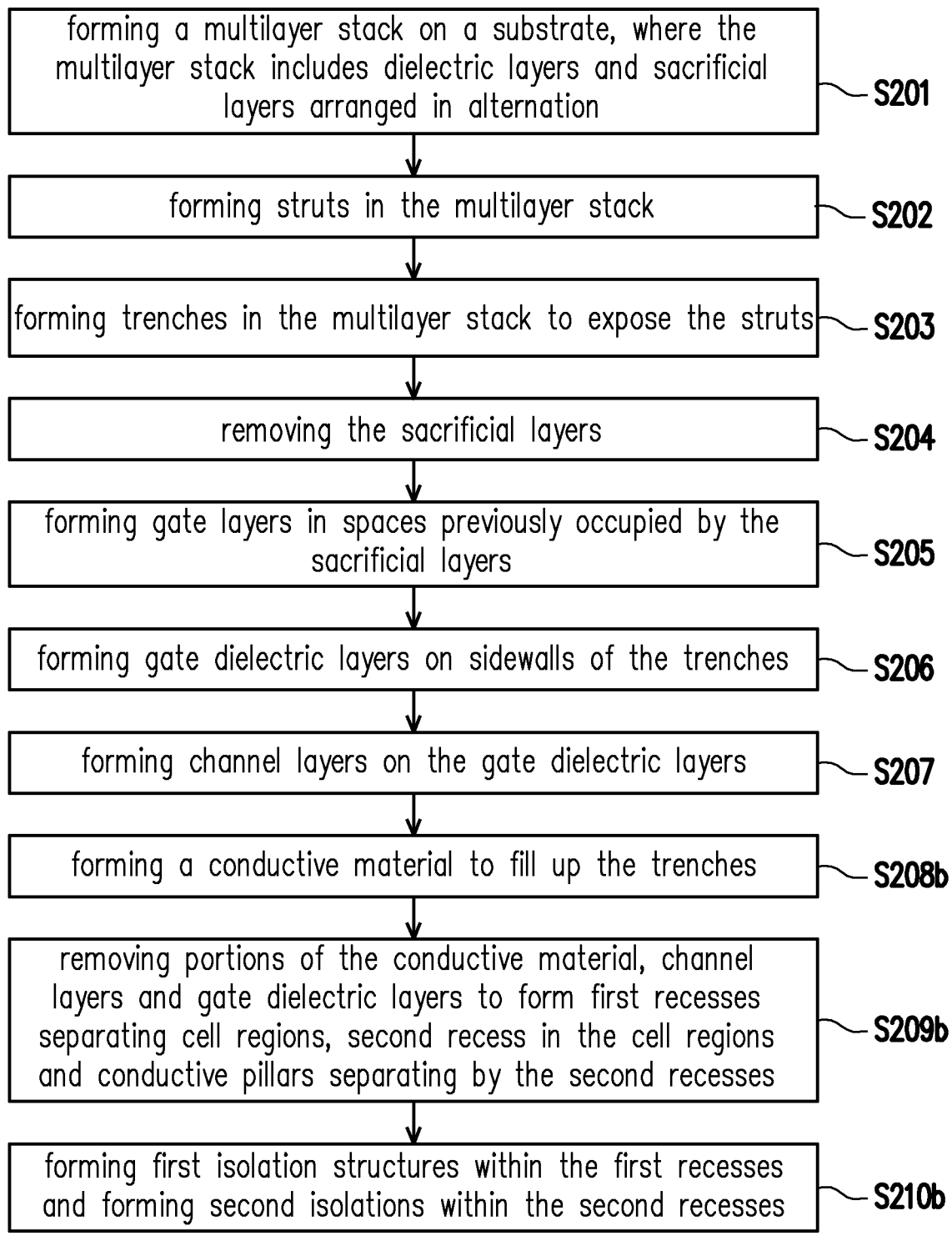
FIG. 18 is a flow diagram illustrating a method for manufacturing a three-dimensional memory device in accordance with other embodiments of the disclosure.

FIG. 18 is a flow diagram illustrating a method for manufacturing a three-dimensional memory device in accordance with other embodiments of the disclosure.

In an alternative embodiment, the three-dimensional memory device 10 may be manufactured by a method of FIG. 18. It should be understood that additional processing may occur before, during, and after the illustrated actions of the method of FIG. 18 to complete formation of the three-dimensional memory device 10. The method of FIG. 18 includes at least steps S201-S207 and S208b-S212b. For example, the method shown in FIG. 18 begins with step S201, which forms a multilayer stack on a substrate, where the multilayer stack includes dielectric layers and sacrificial layers arranged in alternation; step S202, which forms struts in the multilayer stack; step S203, which forms trenches in the multilayer stack to expose the struts; step S204, which removes the sacrificial layers; step S205, which forms gate layers in spaces previously occupied by the sacrificial layers; step S206, which forms gate dielectric layers on sidewalls of the trenches; step S207, which forms channel layers on the gate dielectric layers; step S208a, which forms a conductive material to fill up the trenches; step S209a, which removes portions of the conductive material, channel layers and gate dielectric layers to form first recesses separating cell regions, second recess in the cell regions and conductive pillars separating by the second recesses; and step S210a, which forms first isolation structures within the first recesses and forming second isolations within the second recesses.

In the embodiments of which the three-dimensional memory device manufactured by the method of FIG. 17 and/or the method of FIG. 18, at least two sides of each of the conductive pillars 118 are covered by a respective one of the semiconductor layers 116 and a respective one of the dielectric layers 114, and at least two sides of each of the semiconductor layers 116 are covered by a respective one of the dielectric layers 114.

Figure 19:
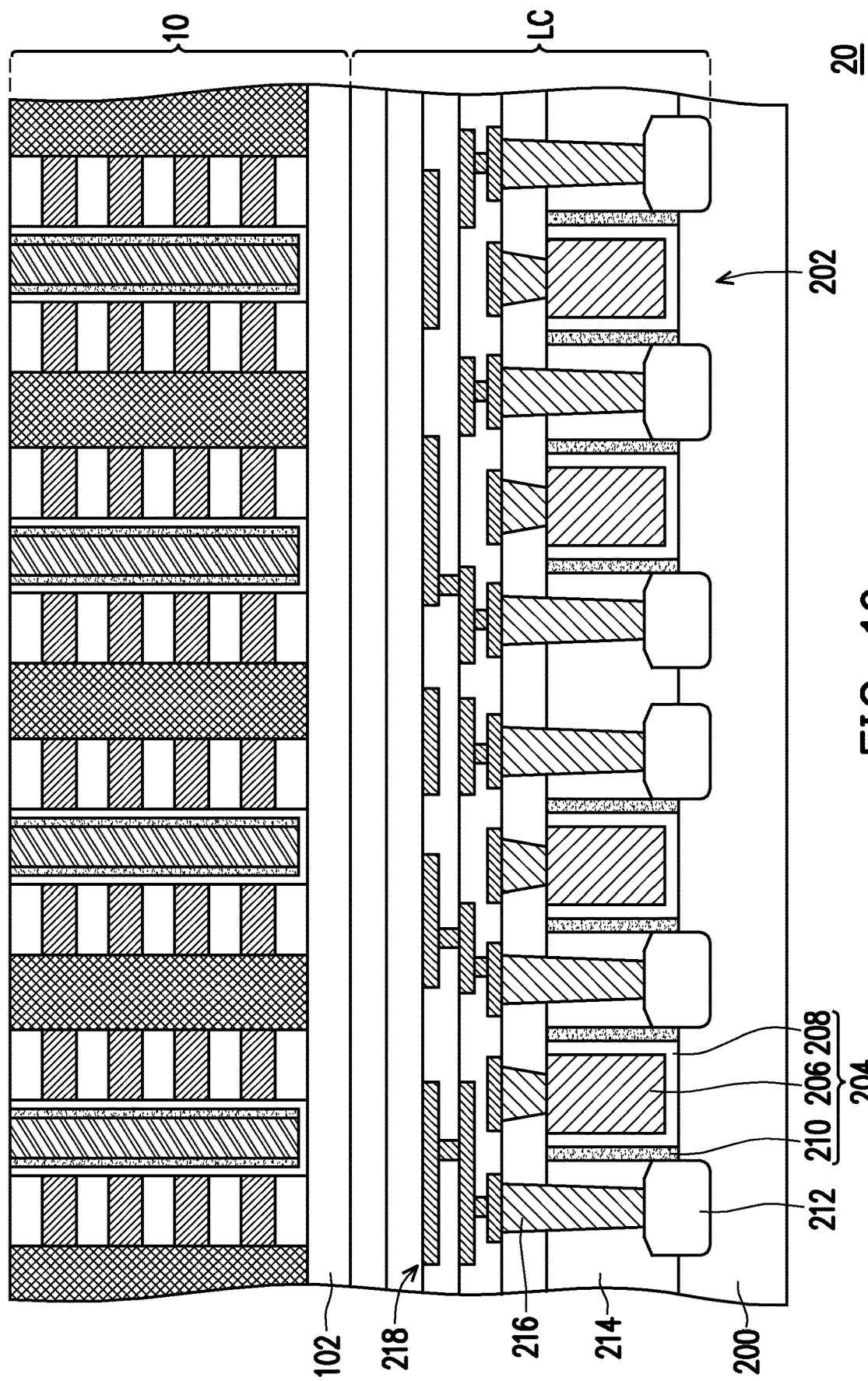
FIG. 19 is a schematic cross-sectional view illustrating a semiconductor structure in accordance with some embodiments of the disclosure.

FIG. 19 is a schematic cross-sectional view illustrating a semiconductor structure 20 in accordance with some embodiments of the disclosure.

Referring to FIGS. 11A-11C and FIG. 19, the semiconductor structure 20 shown in FIG. 19 includes the three-dimensional memory device 10 as described with reference to FIGS. 11A-11C. In those embodiments where the underlying structure 102 of the three-dimensional memory device 10 is an etching stop layer, a CMOS integrated circuit LC may lie under the underlying structure 102, and the CMOS integrated circuit LC may also be referred as a CMOS-under-array (CUA). Although not shown, the conductive layers 110 and the conductive pillars 118 may be routed to the CMOS integrated circuit LC, and the three-dimensional memory device 10 may be controlled by the CMOS integrated circuit LC. The details of electrical connections between the CMOS integrated circuit LC and the conductive layers 110 and between the CMOS integrated circuit LC and the conductive pillars 118 will be discussed later in greater detail in conjunction with FIG. 20A through FIG. 20B and FIG. 21A through FIG. 21B. In some embodiments, the three-dimensional memory device 10 as described with reference to FIGS. 11A-11C is embedded in a back-end-of-line (BEOL) structure of the semiconductor structure 20 shown in FIG. 19, and the CMOS integrated circuit LC is formed on a front-end-of-line (FEOL) structure of the semiconductor structure 20 shown in FIG. 19.

In some embodiments, the CMOS integrated circuit LC is built on a semiconductor substrate 200. The semiconductor substrate 200 may be a semiconductor wafer or a semiconductor-on-insulator (SOI) wafer. The CMOS integrated circuit LC may include active devices formed on a surface region of the semiconductor substrate 200. In some embodiments, the active devices include metal-oxide-semiconductor (MOS) transistors 202. The MOS transistors 202 may respectively include a gate structure 204 formed over the semiconductor substrate 200. In some embodiments, the gate structure 204 includes a gate electrode 206, a gate dielectric layer 208 and a gate spacer 210. The gate dielectric layer 208 may spread between the gate electrode 206 and the semiconductor substrate 200, and may or may not further cover a sidewall of the gate electrode 206. The gate spacer 210 may laterally surround the gate electrode 206 and the gate dielectric layer 208. Further, the MOS transistor 202 may further include source/drain regions 212. The source/drain regions 212 may be formed in the semiconductor substrate 200, and are located at opposite sides of the gate structure 204. In some embodiments, the source/drain regions 212 may be epitaxial structures, and may protrude from a surface of the semiconductor substrate 200. It should be noted that, although the MOS transistors 202 are depicted as planar-type MOS transistors that forms conductive channels (not shown) along the surface of the semiconductor substrate 200, the MOS transistors 202 may alternatively be fin-type MOS transistors (or referred as finFET), gate-all-around (GAA) FETs or the like.

In some embodiments, the CMOS integrated circuit LC further includes dielectric layers 214 stacked on the semiconductor substrate 200, and includes contact plugs 216 and interconnections 218 formed in the stack of dielectric layers 214. A bottommost dielectric layer 214 may laterally surround the gate structures 204, and cover the source/drain regions 212. Some of the contact plugs 216 may penetrate through bottommost ones of the dielectric layers 214, in order to establish electrical connection with the source/drain regions 212, while others of the contact plugs 216 may stand on the gate structures 204 and electrically connect to the gate electrodes 206 of the gate structures 204. The interconnections 218 may spread on the contact plugs 216, and are electrically connected to the contact plugs 216. The interconnections 218 may include conductive traces and conductive vias. The conductive traces respectively lie on one of the dielectric layers 214, whereas the conductive vias respectively penetrate through one or more of the dielectric layers 214 and electrically connect to one or more of the conductive traces.

In some embodiments, the three-dimensional memory device 10 is disposed on the stack of dielectric layers 214. In these embodiments, the conductive layers 110 and the conductive pillars 118 of the three-dimensional memory device 10 may be routed to the interconnections 218 in the stack of dielectric layers 214 by conductive paths (not shown) extending through the underlying structure 102 and topmost ones of the dielectric layers 214. For example, the conductive layers 110 (e.g., word lines having end portions with a staircase configuration being exposed from the stacking structures 112) may be routed to word line drivers formed by some of the active devices interconnected by a portion of the interconnections 218, and the conductive pillars 118 (e.g., bit line and/or source line) may be routed to sense amplifiers formed by others of the active devices interconnected by another portion of the interconnections 218.

Figure 20A:
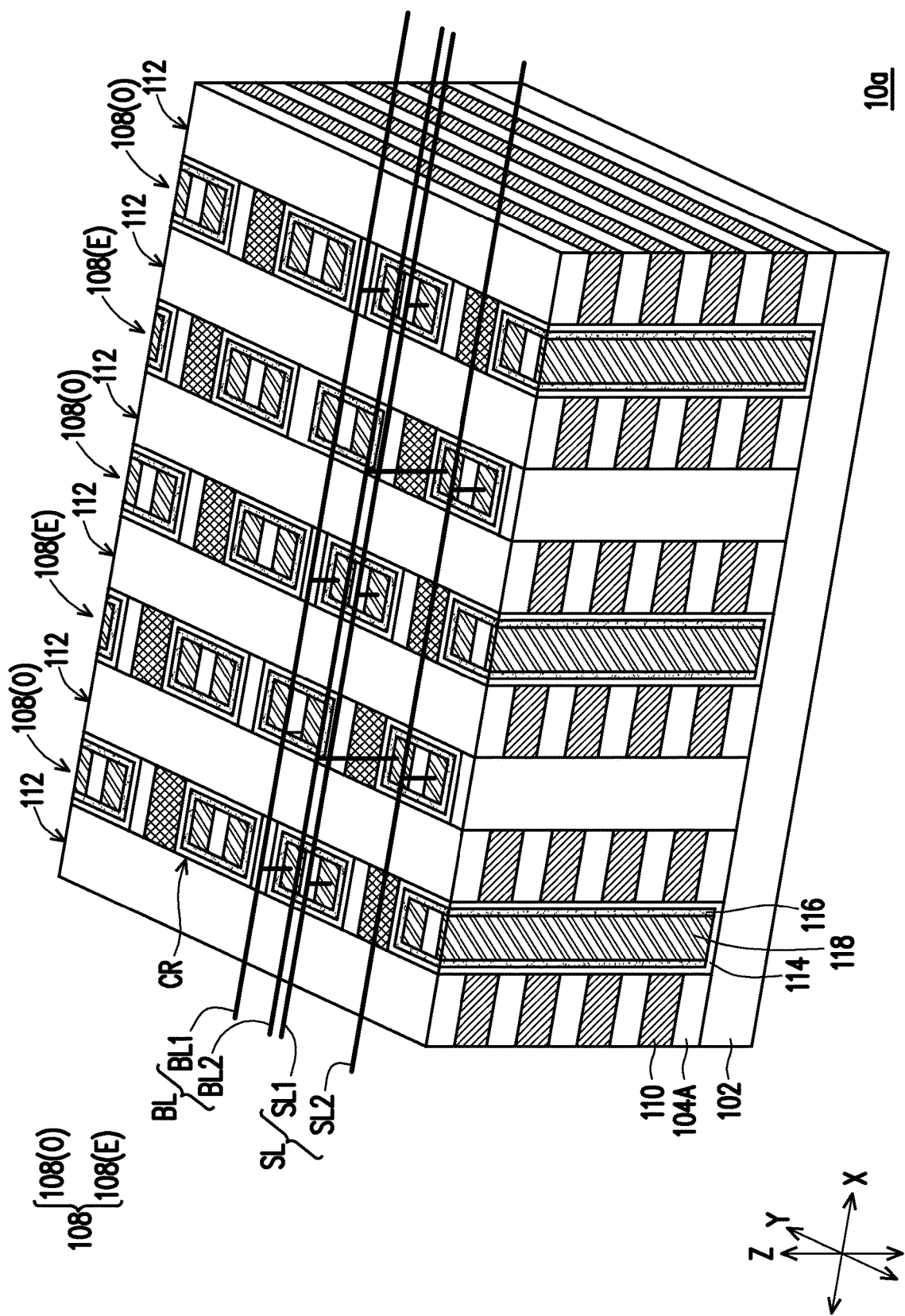
FIG. 20A and FIG. 20B are schematic various views of a three-dimensional memory device in accordance with some embodiments of the disclosure.
Figure 20B:
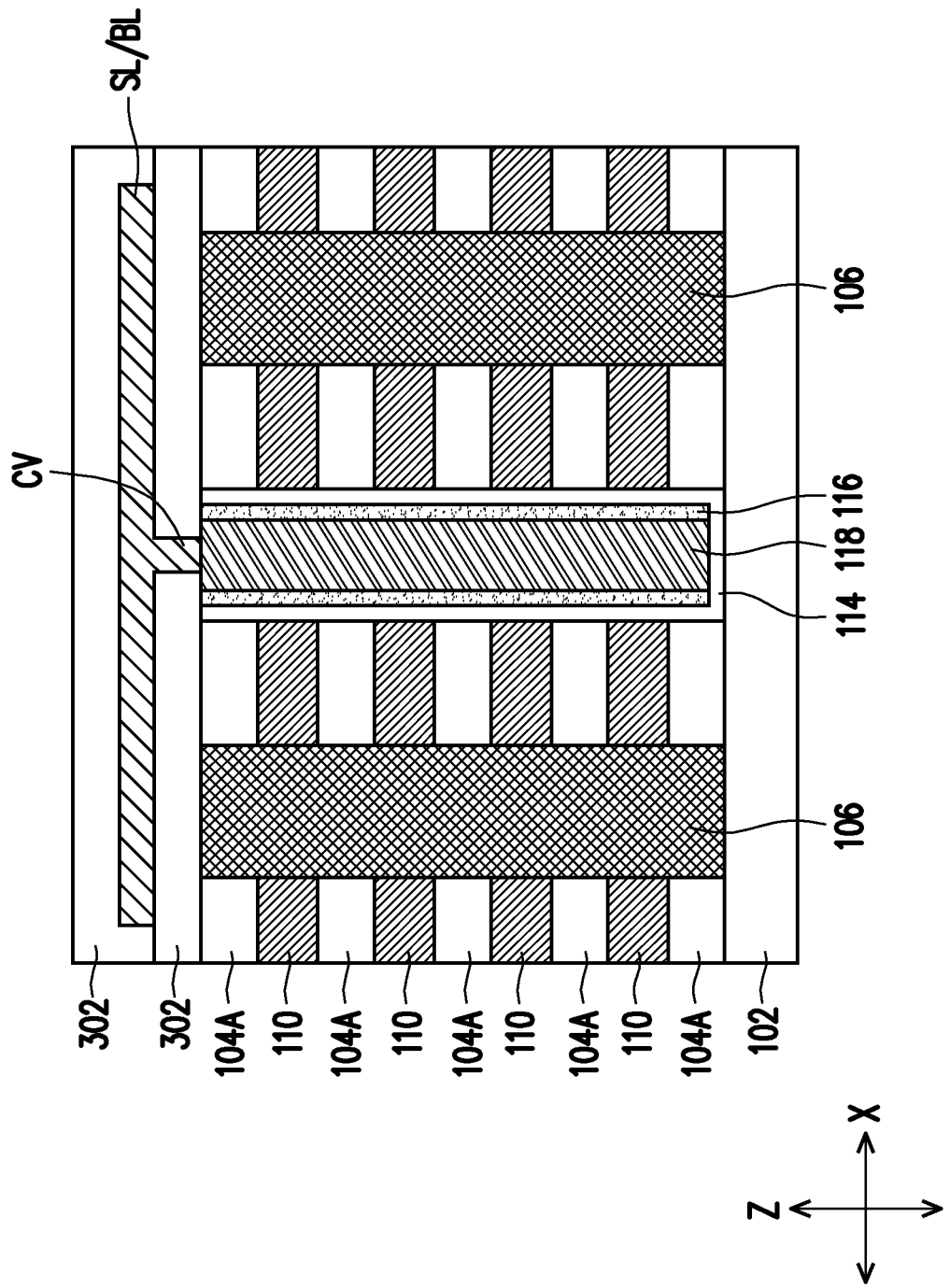

FIG. 20A is a schematic three-dimensional view illustrating a three-dimensional memory device 10a in accordance with some embodiments of the disclosure. FIG. 20B is a schematic cross-sectional view of a portion of the three-dimensional memory device 10a along an extending direction of the source line SL2 shown in FIG. 20A. The three-dimensional memory device 10a shown in FIG. 20A and FIG. 20B is similar to the three-dimensional memory device 10 as described with reference to FIGS. 11A-11C. Only differences therebetween will be described, the same or the like part would not be repeated again. In addition, a dielectric layer 302 to be described with reference to FIG. 20B are omitted in FIG. 20A.

Referring to FIG. 20A, in some embodiments, the three-dimensional memory device 10a further includes bit lines BL and source lines SL. The bit lines BL and the source lines SL are electrically connected to the conductive pillars 118 through, for example, conductive vias CV. The conductive pillars 118 in each one of the cell regions CR are connected to one of the bit lines BL and one of the source lines SL, respectively. In some embodiments, the bit lines BL and the source lines SL extend along a row direction (e.g., the direction X) intersected with the column direction (e.g., the direction Y) along which the cell regions CR between adjacent stacking structures 112 are arranged. In those embodiments where columns of the cell regions CR are alternately offset from others, the conductive pillars 118 in adjacent columns of the cell regions CR may be connected to different bit lines BL and different source lines SL. For example, the conductive pillars 118 in odd columns of the cell regions CR may be connected to bit lines BL1 and source lines SL1, whereas the conductive pillars 118 in even column of the cell regions CR may be connected to bit lines BL2 and source lines SL2. Consequently, the memory cells MC in adjacent columns of the cell regions CR can be controlled by different bit lines BL (e.g., the bit lines BL1 and the bit lines BL2) and different source lines SL (e.g., the source lines SL1 and the source lines SL2), thus interference between the memory cells MC in adjacent columns of the cell regions CR can be reduced.

As illustrated in FIG. 20A and FIG. 20B, in some embodiments, the bit lines BL and the source lines SL extend above the stacking structures 112. The bit lines BL, the source lines SL and the conductive vias CV may be formed in a stack of dielectric layers 302 formed on the stacking structures 112. The conductive vias CV may penetrate through bottommost one(s) of the dielectric layers 302, to establish electrical connection from the conductive pillars 118 to the bit lines BL and the source lines SL lying above the conductive vias CV. In those embodiments where the underlying structure 102 is an etching stop layer formed over a CMOS integrated circuit (e.g., the CMOS integrated circuit LC as described with reference to FIG. 19), the bit lines BL and the source lines SL may be further routed to the underlying CMOS integrated circuit through a conductive path (not shown) formed aside the stacking structures 112 and penetrating through the underlying structure 102.

Figure 21A:
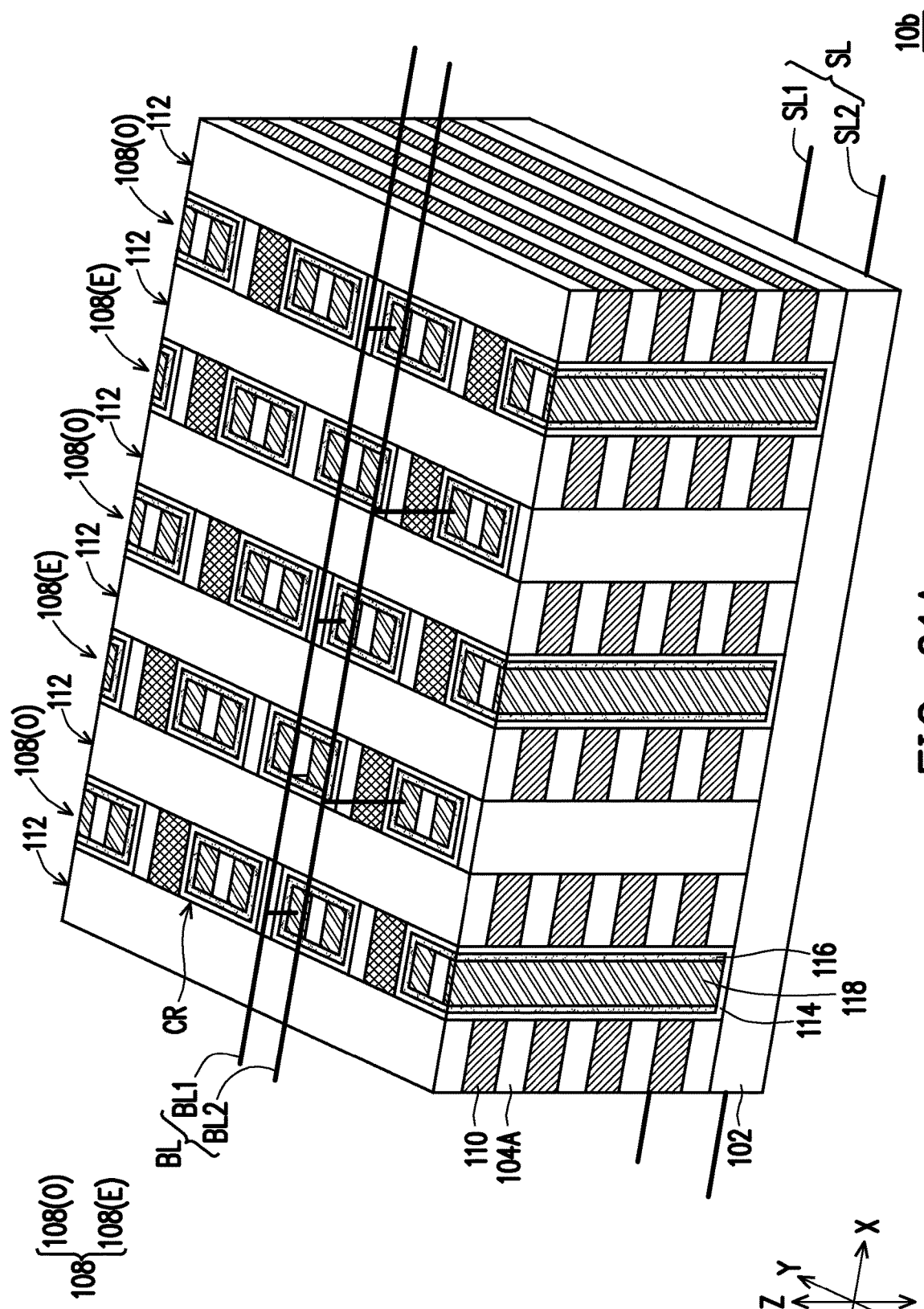
FIG. 21A and FIG. 21B are schematic various views of a three-dimensional memory device in accordance with some embodiments of the disclosure.
Figure 21B:
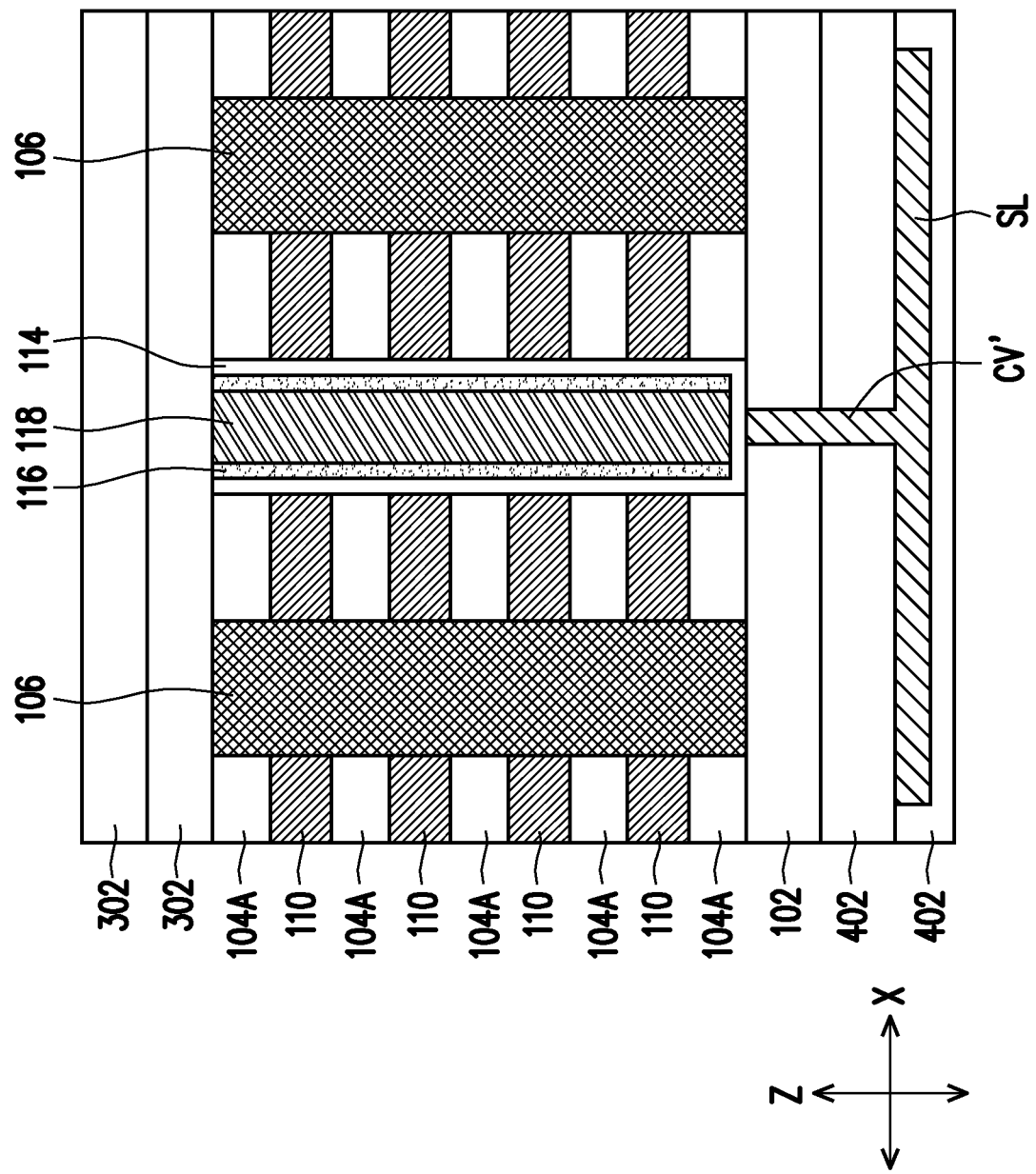

FIG. 21A is a schematic three-dimensional view illustrating a three-dimensional memory device 10b in accordance with some embodiments of the disclosure. FIG. 21B is a schematic cross-sectional view of a portion of the three-dimensional memory device 10b along an extending direction of one (e.g., SL1) of the source lines SL shown in FIG. 21A. The three-dimensional memory device 10b shown in FIG. 21A and FIG. 21B is similar to the three-dimensional memory device 10a as described with reference to FIG. 20A and FIG. 20B. Only differences therebetween will be described, the same or the like part would not be repeated again.

Referring to FIG. 21A and FIG. 21B, in some embodiments, the source lines SL extend below the underlying structure 102, while the bit lines BL extend above the stacking structures 112. In these embodiments, as shown in FIG. 21B, the source lines SL may be formed in the stack of dielectric layers 214 (as described with reference to FIG. 19) below the underlying structure 102. The source lines SL may lie on one of the dielectric layers 214. In addition, conductive vias CV' may be further formed to electrically connect some of the conductive pillars 118 to the underlying source lines SL. The conductive vias CV' may extend from bottom surfaces of some of the conductive pillars 118, and penetrate through the underlying dielectric layers 114, the underlying structure 102 and topmost one(s) of the dielectric layers 214, to reach the source lines SL.

In alternative embodiments, locations of the source lines SL and the bit lines BL are switched. In other words, the source lines SL may extend above the stacking structures 112, and may be electrically connected to some of the conductive pillars 118 as described with reference to FIG. 20A and FIG. 20B. On the other hand, the bit lines BL may extend in the dielectric layers 214 below the stacking structures 112, and may be electrically connected to others of the conductive pillars 118 through the conductive vias CV'.

In the disclosure, the three-dimensional memory device 10, 10a and 10b depicted in FIG. 11A, FIG. 20A and FIG. 21A are formed with the conductive pillars 118 arranged in a staggered layout (among adjacent trenches 108), for example. In some embodiments, the conductive pillars 118 formed in the odd trenches 108(O) extending along the direction Y are substantially aligned with each other in the direction X, while the conductive pillars 118 formed in the even trenches 108(E) extending along the direction Y are substantially aligned with each other in the direction X. In other words, the conductive pillars 118 formed in the odd trenches 108(O) are offset from (not aligned with) the conductive pillars 118 formed in the even trenches 108(E) in the direction X. The struts 106 located inside the odd trenches 108(O) are offset from (not aligned with) the struts 106 located inside the even trenches 108(E) in the direction X.

However, the disclosure is not limited thereto; alternatively, the conductive pillars 118 of a three-dimensional memory device (e.g., 30 depicted in FIG. 22A through FIG. 22C) may be arranged in aligned layout (e.g., in a periodic fashion).

Figure 22A:
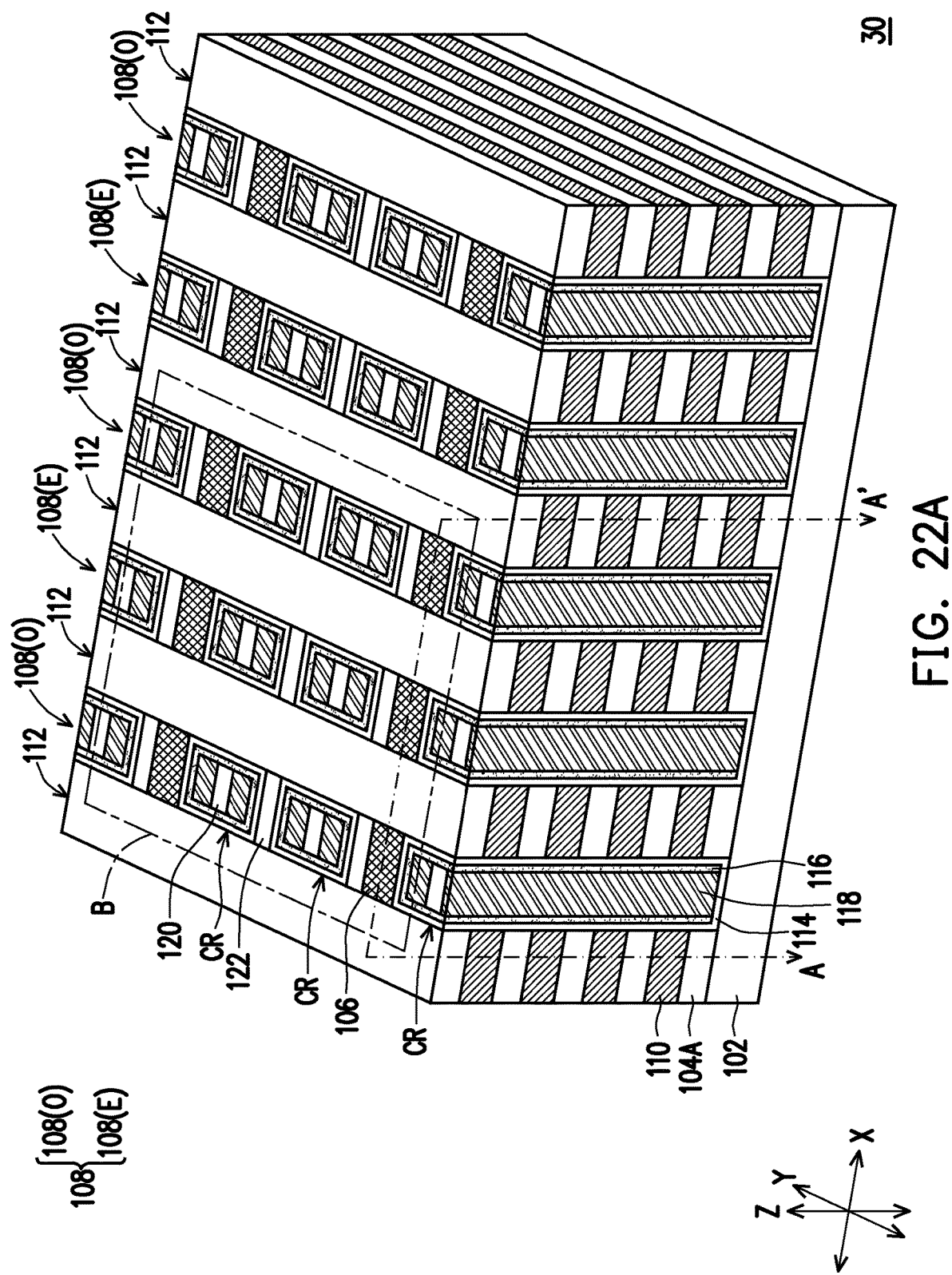
FIG. 22A through FIG. 22C are schematic various views of a three-dimensional memory device in accordance with some embodiments of the disclosure.
Figure 22B:
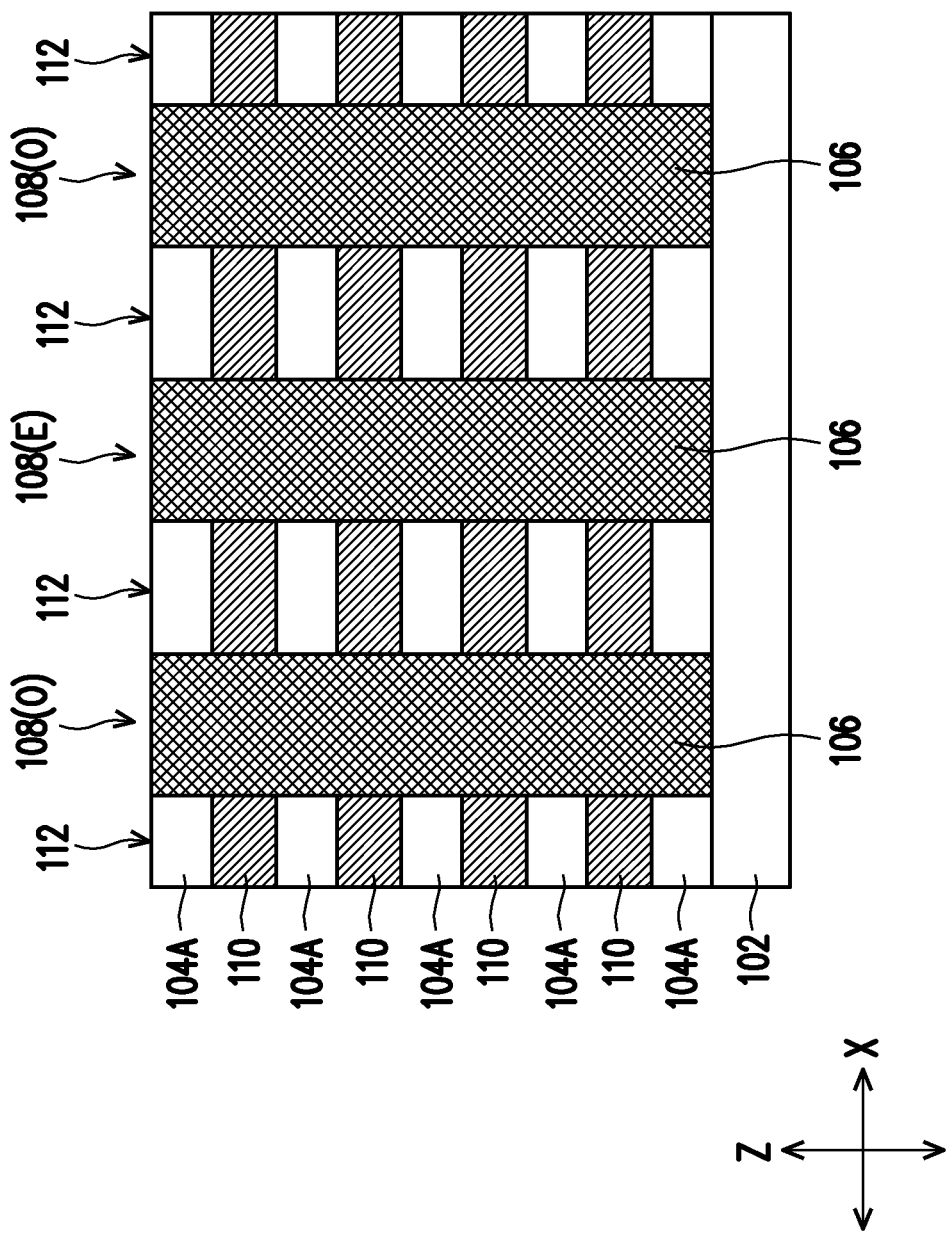
Figure 22C:
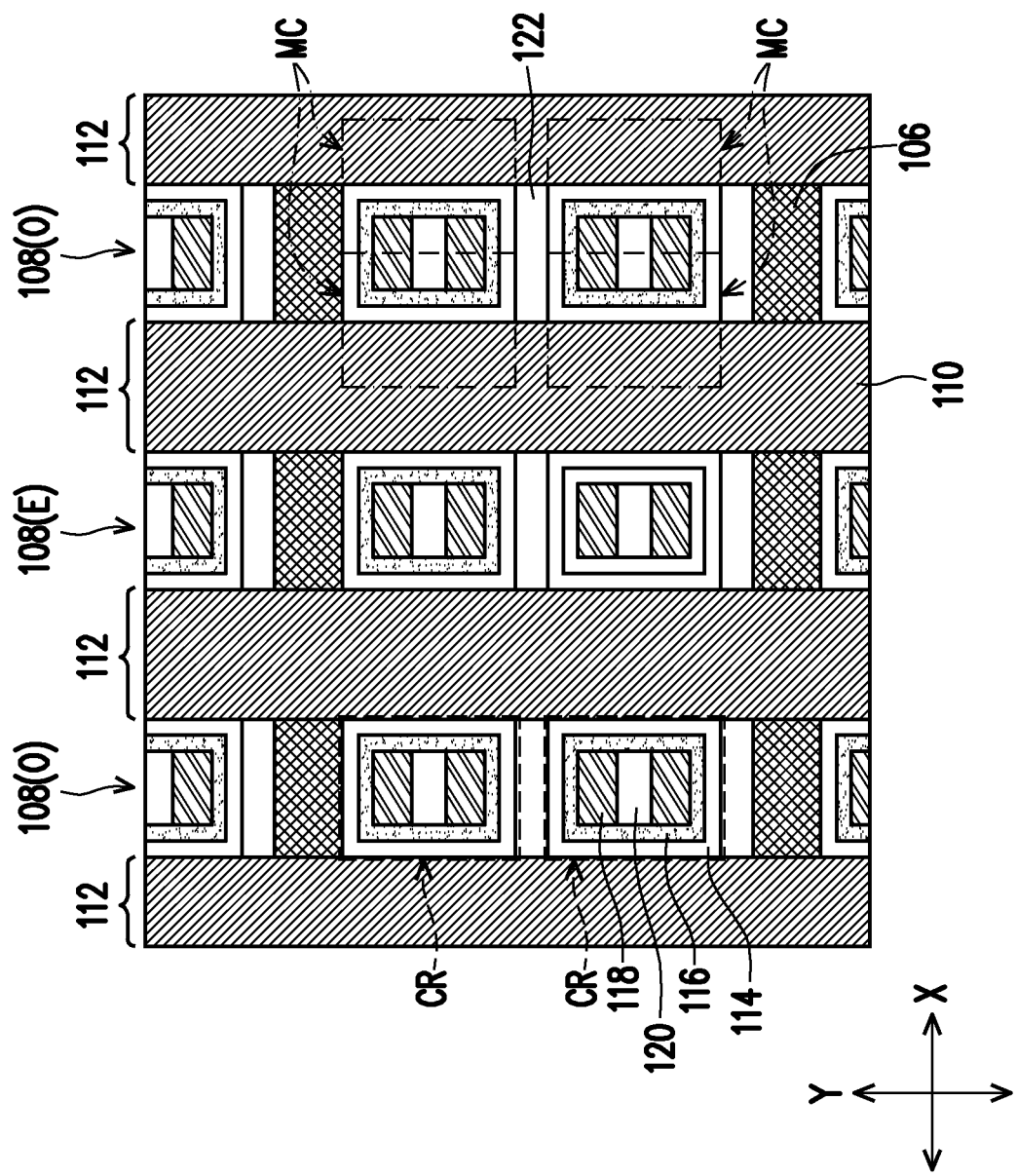

FIG. 22A is a schematic three-dimensional view illustrating a three-dimensional memory device 30 in accordance with some embodiments of the disclosure, where FIG. 22B is a schematic cross-sectional view of the three-dimensional memory device 30 along a line A-A' shown in FIG. 22A, and FIG. 22C is a schematic enlarged plan view illustrating a portion of the three-dimensional memory device 30 indicated by dotted boxes B shown in FIG. 22A. The three-dimensional memory device 30 shown in FIG. 22A and FIG. 22C is similar to the three-dimensional memory device 10 as described with reference to FIGS. 11A-11C. Only differences therebetween will be described, the same or the like part would not be repeated again. For example, as shown in FIG. 22A and FIG. 22C, the conductive pillars 118 formed in the odd trenches 108(O) extending along the direction Y and the conductive pillars 118 formed in the even trenches 108(E) extending along the direction Y are all substantially aligned with one another in the direction X. In other words, the conductive pillars 118 formed in the odd trenches 108(O) are lined up with the conductive pillars 118 formed in the even trenches 108(E) in the direction X, respectively. On the other hand, the struts 106 located inside the odd trenches 108(O) are substantially aligned with (e.g., lined up) the struts 106 located inside the even trenches 108(E) in the direction X.

Figure 23:
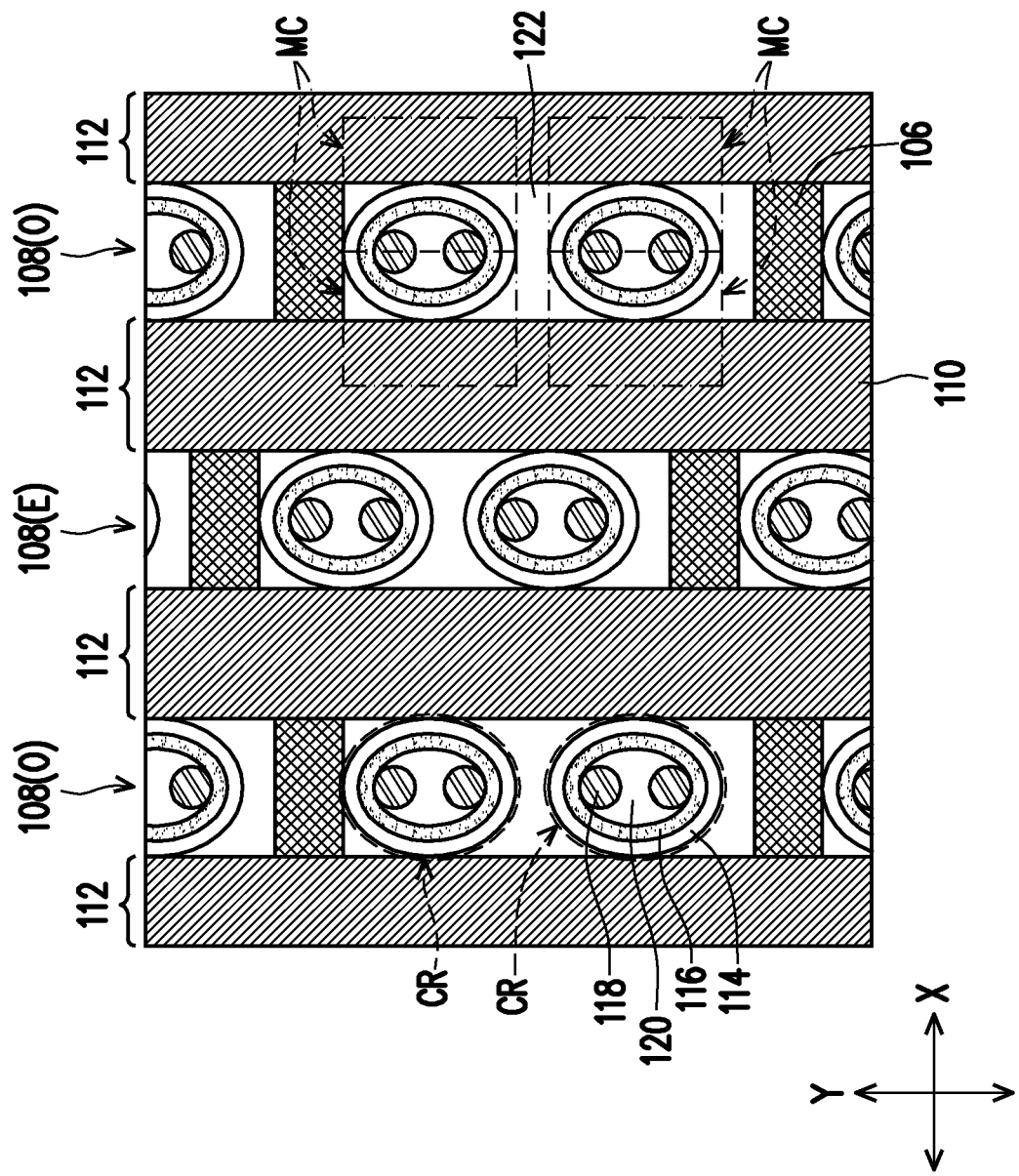
FIG. 23 is a schematic enlarged plan views illustrating a portion of the three-dimensional memory device in accordance with some embodiments of the disclosure.
Figure 24:
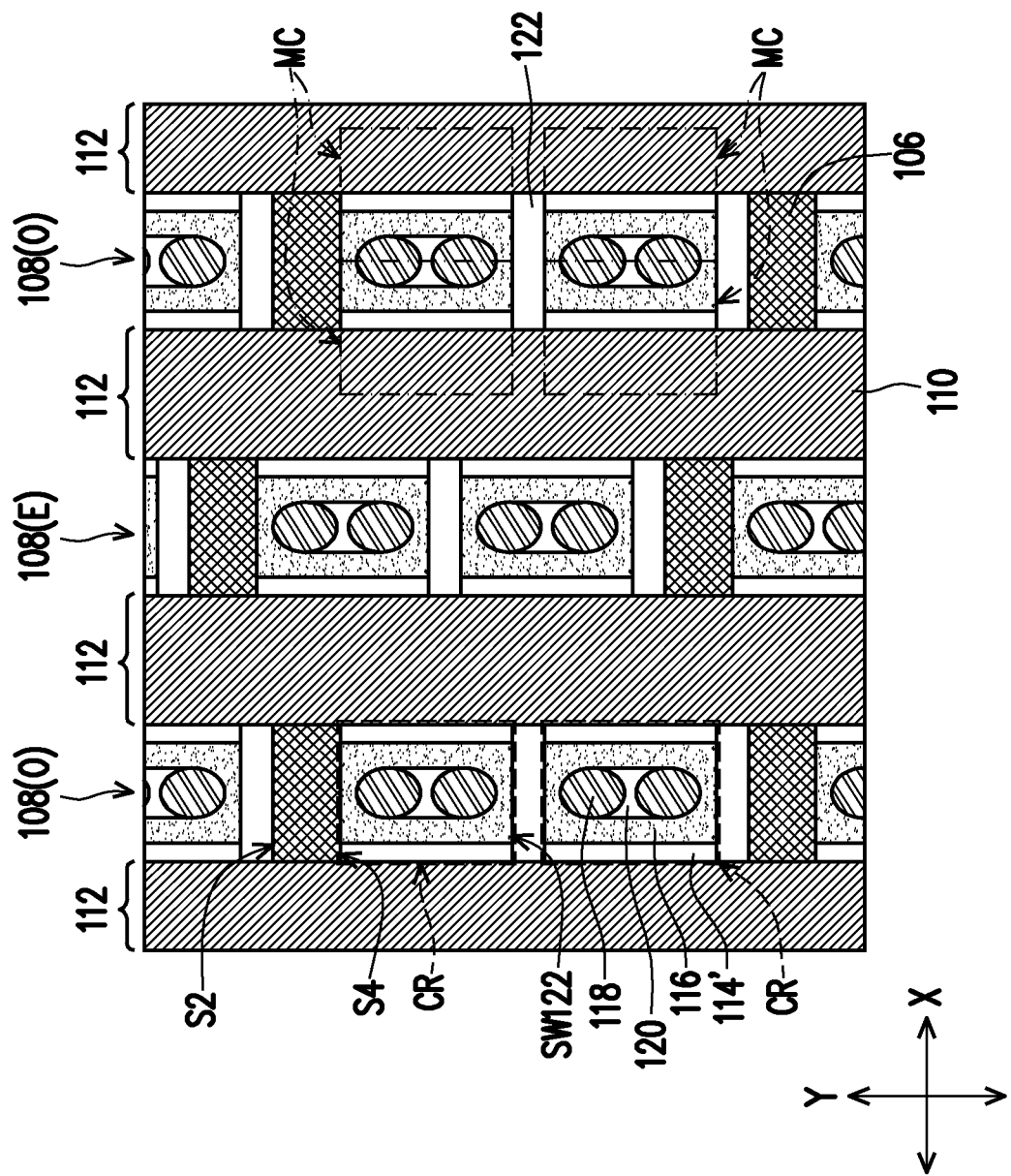
FIG. 24 is a schematic enlarged plan views illustrating a portion of the three-dimensional memory device in accordance with some embodiments of the disclosure.
Figure 25:
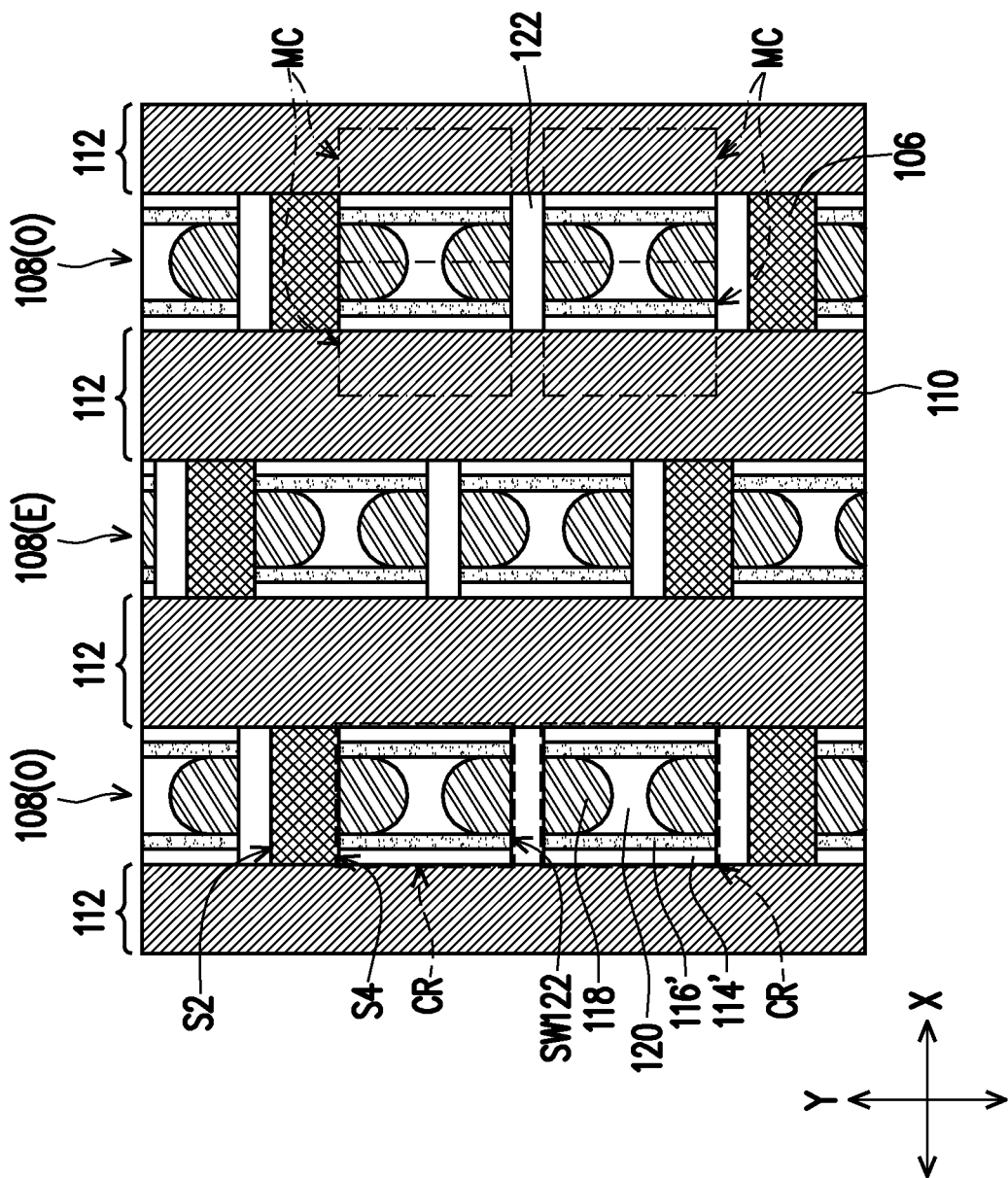
FIG. 25 is a schematic enlarged plan views illustrating a portion of the three-dimensional memory device in accordance with some embodiments of the disclosure.

FIG. 23, FIG. 24 and FIG. 25 each are a schematic enlarged plan views illustrating a portion of a three-dimensional memory device (e.g. 40, 50 and 60) in accordance with some embodiments of the disclosure, respectively. These three-dimensional memory devices 40, 50 and 60 are similar to the three-dimensional memory device 10 as described with reference to FIGS. 11A-11C. Only differences therebetween will be described, the same or the like parts would not be repeated again for simplicity.

For example, the three-dimensional memory devices 10, 10a, 10b and 30 depicted in FIG. 11A, FIG. 20A, FIG. 21A and FIG. 22A are formed with the cell regions CR and the conductive pillars 118 each formed in a substantially rectangular top view shape. However, the disclosure is not limited thereto; the cell regions CR each may be formed in a substantially elliptical or oval top view shape while the conductive pillars 118 each may be formed in a substantially circular top view shape as shown in the three-dimensional memory device 40 depicted in FIG. 23. Alternatively, the cell regions CR depicted in FIG. 23 may be formed in a substantially circular top view shape, and/or the cell regions CR and/or the conductive pillars 118 depicted in FIG. 23 may be formed in a substantially elliptical or oval top view shape. It should be appreciated that the cell regions CR and the conductive pillars 118 may have the same top view or different top views (e.g. selecting from substantially circular, elliptical or oval top view shapes) depending on the design requirement. In other embodiments, the conductive pillars 118 each may be formed in a substantially elliptical top view shape while the cell regions CR each are formed in a substantially rectangular top view shape, as shown in the three-dimensional memory device 50 depicted in FIG. 24. Alternatively, the conductive pillars 118 depicted in FIG. 24 may be formed in a substantially circular or oval top view shape. In further embodiments, the conductive pillars 118 each may be formed in a substantially truncated-elliptical top view shape while the cell regions CR each are formed in a substantially rectangular top view shape, as shown in the three-dimensional memory device 60 depicted in FIG. 25. Alternatively, the conductive pillars 118 depicted in FIG. 25 may be formed in a substantially truncated-oval or truncated-circular top view shape.

In the three-dimensional memory devices 40, 50 and 60, the isolation structures 120, 122 act as the electrically isolated features for preventing undesired cross-talking inside a single one cell region CR and/or among neighboring cell regions CR between the conductors (e.g. the adjacent conductive pillars 118 within one cell region CR and the conductive layers 110 located in the adjacent stacking structures 112) to improve the device performance of the three-dimensional memory devices 40, 50 and 60.

As shown in the plan views of FIG. 23 through FIG. 25 (e.g., the X-Y plane), for example, a distance between the paired conductive pillars 118 in one cell region CR is increased from a center of a trench 108 to an edge of the trench 108 along a direction perpendicular to an extending direction of the trench 108. With such configuration, the channel length of the FET in one cell region CR and the area of the cell region CR maintain the same while the overall area of the conductive pillars 118 is increased, thereby reducing the contact resistance in the conductive pillars 118 (e.g. source/drain regions) while the memory density will maintain the same. On the other hands, in the embodiments shown in FIG. 24 and FIG. 25, the dielectric layers 114' is formed in the cell regions CR to cover the sidewalls SW112 of the corresponding stacking structures 112 without extending over the sidewalls SW122 of the immediately adjacent isolation structures 122 and/or the surfaces (e.g., S2 or S4) of the struts 106; thereby not only increasing the overall area of the conductive pillars 118 but also reducing the impedance of the memory cells MC. Alternatively, as shown in FIG. 25, the semiconductor layers 116' may also be formed in the cell regions CR to cover the dielectric layers 114' located on the sidewalls SW112 of the corresponding stacking structures 112 and not extend over the sidewalls SW122 of the immediately adjacent isolation structures 122 and/or the surfaces (e.g., S2 or S4) of the struts 106 to further increases the overall area of the conductive pillars 118 and reduce the impedance of the memory cells MC. A material of the dielectric layers 114' may be the same as or the similar to the material of the dielectric layers 114 as described in FIG. 9A through FIG. 9C, a material of the semiconductor layers 116' may be the same as or the similar to the material of the semiconductor layers 116 as described in FIG. 9A through FIG. 9C, and thus are omitted for brevity.

A method for forming the dielectric layers 114' may include, but not limited to, selectively depositing a dielectric material only on the sidewalls SW112 of the corresponding stacking structures 112 and the top surface of the underlying structure 102 exposed by the cell regions CR to form the dielectric layers 114'. Alternatively, a dielectric material may be globally formed on sidewalls and bottom surfaces of the cell regions CR and removing the dielectric material from the sidewalls SW122 of the immediately adjacent isolation structures 122 and/or the surfaces (e.g., S2 or S4) of the struts 106 to form the dielectric layers 114' by patterning. A method for forming the semiconductor layers 116' may include, but not limited to, selectively depositing a semiconductor material only on the sidewalls of the corresponding dielectric layers 114' to form the semiconductor layers 116'. Alternatively, a semiconductor material may be globally formed over the cell regions CR disposed with the dielectric layer 114' and removing the semiconductor material from the sidewalls SW122 of the immediately adjacent isolation structures 122 and/or the surfaces (e.g., S2 or S4) of the struts 106 to form the semiconductor layers 116' by patterning. The patterning may include photolithography and etching processes.

In addition, the three-dimensional memory device 30 may also adopt the top view layouts of the cell regions CR in the three-dimensional memory devices 40-60. The disclosure is not limited thereto.

In some embodiments, the three-dimensional memory devices 10 through 60 respectively depicted in FIGS. 11A, 20A, 21A, 22A and 23-25 are formed with the struts 106 formed in all of the trench 108 (as described with reference to FIG. 5A through FIG. 5C). However, the disclosure is not limited thereto. One trench 108 having no struts 106 located therein may be sandwiched between two trenches 108 each having multiple struts 106 located therein; or vice versa.

Figure 26A:
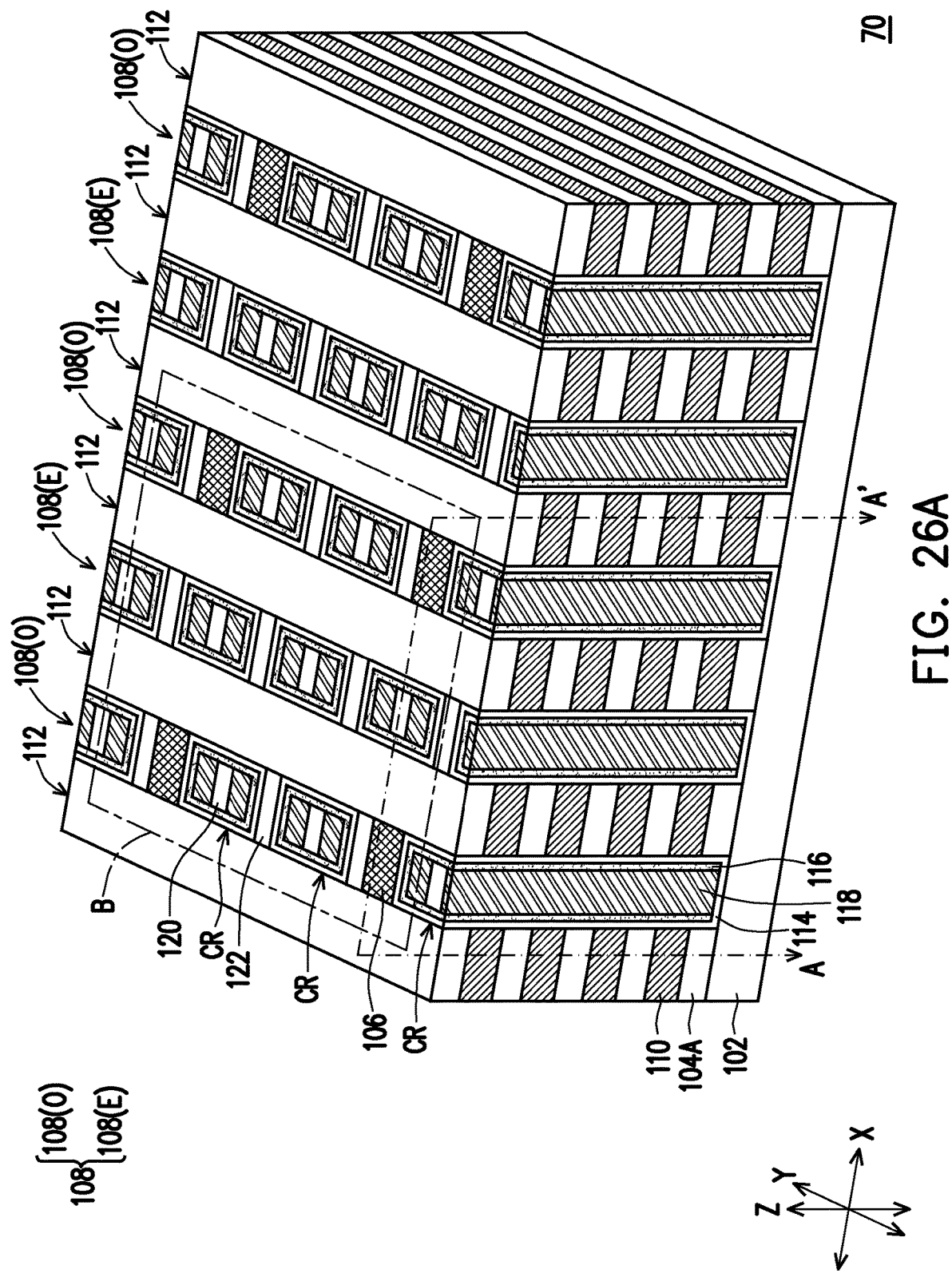
FIG. 26A through FIG. 26C are schematic various views of a three-dimensional memory device in accordance with some embodiments of the disclosure.
Figure 26B:
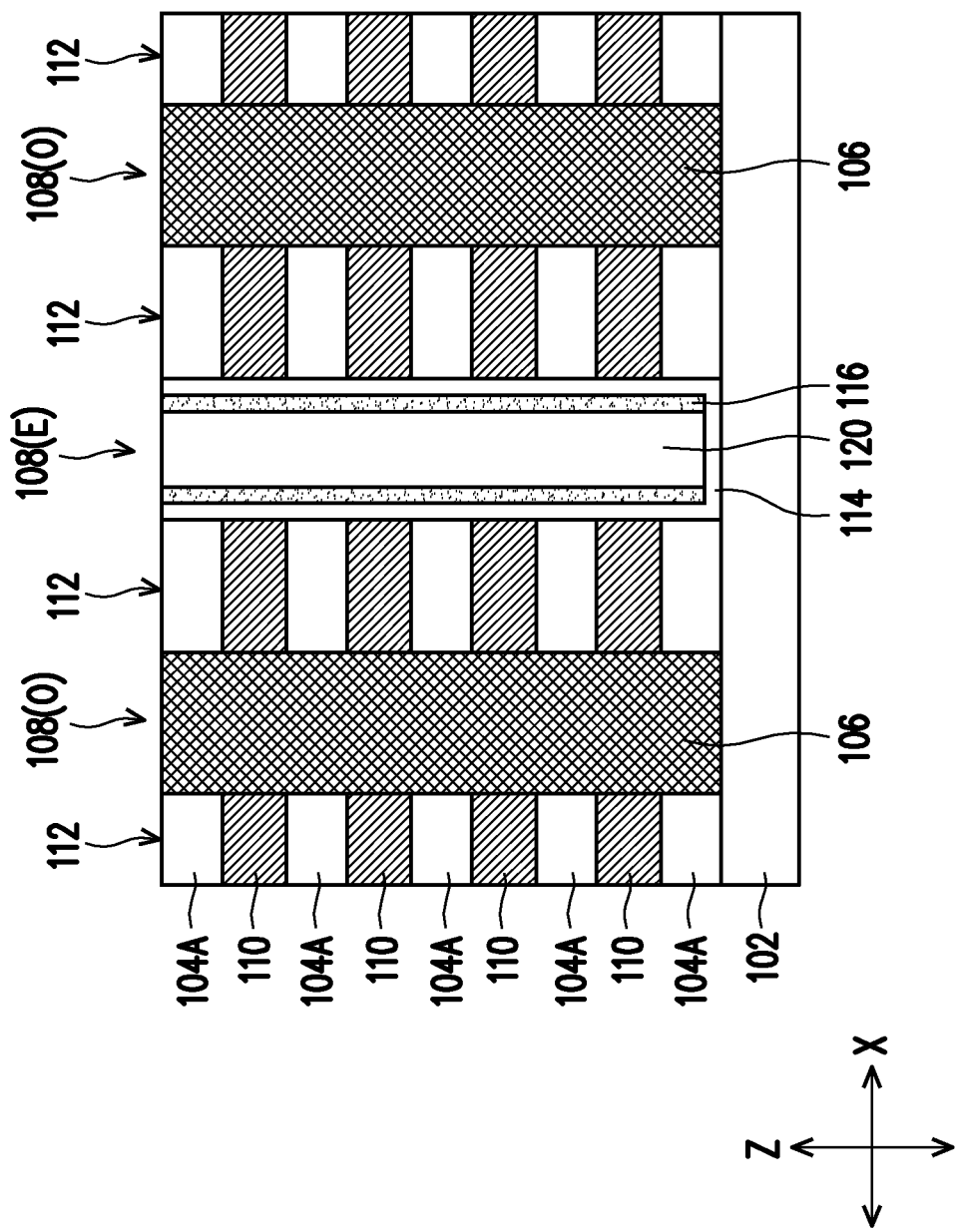
Figure 26C:
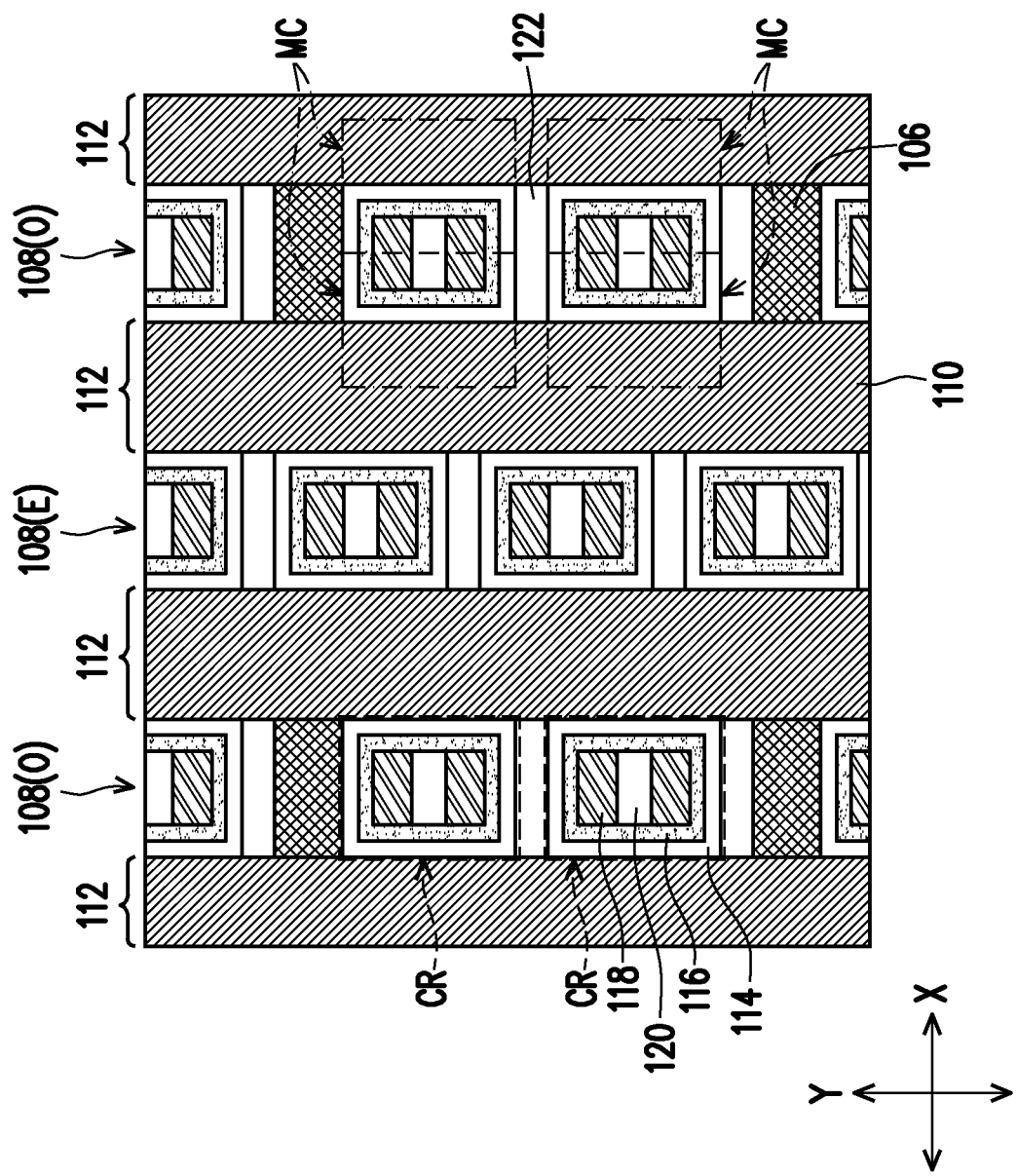

FIG. 26A is a schematic three-dimensional view illustrating a three-dimensional memory device 70 in accordance with some embodiments of the disclosure, where FIG. 26B is a schematic cross-sectional view of the three-dimensional memory device 70 along a line A-A' shown in FIG. 26A, and FIG. 26C is a schematic enlarged plan view illustrating a portion of the three-dimensional memory device 70 indicated by dotted boxes B shown in FIG. 26A. The three-dimensional memory device 70 shown in FIGS. 26A-26C is similar to the three-dimensional memory device 10 as described with reference to FIGS. 11A-11C. Only differences therebetween will be described, the same or the like part would not be repeated for simplicity. Referring to FIG. 26A through FIG. 26C, in some embodiments, a plurality of struts 106 are only formed in the odd trenches 108(O). That is, the struts 106 are formed in the trenches 108 in alternate manner. On the other hand, the even trenches 108(E) are free of the struts 106. As shown in FIG. 26C, the conductive pillars 118 located in different odd trenches 108(O) are substantially aligned with each other in the direction X, respectively. That is, the struts 106 located in the different odd trenches 108(O) are substantially aligned with each other in the direction X.

Figure 27A:
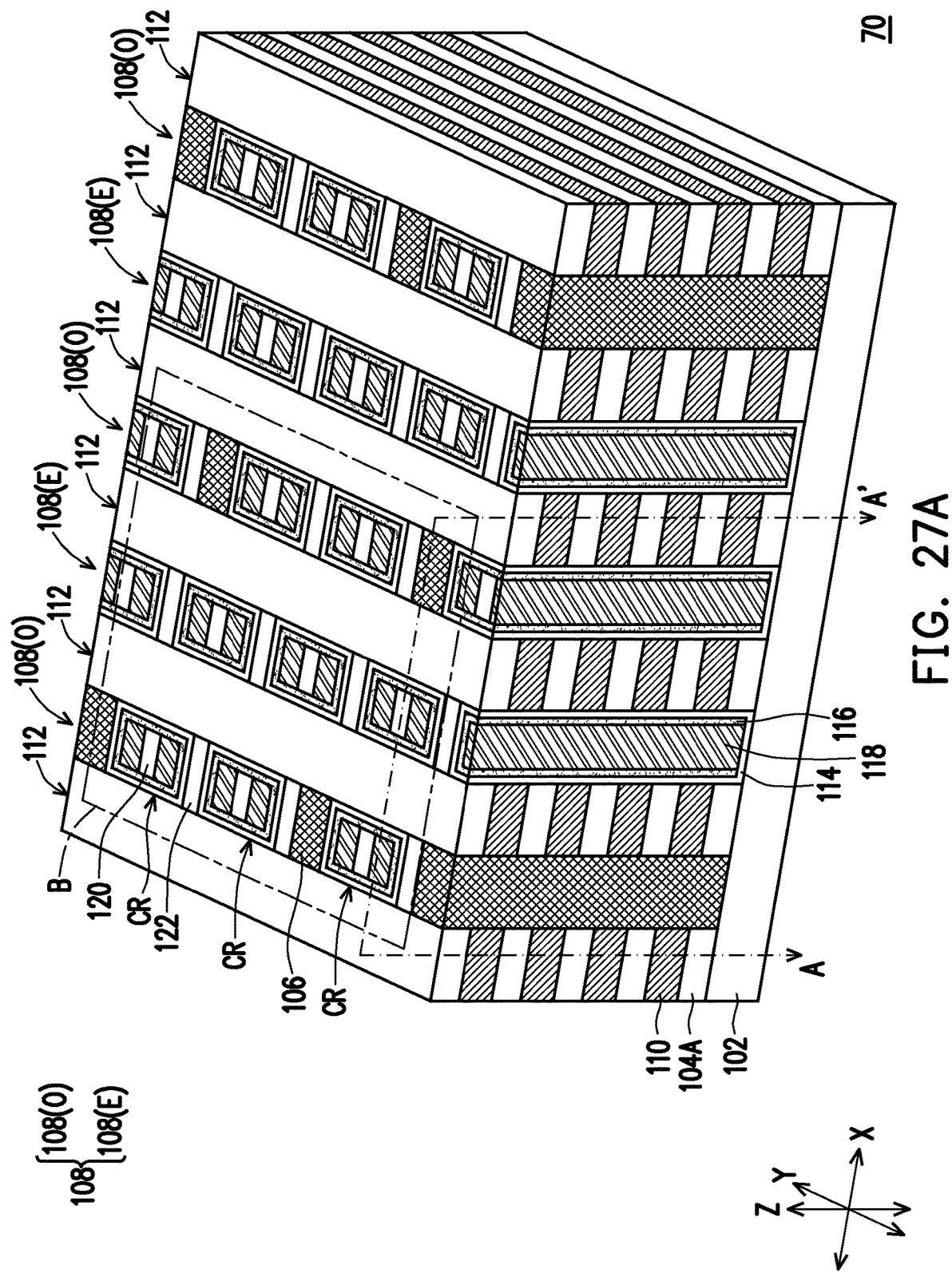
FIG. 27A through FIG. 27C are schematic various views of a three-dimensional memory device in accordance with some embodiments of the disclosure.
Figure 27B:
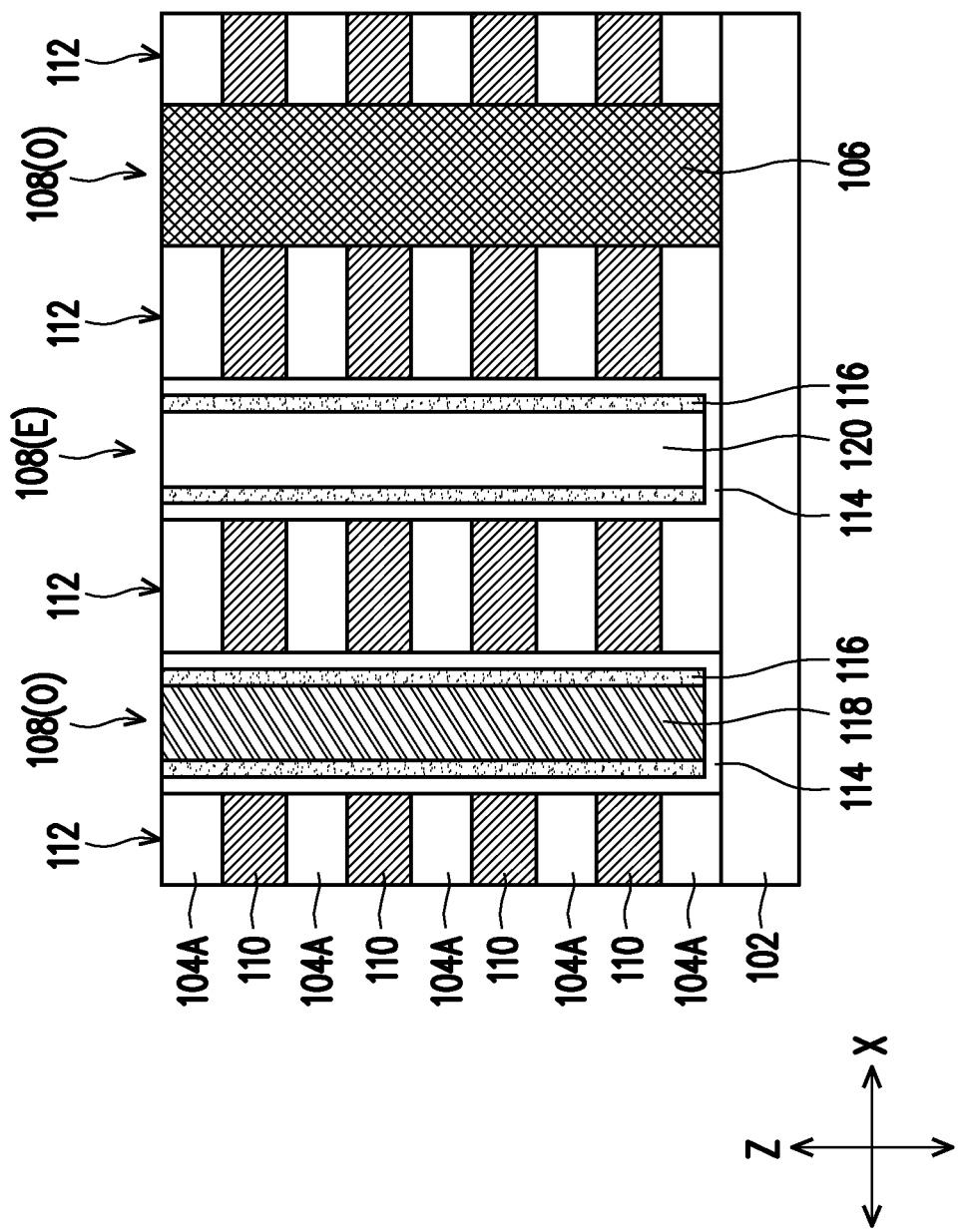
Figure 27C:
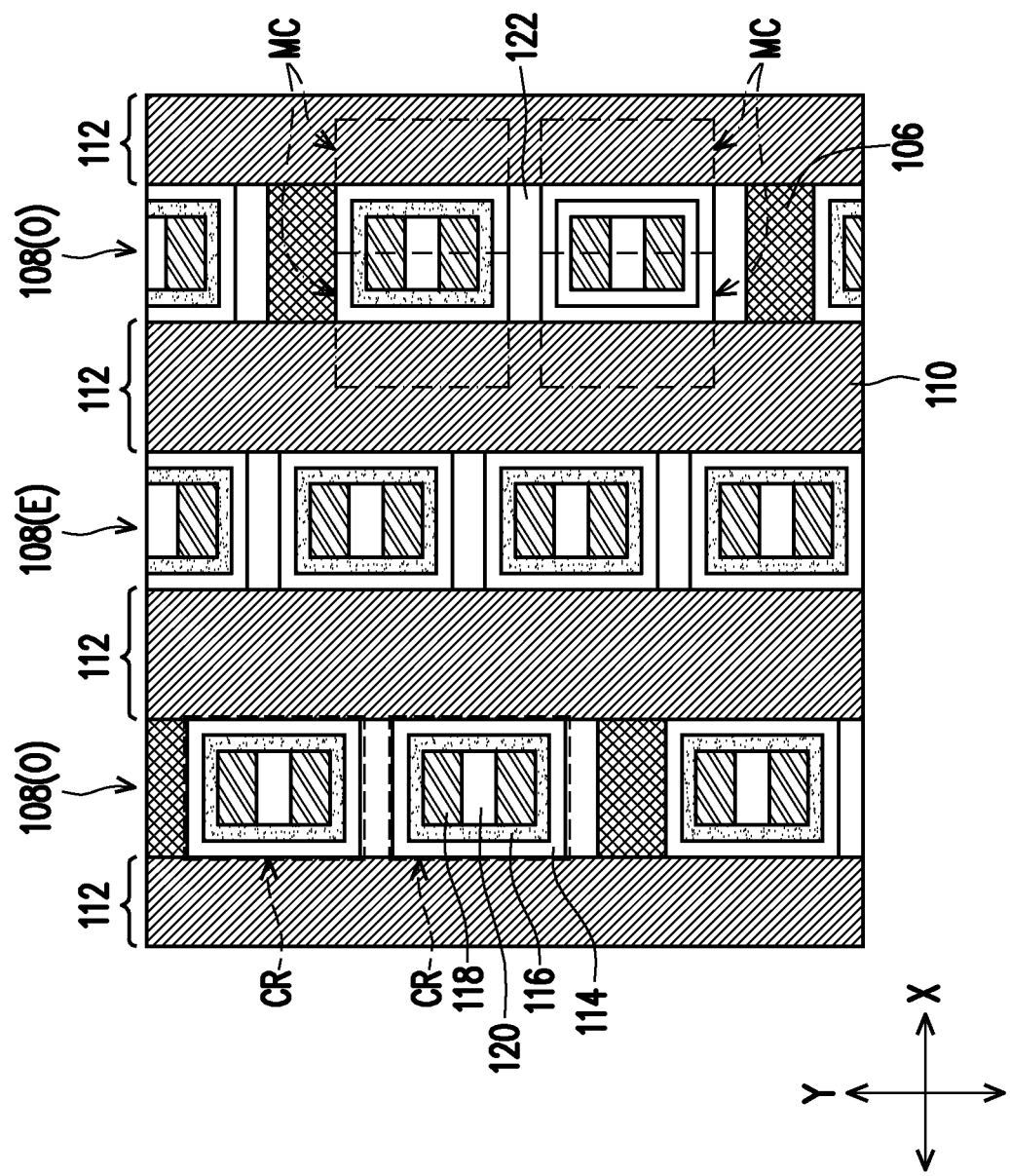

FIG. 27A is a schematic three-dimensional view illustrating a three-dimensional memory device 80 in accordance with some embodiments of the disclosure, where FIG. 27B is a schematic cross-sectional view of the three-dimensional memory device 80 along a line A-A' shown in FIG. 27A, and FIG. 27C is a schematic enlarged plan view illustrating a portion of the three-dimensional memory device 80 indicated by dotted boxes B shown in FIG. 27A. The three-dimensional memory device 80 shown in FIGS. 27A-27C is similar to the three-dimensional memory device 70 as described with reference to FIGS. 26A-26C. Only differences therebetween will be described, the same or the like part would not be repeated for simplicity. Referring to FIG. 27A through FIG. 27C, in some embodiments, the struts 106 formed in the different odd trenches 108 are offset from (e.g. not aligned with) each other in the direction X, respectively. That is, the struts 106 located in the different odd trenches 108(O) are offset from (e.g. not aligned with) each other in the direction X.

In the disclosure, the struts 106 are formed before the formation of the trenches 108, the twisting or collapsing of the features (e.g., linear portions of the multilayer stack 104) is avoided. Due to the struts 106 function as the supporting pillars of the three-dimensional memory device during the manufacturing, a yield of the memory cells MC is increased, thereby improving the device performance of the three-dimensional memory devices 70 and 80. In addition, the three-dimensional memory devices 70 and 80 may also adopt the arrangement of the cell regions CR in the three-dimensional memory device 30 and/or the top view layouts of the cell regions CR in the three-dimensional memory devices 40-60. The disclosure is not limited thereto.

In addition, the plurality of struts 106 may be only formed in every two trenches 108, in every three trenches 108, or so on; the disclosure is not limited thereto. Besides, the struts 106 in different trenches may be offset form one another in the direction X, from every two trenches, from every three trenches, or so on.

In accordance with some embodiments, a memory device includes a substrate, a first stacking structure, a second stacking structure, struts, at least one isolation structure, memory films, channel layers, and conductive pillars. The first stacking structure includes a plurality of first gate layers and is located on the substrate. The second stacking structure includes a plurality of second gate layers and is located on the substrate, where the second stacking structure is separated from the first stacking structure through a trench. The struts stand on the substrate and are located in the trench, where the struts each have two opposite surfaces respectively in contact with the first stacking structure and the second stacking structure. The at least one isolation structure stands on the substrate and is located in the trench, where cell regions are located in the trenches, and at least two of the cell regions are separated from one another through a respective one strut and the at least one isolation structure connected therewith. The memory films are respectively located in the cell regions, and the memory films each cover a sidewall of a respective one of the cell regions. The channel layers respectively cover an inner surface of a respective one of the memory films, where the memory films are sandwiched between the first gate layers and the channel layers. The conductive pillars stand on the substrate within the cell regions and are covered by the channel layers, where at least two of the conductive pillars are located in each of the cell regions, and the at least two conductive pillars are laterally separated from one another.

In accordance with some embodiments, a memory device includes a substrate, first stacking structures, second stacking structures, first struts, isolation structures, first cell regions, second cell regions, memory films, channel layers, and conductive pillars. The first stacking structures include first insulating layers and first gate layers alternately stacked on the substrate. The second stacking structures include second insulating layers and second gate layers alternately stacked on the substrate, where the first stacking structures and the second stacking structures are alternately arranged over the substrate along a first direction. The isolation structures stand on the substrate, where the first stacking structures and the second stacking structures are separated from each other through the isolation structures, and the isolation structures includes odd isolation structures and even isolation structures separated from one another and alternately arranged over the substrate along the first direction. The first struts stand on the substrate and are located in the odd isolation structures, where the first struts each have two opposite surfaces respectively adjoined to one of the first stacking structures and a respective one of the second stacking structures. The first cell regions are located in the odd isolation structures, and the second cell regions are located in the even isolation structures, where at least two of the first cell regions in at least one of the odd isolation structures are separated from one another through one of the first struts and a portion of the at least one of the odd isolation structures connected therewith. The memory films are respectively located in the first cell regions and the second cell regions, and cover opposing sidewalls of the first gate layers and the second gate layers. The channel layers respectively cover inner surfaces of the memory films. The conductive pillars stand on the substrate within the first cell regions and the second cell regions and are covered by the channel layers, where at least two of the conductive pillars are located in each of the first cell regions and the second cell regions, and the at least two of the conductive pillars are laterally separated from one another.

In accordance with some embodiments, a method of manufacturing a memory device includes the following steps: forming, on a substrate, a multilayer stack comprising insulating layers and sacrificial layers arranged in alternation; forming struts in the multilayer stack, the struts being standing on the substrate; forming trenches in the multilayer stack to expose the struts, the trenches comprising odd trenches and even trenches that being alternately arranged; replacing the sacrificial layers with gate layers to form stacking structures, two opposite surfaces of each of the struts being respectively in contact with two adjacent stacking structures of the stacking structures; forming isolation structures in the trenches to form cell regions, at least two of cell regions located in at least one of the odd trenches are separated from one another through a respective one of the struts and at least one of the isolation structures connected therewith; forming gate dielectric layers on sidewalls of the cell regions, the gate dielectric layers being in contact with the gate layers; forming channel layers on the gate dielectric layers; and forming, in each of the cell regions, a dielectric plug and at least two conductive pillars, the dielectric plug being sandwiched between the conductive pillars.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A memory device, comprising:
a first stacking structure comprising a plurality of first gate layers, located on a substrate;
a second stacking structure comprising a plurality of second gate layers, located on the substrate and separated from the first stacking structure through a trench;
struts, standing on the substrate and located in the trench, each having two opposite surfaces respectively in contact with the first stacking structure and the second stacking structure;
at least one isolation structure, standing on the substrate and located in the trench, wherein cell regions are located in the trench, and at least two of the cell regions are separated from one another through a respective one strut and the at least one isolation structure connected therewith;
memory films, respectively located in the cell regions, and each covering a sidewall of a respective one of the cell regions;
channel layers, respectively covering an inner surface of a respective one of the memory films, wherein the memory films are sandwiched between the first gate layers and the channel layers; and
conductive pillars, standing on the substrate within the cell regions, and covered by the channel layers, wherein at least two of the conductive pillars are located in each of the cell regions, and the at least two conductive pillars are laterally separated from one another.

2. The memory device of claim 1, wherein a width of the struts is substantially equal to a width of the trench.

3. The memory device of claim 1, wherein a material of the struts is different from a material of the at least one isolation structure, and a material of the structs comprises silicon carbonitride.

4. The memory device of claim 1, wherein three sides of at least one of the conductive pillars are covered by at least one of a respective one of the channel layers.

5. The memory device of claim 1, wherein:
the first stacking structure further comprises a plurality of first insulating layers alternately arranged in the first stacking structure with the plurality of first gate layers; and
the second stacking structure further comprises a plurality of second insulating layers alternately arranged in the second stacking structure with the plurality of second gate layers,
wherein a material of the struts is different from a material of the plurality of first insulating layers and a material of the plurality of second insulating layers.

6. The memory device of claim 5, wherein sidewalls of the first gate layers in contact with the struts are substantially coplanar with sidewalls of the first insulating layers in contact with the struts, and sidewalls of the second gate layers in contact with the struts are substantially coplanar with sidewalls of the second insulating layers in contact with the struts.

7. The memory device of claim 6, wherein in a vertical projection on the substrate along a stacking direction of the struts and the substrate, a first edge of one of the struts is flush with an edge of the first stacking structure, and a second edge of one of the struts is flush with an edge of the second stacking structure,
wherein in a direction perpendicular to an extending direction of the trench, the first edge is opposite to the second edge, and the edge of the first stacking structure is opposite to the edge of the second stacking structure,
wherein the edge of the first stacking structure comprises the sidewalls of the first gate layers and the sidewalls of the first insulating layers in contact with the struts, and the edge of the second stacking structure comprises the sidewalls of the second gate layers and the sidewalls of the second insulating layers in contact with the struts.

8. The memory device of claim 1, further comprising:
a plurality of dielectric plugs, respectively located in one of the plurality of cell regions, wherein the dielectric plugs each laterally separate the at least two of the conductive pillars in each of the plurality of cell regions.

9. A memory device, comprising:
first stacking structures, comprising first insulating layers and first gate layers alternately stacked on a substrate;
second stacking structures, comprising second insulating layers and second gate layers alternately stacked on the substrate, wherein the first stacking structures and the second stacking structures are alternately arranged over the substrate along a first direction;
isolation structures, standing on the substrate, wherein the first stacking structures and the second stacking structures are separated from each other through the isolation structures, and the isolation structures comprises odd isolation structures and even isolation structures separated from one another and alternately arranged over the substrate along the first direction;
first struts, standing on the substrate and located in the odd isolation structures, each having two opposite surfaces respectively adjoined to one of the first stacking structures and a respective one of the second stacking structures;
first cell regions located in the odd isolation structures and second cell regions located in the even isolation structures, wherein at least two of the first cell regions in at least one of the odd isolation structures are separated from one another through one of the first struts and a portion of the at least one of the odd isolation structures connected therewith;
memory films, respectively located in the first cell regions and the second cell regions, and covering opposing sidewalls of the first gate layers and the second gate layers;
channel layers, respectively covering inner surfaces of the memory films; and
conductive pillars, standing on the substrate within the first cell regions and the second cell regions and covered by the channel layers, wherein at least two of the conductive pillars are located in each of the first cell regions and the second cell regions and are laterally separated from one another.

10. The memory device of claim 9, wherein a material of the first struts is different from a material of each of the isolation structures, the first insulating layers and the second insulating layers.

11. The memory device of claim 9, wherein every two adjacent second cell regions in at least one of the even isolation structures are separated from one another through a portion of the at least one of the even isolation structures.

12. The memory device of claim 9, further comprising:
second struts, standing on the substrate and located in the even isolation structures, each having two opposite surfaces respectively adjoined to one of the first stacking structures and a respective one of the second stacking structures, wherein at least two of the second cell regions in at least one of the even isolation structures are separated from one another through one of the second struts and a portion of the at least one of the even isolation structures connected therewith,
wherein a material of the second struts is different from a material of each of the isolation structures, the first insulating layers and the second insulating layers.

13. The memory device of claim 9, wherein in a top view of the memory device along a second direction substantially perpendicular to a stacking direction of the substrate and the first stacking structures, the memory films each comprise a substantially annular top view shape,
wherein the second direction is substantially perpendicular to the first direction.

14. The memory device of claim 9, wherein in a top view of the memory device along a second direction substantially perpendicular to a stacking direction of the substrate and the first stacking structures, the channel layers each comprise a substantially annular top view shape,
wherein the second direction is substantially perpendicular to the first direction.

15. The memory device of claim 9, wherein in a top view of the memory device along a second direction substantially perpendicular to a stacking direction of the substrate and the first stacking structures, the conductive pillars each comprise a top view of a substantially rectangular shape, a substantially circular or elliptical shape, or a substantially truncated circular or elliptical shape,
wherein the second direction is substantially perpendicular to the first direction.

16. A memory device, comprising:
a first stacking structure comprising a plurality of first gate layers;
a second stacking structure comprising a plurality of second gate layers, laterally next to and separated from the first stacking structure through a trench;
struts, disposed in the trench and each having two opposite surfaces respectively prop against the first stacking structure and the second stacking structure;
isolation structures, disposed in the trench, wherein a plurality of cell regions each are confined by two adjacent isolation structures of the isolation structures or by one strut of the struts and a respective one isolation structure of the isolation structures;
memory films, respectively lining sidewalls of the plurality of cell regions;
channel layers, respectively lining sidewalls of the memory films; and
a plurality of paired conductive pillars, each pair disposed in a respective one cell region of the plurality of cell regions, the plurality of paired conductive pillars are separated from the memory films by the channel layers.

17. The memory device of claim 16, wherein a width of the struts is substantially equal to a width of the trench.

18. The memory device of claim 16, wherein a material of the struts is different from a material of the isolation structures.

19. The memory device of claim 16, wherein a material of the structs comprises silicon carbonitride.

20. The memory device of claim 16, further comprising:
a plurality of dielectric plugs, respectively disposed in the plurality of cell regions, wherein the dielectric plugs each laterally separate conductive pillars of a respective paired conductive pillars in each of the plurality of cell regions.

* * * * *